(12) United States Patent
Yamada et al.

(10) Patent No.: US 6,995,401 B2
(45) Date of Patent: Feb. 7, 2006

(54) LIGHT EMITTING DEVICE AND METHOD OF FABRICATING THE SAME

(75) Inventors: Masato Yamada, Annaka (JP); Nobuhiko Noto, Annaka (JP); Masanobu Takahashi, Annaka (JP); Kingo Suzuki, Annaka (JP); Shinji Nozaki, Kawasaki (JP); Kazuo Uchida, Tokyo (JP); Hiroshi Morisaki, Tsurugashima (JP)

(73) Assignees: Shin-Etsu Handotai Co., Ltd., Tokyo (JP); Nanoteco Corporation, Tokyo (JP)

( * ) Notice: Subject to any disclaimer, the term of this patent is extended or adjusted under 35 U.S.C. 154(b) by 54 days.

(21) Appl. No.: 10/690,479

(22) Filed: Oct. 22, 2003

(65) Prior Publication Data
US 2004/0206961 A1 Oct. 21, 2004

(30) Foreign Application Priority Data

| Oct. 23, 2002 | (JP) | 2002-308940 |
| Oct. 23, 2002 | (JP) | 2002-308951 |
| Nov. 29, 2002 | (JP) | 2002-349205 |
| Nov. 29, 2002 | (JP) | 2002-349259 |
| Dec. 26, 2002 | (JP) | 2002-378578 |

(51) Int. Cl.
H01L 27/15 (2006.01)
(52) U.S. Cl. ............... 257/79; 257/13; 257/94; 257/99; 257/103; 257/918
(58) Field of Classification Search ........... 257/79–103
See application file for complete search history.

(56) References Cited

U.S. PATENT DOCUMENTS

| 5,789,768 | A |   | 8/1998 | Lee et al. |
| 5,977,565 | A | * | 11/1999 | Ishikawa et al. ............. 257/81 |
| 6,121,635 | A | * | 9/2000 | Watanabe et al. ............ 257/91 |
| 6,838,705 | B1 | * | 1/2005 | Tanizawa .................... 257/101 |

FOREIGN PATENT DOCUMENTS

| JP | 1-225178 | 9/1989 |
| JP | 6-188455 | 7/1994 |

* cited by examiner

Primary Examiner—Long Pham
Assistant Examiner—Wai-Sing Louie
(74) Attorney, Agent, or Firm—Snider & Associates; Ronald R. Snider

(57) ABSTRACT

A light emitting device having an oxide transparent electrode layer as an emission drive electrode, and designed so that damage possibly occurs during bonding of electrode wires to the bonding pads is less influential to a light emitting layer portion is disclosed. The light emitting device has the light emitting layer portion composed of a compound semiconductor and has a double heterostructure in which a first-conductivity-type cladding layer, an active layer and a second-conductivity-type cladding layer are stacked in this order; and the light emitting layer portion is applied with emission drive voltage through an oxide transparent electrode layer formed so as to cover the main surface of the second-conductivity-type cladding layer. A bonding pad composed of a metal is disposed on the oxide transparent electrode layer, and to the bonding pad an electrode wire for current supply is bonded. Between the second-conductivity cladding layer and the oxide transparent electrode layer, a cushion layer composed of a compound semiconductor having a dopant concentration lower than that of the second-conductivity-type cladding layer is disposed.

58 Claims, 22 Drawing Sheets

LIGHT EMITTING DEVICE WAFER 50
CUTTING MARGIN

LIGHT EMITTING DEVICE WAFER 50

LIGHT EMITTING DEVICE CHIP 51

LIGHT EMITTING DEVICE CHIP 51
Au WIRE 47
TERMINAL ELECTRODE 9b
TERMINAL ELECTRODE 9a

RESIN MOLD 52

LIGHT EMITTING DEVICE AND METHOD OF FABRICATING THE SAME

RELATED APPLICATIONS

This application claims the priorities of Japanese Patent Applications No. 2002-308940 filed on Oct. 23, 2002, No. 2002-308951 filed on Oct. 23, 2002, No. 2002-349205 filed on Nov. 29, 2002, No. 2002-349259 filed on Nov. 29, 2002 and No. 2002-378578 filed on Dec. 26, 2002.

BACKGROUND OF THE INVENTION

1. Technical Field

This invention relates to a light emitting device and a method of fabricating the same.

2. Background Art (First Invention, Second Invention)

A light emitting device having the light emitting layer portion composed of $(Al_xGa_{1-x})_yIn_{1-y}P$ alloy (where, $0 \leq x \leq 1$, $0 \leq y \leq 1$; also referred to as AlGaInP alloy, or more simply as AlGaInP, hereinafter) can be realized as a high-luminance device by adopting a double heterostructure in which a thin AlGaInP active layer is sandwiched by an n-type AlGaInP cladding layer and a p-type AlGaInP cladding layer, both of which having a band gap energy larger than that of the active layer. Recent efforts have also succeeded in realizing a blue light emitting device in which a similar double heterostructure is formed using $In_xGa_yAl_{1-x-y}N$ (where, $0 \leq x \leq 1$, $0 \leq y \leq 1$, $x+y \leq 1$).

In an exemplary case of an AlGaInP light emitting device, the double heterostructured, light emitting layer portion is formed on an n-type GaAs substrate by hetero-epitaxial growth, in which an n-type GaAs buffer layer, an n-type AlGaInP cladding layer, an AlGaInP active layer, and a p-type AlGaInP cladding layer are sequentially stacked in this order. Current supply to the light emitting layer portion is achieved through a metal electrode formed on the surface of the device. The metal electrode herein serves as a light interceptor, so that it is formed so as to cover only a center portion of the main surface of the light emitting layer portion, so as to extract light from the surrounding non-electrode-forming region.

In this case, it is advantageous to reduce the area of the metal electrode as possible in view of improving the light extraction efficiency, because the area of the light extraction region formed around the electrode can be enlarged. Although some conventional efforts have been directed to increase the amount of light extraction by effectively spreading the current throughout the device through improving shape of the electrode, increase in the electrode area is inevitable in anyway, and this causes a dilemma that the amount of light extraction is restricted instead by decrease in the narrowing of the light extraction area. What is worse, carrier concentration of dopant in the cladding layer, or conductivity, is suppressed somewhat to a lower level so as to optimize radiative recombination of the carriers within the active layer, and this makes the current less likely to be spread in the in-plane direction. This undesirably results in concentration of current density to the electrode-covered region, and reduction in the substantial amount of light extraction from the light extraction region. One known countermeasure relates to a method of forming a current-spreading layer having a raised carrier concentration (dopant concentration) and a low resistivity between the cladding layer and the electrode. The current-spreading layer is formed by the metal organic vapor phase epitaxy (MOVPE) process or the liquid phase epitaxy (LPE) process.

There are other proposals in which a high-conductivity oxide transparent electrode layer (e.g., ITO (indium tin oxide) transparent electrode layer) is formed, in place of the current-spreading layer composed of a compound semiconductor, so as to cover the surface of the light emitting layer portion, disclosed for example in Japanese Laid-Open Patent Publication No. 1-225178, U.S. Pat. No. 5,789,768 and Japanese Laid-Open Patent Publication No. 6-188455.

In the aforementioned light emitting device, current supply to the light emitting layer portion is effected through a bonding pad composed of a metal and disposed on the outermost surface of the device, and an electrode wire bonded to the bonding pad. In an exemplary configuration of a light emitting element using an oxide transparent electrode layer as disclosed in Japanese Laid-Open Patent Publication No. 1-225178, the oxide transparent electrode layer is formed on the light emitting layer portion while placing an extra thin electrode contact layer in between. The oxide transparent electrode layer can ensure a sufficient current-spreading effect even with a small thickness by virtue of its conductivity as large as that of metals. Bonding of the electrode wire to the bonding pad is, however, disadvantageous in that damages ascribable to the bonding are likely to adversely affect the light emitting layer portion, and are likely to cause failures.

On the other hand, in the configuration using the current-spreading layer composed of a compound semiconductor, the current-spreading layer need to be formed to a certain degree of thickness in order to fully spread current in the in-plane direction. Failures will thus become less likely to occur, because the increased thickness of the current-spreading layer makes it possible, to some degree, to absorb influences of the damage ascribable to the wire bonding. The thus-configured, current-spreading layer need to be raised in the dopant concentration in order to ensure the conductivity, and this tends to result in the problems below.

The light emitting device gradually reduces its emission luminance as the current supply is continued. Assuming now that emission luminance decreasing with the elapse of cumulative current supply time is traced, while defining the emission luminance measured immediately after the current supply was started under a constant current as initial luminance, and further assuming that the time until the emission luminance falls to a predetermined limit luminance, or evaluation current supply time is fixed to a constant value (e.g., 1,000 hours), a ratio of emission luminance after the elapse of the evaluation current supply time to the initial luminance (referred to as "device lifetime", hereinafter) can be used as a proper index for evaluating service life of the device.

In the light emitting device having the current-spreading layer, the dopant concentration of the cladding layer is kept at an appropriate level in the initial stage of the current supply, but consecutive current supply can accelerate diffusion of the dopant atoms, contained at a high concentration in the current-spreading layer, into the cladding layer and active layer due to electrical factors. If the excessive dopant concentration or the accelerated diffusion of the dopant atoms results in formation of lattice defects, an electrical level which can act as a non-radiative recombination center is formed within the active layer, or at the interface between the p-type cladding layer and the active layer. This undesirably reduces probability of radiative recombination, and consequently lower the emission intensity. That is, time-dependent degradation of the emission luminance becomes more likely to degrade, so that the device lifetime also tends to degrade.

The current-spreading layer, tried to be grown by the MOVPE process or the LPE process, raises another problem in that high growth temperatures in these processes make the dopant more likely to diffuse towards the cladding layer side intrinsically expected to have a low dopant concentration. In addition, growth of a thick current-spreading layer needs a longer time and a larger amount of raw materials, and this tends to lower the production efficiency and to increase the cost.

For the case where the oxide transparent electrode layer as disclosed in Japanese Laid-Open Patent Publication No. 1-225178 is used in combination with the current-spreading layer as disclosed in U.S. Pat. No. 5,789,768, and in particular for the case where the oxide transparent electrode layer is configured as an ITO electrode layer, bonding strength between the resultant ITO electrode layer and the current-spreading layer may extremely be lowered depending on species of the compound semiconductor composing the current-spreading layer. Once this situation occurs, a photo lithography process for forming electrodes or the like, or dicing of a wafer for producing device chips, carried out on the device wafer having the ITO electrode layer already formed thereon, is likely to cause exfoliation of the ITO electrode layer, and this directly results in lowering in yield ratio of the product.

(Third Invention)

Our investigations into the back ground art same as those described in the first and second inventions revealed that the transparent conductive layer composed of ITO tends to raise the contact resistance with the compound semiconductor layer on the device side if used in an intact form, and inevitably lowers the emission efficiency due to increased series resistance. For example, Japanese Laid-Open Patent Publication No. 1-225178 proposes a method of reducing the contact resistance by interposing an electrode contact layer, which comprises an InGaAs layer, between the ITO transparent conductive layer and the compound semiconductor layer on the device side so as to face the entire portion of the ITO transparent conductive layer. It is, however, unconditionally necessary, in view of securing a desirable ohmic contact, to configure the electrode contact layer using InGaAs or the like having a small band gap energy, and this inevitably raises a problem that only a small thickness thereof inevitably result in lowered extraction efficiency due to light absorption. Another problems resides in that, in a fabrication process of the device, a bonding pad to which a current supply wire is to be bonded must be formed anyway on the electrode even if the electrode is formed with a transparent material. In this device, the drive voltage tends to concentrate into the formation region of the bonding pad which is composed of a highly-conductive metal, but tends to be scarce in the region surrounding the pad, which serves as the light extraction region, so that the light extraction efficiency becomes more likely to decrease, and an effect of adopting the transparent electrode cannot always be exhibited to a satisfactory degree.

SUMMARY OF THE INVENTION

A subject of the first invention is to provide a light emitting device having an oxide transparent electrode layer as an emission drive electrode, and designed so that damage possibly occurs during bonding of electrode wires to the bonding pads is less influential to a light emitting layer portion, and to provide a method of fabricating the same.

A first aspect of a subject of the second invention is to provide a light emitting device having an oxide transparent electrode layer as an emission drive electrode, and designed so that damage possibly occurs during bonding of electrode wires to the bonding pads is less influential to a light emitting layer portion, and to provide a method of fabricating the same. A second aspect of the subject is to provide a light emitting device having an ITO electrode layer as the oxide transparent electrode layer, in which the bonding strength of the ITO electrode layer is improved to a large degree, so as to make nonconformities such as exfoliation of the ITO electrode layer less likely to occur.

A subject of the third invention is to provide a light emitting device having an oxide transparent electrode layer as an emission drive electrode, and designed so that an improving effect of the light extraction efficiency can always fully be exhibited.

(First Invention)

To solve the aforementioned subject, the light emitting device of the first invention is such as comprising:

a light emitting layer portion composed of a compound semiconductor, and has a double heterostructure in which a first-conductivity-type cladding layer, an active layer and a second-conductivity-type cladding layer are stacked in this order; and an oxide transparent electrode layer covering the main surface of the second-conductivity-type cladding layer, and being provided for applying therethrough emission drive voltage to the light emitting layer portion;

further comprising:

a bonding pad composed of a metal and disposed on the oxide transparent electrode layer, and has an electrode wire for current supply bonded thereto; and a cushion layer disposed between the second-conductivity-type cladding layer and the oxide transparent electrode layer, and comprising a compound semiconductor layer having a dopant concentration lower than that of the second-conductivity-type cladding layer.

The method of fabricating a light emitting device of the first invention is such as fabricating a light emitting device which comprises a light emitting layer portion composed of a compound semiconductor, and has a double heterostructure in which a first-conductivity-type cladding layer, an active layer and a second-conductivity-type cladding layer are stacked in this order; and an oxide transparent electrode layer covering the main surface of the second-conductivity-type cladding layer, and provided for applying therethrough emission drive voltage to the light emitting layer portion; comprising the steps of:

forming a cushion layer on the second-conductivity-type cladding layer of the light emitting layer portion, the cushion layer comprising a compound semiconductor layer having a dopant concentration lower than that of the second-conductivity-type cladding layer;

forming the oxide transparent electrode layer so as to cover the cushion layer;

forming a bonding pad composed of a metal on the oxide transparent electrode layer; and bonding an electrode wire for current supply to the bonding pad;

where these steps are sequentially carried out in this order.

In the first invention, the cushion layer, composed of a compound semiconductor having a dopant concentration lower than that of the second-conductivity cladding layer, is formed on the second-conductivity type cladding layer, and further on the cushion layer, the oxide transparent electrode layer is formed, and the electrode wire is bonded to the bonding pad disposed on the oxide transparent electrode layer, so that most portion of damaged region, even it should accidentally occur during the bonding, can be confined within the cushion layer, and influences thereof becomes less likely to be exerted on the light emitting layer portion.

In an exemplary case where the wire bonding is carried out by ultrasonic bonding, or thermosonic bonding further combined with heat, impact stress of ultrasonic wave or heat (or pressure) is concentrated into the compound semiconductor layer right under the bonding pad, and introduces therein crystal defects such as dislocation to thereby form the damaged region. The damaged region undesirably extends to reach the light emitting layer portion can result in the following nonconformities, which are specifically represented by:

(1) direct lowering of the emission luminance, which is supposed to be mainly ascribable to an increased contribution of the non-radiative transition processes caused by the crystal defect; and (2) shortened lifetime of the device, which is ascribable to the damaged region possibly formed in the light emitting layer portion. If the light emitting layer portion having dislocation formed therein is kept under a consecutive current supply, the current concentrates to the dislocation and tends to proliferate it, and this results in a time-dependent degradation of the emission luminance.

In contrast to this, the cushion layer in the light emitting device of the first invention is designed so as to have a dopant concentration lower than that of the second-conductivity-type cladding layer. This means that, there is formed between the cushion layer and the second-conductivity-type cladding layer, a concentration gradient of the dopant atom having an opposite direction to that of dopant diffusion electrically accelerated during the emission current supply, and this prevents incoming of the dopant atom into the second-conductivity-type cladding layer. This is successful in considerably increasing the device lifetime as a result of a combined effect with that influence of the damaged region to the light emitting layer portion has been relieved. This is also successful in suppressing a nonconformity that the dopant may undesirably cause reverse diffusion towards the second-conductivity-type cladding layer during the layer growth.

Although the cushion layer will have only a small in-plane conductivity due to its low dopant concentration, a sufficient level of current-spreading effect will be attained if the oxide transparent electrode layer is formed with a small sheet resistance. The cushion layer therefore can ensure uniform current supply to the light emitting layer portion, and consequently raise the emission efficiency, if only the thickness-wise conductivity thereof is secured to a satisfactory level.

The thickness of the cushion layer is preferably adjusted to 0.1 μm to 5 μm. The thickness of smaller than 0.1 μm will make the influence of the electrode wire bonding more likely to exert on the light emitting layer portion. The thickness exceeding 5 μm will undesirably increase the resistivity in the thickness-wise direction due to its low dopant concentration, and will result in lowered emission efficiency due to increased series resistance of the device. The thick cushion layer is also disadvantageous in that the growth thereof needs a longer time and a larger consumption of the source materials, and this tends to lower the production efficiency and to increase the cost. The thickness of the cushion layer is more preferably adjusted to 0.5 μm to 3 μm.

It is necessary for the cushion layer to have a conductivity type same as that of the second-conductivity-type cladding layer. Considering that the radiative recombination is likely to occur particularly in the vicinity of the interface with a p-type cladding layer in an active layer, it is more preferable to configure both of the cushion layer and the second-conductivity-type cladding layer, which locate on the light extraction surface side, as p-type layers. For the case where Group III–V compound semiconductor is used, Zn and Mg are available as the p-type dopant which serves as a majority carrier source. The light emitting layer portion composed of Group III–V compound semiconductor can be exemplified by those having double heterostructure in which the first-conductivity-type cladding layer, the active layer and the second-conductivity-type cladding layer, all of which being composed of $(Al_xGa_{1-x})_yIn_{1-y}P$ (where $0 \leq x \leq 1$, $0 \leq y \leq 1$; also referred to as "AlGaInP", hereinafter) or $In_xGa_yAl_{1-x-y}N$ (where, $0 \leq x \leq 1$, $0 \leq y \leq 1$, $x+y \leq 1$; also referred to as "InGaAlN", hereinafter), are stacked in this order.

For a specific case where the light emitting layer portion is composed of AlGaInP, and the second-conductivity-type cladding layer is configured as a p-type cladding layer containing Zn as a p-type dopant, it is undesirable to dispose the current-spreading layer having a large Zn concentration in contact therewith, because back diffusion of Zn is very likely to proceed and the emission efficiency tends to degrade. In contrast to this, the first invention is successful in effectively avoiding the problem of Zn diffusion by setting the Zn concentration in the p-type cushion layer lower than that of the p-type cladding layer.

The majority carrier concentration of the second-conductivity-type cladding layer is preferably adjusted to $5 \times 10^{16}$/cm$^3$ or above and less than $1 \times 10^{18}$/cm$^3$. The majority carrier concentration smaller than $5 \times 10^{16}$/cm$^3$ will increase the series resistance of the device, and thus result in degradation of the emission efficiency. The concentration equal to or exceeding $1 \times 10^{18}$/cm$^3$ will make it more likely to cause defect levels which serve as a non-radiative recombination center, and this will again result in degradation of the emission efficiency. The majority carrier concentration of the second-conductivity-type cladding layer is more preferably adjusted to $1 \times 10^{17}$/cm$^3$ to $7 \times 10^{17}$ cm$^3$, both ends inclusive.

The dopant concentration of the cushion layer is preferably adjusted to $4 \times 10^{16}$/cm$^3$ to $9 \times 10^{17}$/cm$^3$, both ends inclusive, in terms of majority carrier concentration. The majority carrier concentration smaller than $4 \times 10^{16}$/cm$^3$ will increase the series resistance of the device, and thus result in increase in the forward voltage of the device. The concentration exceeding $9 \times 10^{17}$/cm$^3$ will make it more likely to accelerate diffusion of the dopant atom from the cushion layer to the light emitting layer portion side due to electrical factors, and this eventually degrades the device lifetime. The majority carrier concentration of the cushion layer is more preferably adjusted to $9 \times 10^{16}$/cm$^3$ to $6 \times 10^{17}$/cm$^3$, both ends inclusive.

In the process of bonding the electrode wire to the bonding pad, it is of course preferable that the damage is not so influential to the light emitting layer portion as possible. For the case where the influence of the damage extends only to as far as the surficial portion of the second-conductivity-type cladding layer, and the influence on the active layer can be minimized, there will be only a small anticipation on the degradation of the emission luminance and device lifetime. In this case, the bonding-caused damage is effectively prevented from extending to the active layer if the total thickness of the cushion layer and second-conductivity-type cladding layer is secured as large as 0.6 μm or above, and more preferably 1.0 μm or above. It is to be noted, however, that the upper limit of preferable thickness of the cushion layer falls around 5 μm, and that the dopant concentration of the second-conductivity-type cladding layer must be suppressed to as low as described in the above. The total thickness of the cushion layer and second-conductivity-type cladding layer is, therefore, preferably set to less than 10 μm in view of suppressing the increment of the series resistance.

The cushion layer is preferably composed of a material which shows only a minimum absorption of the light emitted from the light emitting layer portion in view of raising the light extraction efficiency. For this purpose, it is effective that a compound semiconductor composing the cushion layer is preferably such as having a band gap energy larger than that of the active layer of the light emitting layer portion. For the case where the light emitting layer portion is composed of AlGaInP, specific examples of the materials for composing the cushion layer include AlGaAs, GaP, GaAsP and AlGaAsP. The cushion layer formed to as thin as described in the above is also advantageous in view of suppression of the light absorption. For the case where the electrode contact layer, described later, is composed of GaAs or InGaAs, the cushion layer composed of AlGaAsP is particularly effective in view of raising lattice matching property with the electrode contact layer.

The light emitting layer portion and the cushion layer can be formed by any one of, or any combinations of the metal organic vapor phase epitaxy (MOVPE) process, liquid phase epitaxy (LPE) process and hydride vapor phase epitaxy (HVPE) process. In particular, the MOVPE process is advantageous in more readily obtaining the light emitting layer portion having an excellent quality, and in raising the emission efficiency. In this case, it is efficient to carry out growth of the light emitting layer portion and growth of the cushion layer in succession by the MOVPE process. Although growth of a thick current-spreading layer as in the conventional device by the MOVPE process, characterized by a relatively slow growth speed, results in a considerable decrease in the production efficiency, the cushion layer, which is desired to be formed with a small thickness as described in the above hardly causes the problem of decrease in the efficiency even when the MOVPE process is adopted.

The oxide transparent electrode layer can typically be composed of ITO. ITO refers to indium oxide doped with tin oxide, and can give an electrode layer having a resistivity suppressed sufficiently to as low as $5\times10^{-4}$ Ω·cm by adjusting tin oxide content to 1 to 9 wt %. Besides the ITO electrode layer, a ZnO electrode layer having a large conductivity is applicable to the first invention. Other available materials for composing the oxide transparent electrode layer include tin oxide doped with antimony oxide (so-called NESA), $Cd_2SnO_4$, $Zn_2SnO_4$, $ZnSnO_3$, $MgIn_2O_4$, $CdSb_2O_6$ doped with yttrium (Y) oxide and $GaInO_3$ doped with tin oxide. These conductive oxide have a desirable transmissivity with respect to the visible light (i.e., transparent), and are advantageous in that they are not obstructive to the light extraction even when they are used as a voltage-applying electrode for the light emitting layer portion. The oxide transparent electrode layer also has a role of spreading the current when it is applied with device drive voltage through the metal electrode such as bonding pad formed thereon. The oxide transparent electrode layer can be formed by publicly-known vapor phase growth processes such as chemical vapor deposition (CVD); physical vapor deposition (PVD) processes such as sputtering and vacuum evaporation; and molecular beam epitaxy (MBE). For example, ITO electrode layer and ZnO electrode layer can be formed by RF sputtering or vacuum evaporation, and NESA film can be formed by the CVD process. In place of these vapor phase growth processes, still other processes such as the sol-gel process is also applicable.

The oxide transparent electrode layer such as the ITO layer may sometimes fail in forming a desirable ohmic contact in direct bonding with the compound semiconductor layer, and may lower the emission efficiency due to increased series resistance based on the contact resistance. In this case, the contact resistance can successfully be lowered by disposing the electrode contact layer for reducing the contact resistance of the oxide transparent electrode layer so as to contact therewith. When ITO is used, layers available for the electrode contact layer include InGaAs layer and GaAs layer.

It is essential to keep the contact resistance between the electrode contact layer and the cushion layer stably at a small value even after the current supply to the light emitting device is continued for a long duration of time, in other words, that time-dependent increase in the contact resistance is made less likely to occur. One effective method of reducing the contact resistance is to add a dopant of the same conductivity type with that of the cushion layer to the electrode contact layer. In this case, the larger the amount of addition of the dopant to the electrode contact layer increases, the lower the contact resistance becomes. Under a relatively large tendency of the dopant diffusion from the electrode contact layer to the cushion layer, an excessively larger amount of addition of the dopant in the electrode contact layer over the cushion layer may result in electrical acceleration of the dopant diffusion from the electrode contact layer to the cushion layer during emission current supply, and this may gradually deplete the amount of dopant in the electrode contact layer. This undesirably increases the contact resistance of the electrode contact layer with the elapse of time of the current supply, and results in degradation of the device lifetime.

To suppress this nonconformity, it is preferable to set the dopant concentration of the electrode contact layer larger than that of the cushion layer, and at the same time, to use a compound semiconductor for composing the electrode contact layer, which has a band gap energy smaller than that of the cushion layer in contact therewith. By setting the band gap energy on the electrode contact layer side smaller than that of the cushion layer, the diffusion of the dopant atom to the cushion layer becomes less likely to occur even if the dopant concentration of the electrode contact layer is raised to a certain degree, and the time-dependent increase in the contact resistance of the electrode contact layer is effectively prevented from increasing.

When the oxide transparent electrode layer is configured as an ITO electrode layer, the electrode contact layer preferably has a composition of $In_xGa_{1-x}As$ ($0<x\leq1$) at least at the junction interface with the ITO electrode layer. In this case, the electrode contact layer may have a composition of $In_xGa_{1-x}As$ ($0\leq x\leq1$) on the junction side with the cushion layer, and the cushion layer may typically be composed of $Al_yGa_{1-y}As$ ($0<y\leq1$), which is a semiconductor having a still larger band gap energy. It is also allowable to compose the cushion layer using other layers having the alloy composition thereof adjusted so as to attain a larger band gap energy than that of the electrode contact layer, where examples of which include GaInP layer, AlGaInP layer, GaP layer, GaAsP layer and AlGaAsP layer.

It is still also allowable to lower the dopant concentration per se of the electrode contact layer to thereby suppress the diffusion towards the cushion layer. In this case, the dopant concentration of the electrode contact layer is preferably equivalent to, or smaller than that of the cushion layer. It is also necessary for the electrode contact layer to show a sufficiently small contact resistance with the oxide transparent electrode layer even under a low-doped condition, and to show a small contact resistance also with the cushion layer. More specifically, it is preferable to use a material which does not form an extremely high hetero junction barrier at the interface with the cushion layer. For the case where the electrode contact layer is composed of GaAs containing In which has diffused from the ITO layer side, a preferable combination is such as using $In_yGa_{1-y}As$ ($0 \leq y \leq 0.2$, for example) having a relatively small InAs alloy composition y for composing the cushion layer.

The electrode contact layer formed so as to cover the entire portion of the contact surface with the oxide transparent electrode layer lowers contact resistance of the oxide transparent electrode layer also in the region right under the boding pad for wire bonding, but this makes the drive current or light emission more likely to concentrate within that region, so that a large portion of the emitted light is intercepted by the bonding pad, and thereby the light extraction efficiency is degraded. It is therefore preferable that, for the case where the electrode contact layer for reducing the junction resistance of the oxide transparent electrode layer is disposed between the cushion layer and the oxide transparent electrode layer so as to contact with the oxide transparent electrode layer, the electrode contact layer is formed with an ratio of formation area smaller in a primary region which locates right under the bonding pad, than in a secondary region surrounding the primary region. It is to be noted that the ratio of formation area of the electrode contact layer in the individual regions is a ratio obtained by dividing a total area of the electrode contact layer in the region with the total area of the region. In this configuration, contact resistance of the oxide transparent electrode layer in the primary region increases. This allows a larger portion of the drive current of the light emitting device to bypass the primary region to reach the secondary region, and thus raises the light extraction efficiency to a large degree. It is preferable in view of improving the light extraction efficiency that the primary region, capable of yielding only a less amount of light extraction, is not supplied as possible with the emission drive current. It is therefore preferable that the primary region has possibly no electrode contact layer formed therein.

In the conventional light emitting device having a thick current-spreading layer formed therein in order to raise the current spreading effect, there has been adopted a blocking layer having a conductivity type opposite to that of the current-spreading layer formed so as to be buried in the current-spreading layer, in order to bypass the current outside the region right under the bonding pad, but this was disadvantageous in that the device configuration becomes more complicated, and the number of process steps for the fabrication increases. In contrast to this, the aforementioned configuration, in which formation of the electrode contact layer is suppressed in the primary region right under the bonding pad, is successful in readily obtaining an effect of bypassing the current towards the outward region, that is the secondary region. Another advantage resides in that the underlying layer formed under the oxide transparent layer is the cushion layer having only a small sheet resistance, so that this is successful in suppressing a nonconformity such that the bypassed current once came into the secondary region flows within the cushion layer back to the primary region side.

Our investigations revealed that the adhesion strength between the obtained ITO electrode layer and the cushion layer tends to degrade when the oxide transparent electrode layer is configured as the ITO electrode layer, and the cushion layer disposed thereunder is composed of a phosphorus-containing compound semiconductor, in particular of a Group III–V compound semiconductor having phosphorus as a major component of the Group III element.

Because the electrode contact layer is designed so as to have a band gap energy smaller than the energy corresponded to the emission wavelength as described in the above, it is formed to a thickness of as small as 3 to 30 nm or around so as to avoid absorption of the light from the light emitting layer portion. It is anticipated herein, for the case where the cushion layer is composed of a phosphorus-containing compound semiconductor such as GaP, that the phosphorus component may diffuse from the phosphorus-containing compound semiconductor through the thin electrode contact layer to reach the ITO layer side while being affected by heat history during the growth of the ITO layer or annealing after the ITO electrode layer is formed (that is, annealing for diffusing In from the ITO layer to the GaAs layer so as to form an In-containing GaAs electrode contact layer), and this may be causative of degraded adhesion strength of the ITO layer.

The light emitting device of the first invention is configured as described in the next. That is, the oxide transparent electrode layer is an ITO electrode layer; and between the cushion layer and the ITO electrode layer, the electrode contact layer for reducing junction resistance of the ITO electrode layer is disposed so as to contact with the ITO electrode layer; the cushion layer comprises a phosphorus-containing compound semiconductor layer containing phosphorus; and between the cushion layer and the electrode contact layer, a phosphorus-blocking layer having a band gap energy larger than that of the electrode contact layer, and having a phosphorus content lower than that of the phosphorus-containing compound semiconductor layer is disposed. The phosphorus-blocking layer having a band gap energy larger than that of the electrode contact layer shows a smaller absorption of light flux from the light emitting layer portion than the electrode contact layer shows. Its phosphorus content adjusted lower than that of the phosphorus-containing compound semiconductor layer located opposite to the electrode contact layer makes phosphorus diffusion towards the ITO electrode layer side less likely to occur. Therefore by interposing the phosphorus-blocking layer, the phosphorus component derived from the phosphorus-containing compound semiconductor layer which composes the cushion layer can reach the ITO electrode layer only after passing through both of the phosphorus-blocking layer and the electrode contact layer. This is most successful in suppressing the phosphorus diffusion towards the ITO electrode layer to a large extent, and in raising the adhesion strength of the ITO electrode layer.

In view of raising the suppressive effect over the phosphorus diffusion towards the ITO electrode layer, the phosphorus-blocking layer is more preferably composed of a phosphorus-free compound semiconductor. More specifically, from both viewpoints of suppressing the phosphorus diffusion towards the ITO electrode layer and suppressing absorption of the light flux from the light emitting layer portion, the phosphorus-blocking layer is preferably composed of AlGaAs. AlGaAs is an alloy of AlAs and GaAs, expressed as $Al_bGa_{1-b}As$, where b represents AlAs alloy composition, and is properly adjusted so as to make the band gap energy larger than that of the active layer (values for b therefore differ depending on materials for composing the active layer). It is preferable herein that the band gap energy of the phosphorus-blocking layer composed of AlGaAs is larger by at least 0.1 eV or more than that of the active layer so as to avoid the light absorption. In addition, the AlAs alloy composition b of the phosphorus-blocking layer composed of AlGaAs is preferably adjusted to 0.85 or below in view of ensuring a desirable moisture-proof property.

To enhance the suppressive effect over the phosphorus diffusion towards the ITO layer, it is preferable to adjust the total thickness of the phosphorus-blocking layer and the electrode contact layer to as thick as 20 nm or above. The total thickness less than 20 nm may undesirably fail in enhancing the suppressive effect over the phosphorus diffusion.

The phosphorus-blocking layer in this case can be configured as an intermediate layer having a band gap energy smaller than that of the phosphorus-containing compound semiconductor composing the cushion layer, but larger than that of the electrode contact layer. When there is a large band-end discontinuity value between the cushion layer and the electrode contact layer, the resultant hetero barrier height $\Delta E$ increases due to bend in the band structure caused by the bonding, as shown in FIG. 8, and this results in increase in the contact resistance. Interposition of the aforementioned intermediated layer, as shown in FIG. 9, is now successful in reducing the band-end discontinuity values both between the electrode contact layer and the intermediate layer, and between the intermediate layer and the cushion layer in contact therewith, and in lowering the barrier heights $\Delta E$ formed respectively therebetween. This successfully reduces the series resistance, and achieves a large emission intensity even under a low drive voltage. If the intermediate layer is configured as being capable of functioning also as the phosphorus-blocking layer, the suppressive effect over the phosphorus diffusion from the cushion layer portion, which is configured as a phosphorus-containing compound semiconductor, towards the ITO electrode layer can be obtained at the same time. In particular for the case where the cushion layer is composed of GaP, and the electrode contact layer is composed of an In-containing GaAs, the phosphorus-blocking layer, also acts as the intermediate layer, is preferably composed of AlGaAs.

Next, for the case where the second-conductivity-type cladding layer is configured as a phosphorus-containing compound semiconductor layer containing phosphorus, the cushion layer per se can be configured as the phosphorus-blocking layer having a band gap energy larger than that of the electrode contact layer, and a phosphorus content smaller than that of the phosphorus-containing compound semiconductor layer. In this case, the electrode contact layer is formed so as to contact with the cushion layer which configures the phosphorus-blocking layer. This configuration in which the cushion layer per se is configured as the phosphorus-blocking layer is successful in achieving effects of making influences of the damage possibly caused in the electrode wire bonding less likely to be exerted on the active layer, and of suppressing the phosphorus diffusion towards the ITO electrode layer. Also the cushion layer configured as the phosphorus-blocking layer is preferably composed of a phosphorus-free compound semiconductor, and more specifically, AlGaAs.

(Second Invention)

To solve the aforementioned subject, a light emitting device of the first aspect of the second invention is such as:

a light emitting device comprising:

a light emitting layer portion composed of a compound semiconductor, and has a double heterostructure in which a first-conductivity-type cladding layer, an active layer and a second-conductivity-type cladding layer are stacked in this order; and an oxide transparent electrode layer covering the main surface of the second-conductivity-type cladding layer, and being provided for applying therethrough emission drive voltage to the light emitting layer portion;

further comprising:

a bonding pad composed of a metal and is disposed on the oxide transparent electrode layer, and having an electrode wire for current supply bonded thereto; and an electrode contact layer composed of a compound semiconductor, provided for reducing junction resistance of the oxide transparent electrode layer, and disposed so as to contact with the oxide transparent electrode layer;

wherein a bonding-side semiconductor layer, which is defined as a compound semiconductor layer including the second-conductivity-type cladding layer disposed between the active layer and the electrode contact layer, has a dopant concentration of $4 \times 10^{16}/cm^3$ or above and less than $1 \times 10^{18}/cm^3$, and has a thickness of 0.6 $\mu$m or above and less than 10 $\mu$m.

A method of fabricating a light emitting device of the second invention is such as fabricating a light emitting device which comprises a light emitting layer portion composed of a compound semiconductor, and has a double heterostructure in which a first-conductivity-type cladding layer, an active layer and a second-conductivity-type cladding layer are stacked in this order; and an oxide transparent electrode layer covering the main surface of the second-conductivity-type cladding layer, and provided for applying therethrough emission drive voltage to the light emitting layer portion; comprising the steps of:

forming a bonding-side semiconductor layer, being a compound semiconductor layer including the second-conductivity-type cladding layer, so as to have a dopant concentration of $4 \times 10^{16}/cm^3$ or above and less than $1 \times 10^{18}/cm^3$, and a thickness of 0.6 $\mu$m or above and less than 10 $\mu$m, on the active layer of the light emitting layer portion;

forming an electrode contact layer composed of a compound semiconductor, and provided for reducing junction resistance of the oxide transparent electrode layer, on the bonding-side semiconductor layer;

forming the oxide transparent electrode layer so as to contact with the electrode contact layer and to cover the main surface of the second-conductivity-type cladding layer;

forming a bonding pad composed of a metal on the oxide transparent electrode layer; and bonding an electrode wire for current supply to the bonding pad;

where these steps are sequentially carried out in this order.

In the second invention, on the active layer of the light emitting layer portion, the bonding-side semiconductor layer which is a compound semiconductor layer including the second-conductivity-type cladding layer is formed so as to have a dopant concentration of $4 \times 10^{16}/cm^3$ or above and less than $1 \times 10^{18}/cm^3$, and has a thickness of 0.6 $\mu$m or above and less than 10 $\mu$m, and further on the bonding-side semiconductor layer, the oxide transparent electrode layer is formed, and the electrode wire is bonded on the bonding pad formed on the oxide transparent electrode layer. The oxide transparent electrode layer such as the ITO layer may sometimes fail in forming a desirable ohmic contact in direct bonding with the bonding-side compound semiconductor layer, and may lower the emission efficiency due to increased series resistance based on the contact resistance. As a countermeasure for this, the electrode contact layer for reducing the contact resistance of the oxide transparent electrode layer is disposed between the bonding-side semiconductor layer and the oxide transparent electrode layer so as to contact with the oxide transparent electrode layer. Because the bonding-side semiconductor layer is thus formed, influences of the damaged region, even it should accidentally occur during the bonding, can extend only to as far as the surficial portion of the bonding-side semiconductor layer, and become less influential to a light emitting layer portion. The first aspect of the subject of the second invention is thus solved.

In an exemplary case where the wire bonding is carried out by ultrasonic bonding, or thermosonic bonding further combined with heat, impact stress of ultrasonic wave or heat (or pressure) is concentrated into the compound semiconductor layer right under the bonding pad, and introduces therein crystal defects such as dislocation to thereby form the damaged region. The damaged region undesirably extends to reach the light emitting layer portion can result in the following nonconformities, which are specifically represented by:

(1) direct lowering of the emission luminance, which is supposed to be mainly ascribable to an increased contribution of the non-radiative transition processes caused by the crystal defect; and (2) shortened lifetime of the device, which is ascribable to the dislocation possibly formed in the light emitting layer portion. If the light emitting layer portion having dislocation formed therein is kept under a consecutive current supply, the current concentrates to the dislocation and tends to proliferate it, and this results in a time-dependent degradation of the emission luminance.

Adoption of the second invention, however, is successful in effectively avoiding the aforementioned nonconformities.

In addition in the light emitting device of the second invention, the dopant concentration of the bonding-side semiconductor layer including the second-conductivity-type cladding layer is set as low as described in the above. This is successful in considerably increasing the device lifetime as a result of combined effects of that increase in the dopant atom concentration in the second-conductivity-type cladding layer due to electrical acceleration of the diffusion becomes less likely to occur, and that influences of the damaged region over the active layer has successfully been relieved.

Although the bonding-side semiconductor layer including the second-conductivity-type cladding layer will have only a small in-plane conductivity due to its low dopant concentration, a sufficient level of current-spreading effect will be attained if the oxide transparent electrode layer having a small sheet resistance is formed thereon. The boding-side semiconductor layer therefore can ensure uniform current supply to the light emitting layer portion, and consequently raise the emission efficiency, if only the thickness-wise conductivity thereof is secured to a satisfactory level.

The thickness of the bonding-side semiconductor layer of less than 0.6 μm will make influences of the damage ascribable to the bonding more likely to extend to the active layer, and will cause degradation of the emission intensity and device lifetime. On the other hand, since the dopant concentration of the bonding-side semiconductor layer is suppressed to a relatively low level, the thickness thereof equals to or exceeding 10 μm will undesirably result in excessive increase in the series resistance of the device.

The dopant concentration of the bonding-side semiconductor layer of less than $4\times10^{16}/cm^3$ will increase the series resistance of the device, and thus raise the forward voltage of the device. The dopant concentration equals to or exceeding $1\times10^{18}/cm^3$ will make radiative recombination of the carriers in the active layer less likely to proceed, and result in a lowered emission efficiency.

In the light emitting device, the bonding-side semiconductor layer which locates on the light extraction surface side is preferably configured as a p-type layer considering that the radiative recombination is more likely to occur in the vicinity of the interface with a p-type cladding layer in an active layer. For the case where Group III–V compound semiconductor is used, Zn and Mg are available as the p-type dopant which serves as a majority carrier source. The light emitting layer portion composed of Group III-V compound semiconductor can be exemplified by those having double heterostructure in which the first-conductivity-type cladding layer, the active layer and the second-conductivity-type cladding layer, all of which being composed of $(Al_xGa_{1-x})_yIn_{1-y}P$ (where $0\leq x\leq 1$, $0\leq y\leq 1$) or $In_xGa_yAl_{1-x-y}N$ (where, $0\leq x\leq 1$, $0\leq y\leq 1$, $x+y\leq 1$), are stacked in this order.

It is allowable herein that the bonding-side semiconductor layer comprises the second-conductivity-type cladding layer, and a cushion layer disposed so as to contact with the oxide transparent electrode layer side of the second-conductivity-type cladding layer, and being composed of a compound semiconductor having a dopant concentration lower than that of the second-conductivity-type cladding layer. By disposing the cushion layer, most portion of the damaged region, even it should accidentally occur during the bonding, can be confined within the cushion layer, and influences thereof becomes less likely be exerted not only on the active layer but also on the second-conductivity-type cladding layer. This is successful in suppressing degradation of the emission intensity and the device lifetime.

The cushion layer, having a dopant concentration lower than that of the second-conductivity-type cladding layer adjacent thereto, can successfully suppress undesirable flow of the dopant atom from the cushion layer to the second-conductivity-type cladding layer, and contributes to a large improvement in the device lifetime. It is also advantageous in that back diffusion of the dopant towards the second-conductivity-type cladding layer during the layer growth is less likely to occur.

The cushion layer is preferably composed of a material which shows only a minimum absorption of the light emitted from the light emitting layer portion in view of raising the light extraction efficiency. For this purpose, it is effective that a compound semiconductor composing the cushion layer is preferably such as having a band gap energy larger than that of the active layer of the light emitting layer portion. For the case where the light emitting layer portion is composed of AlGaInP, specific examples of the materials for composing the cushion layer include AlGaAs, GaP, GaAsP and AlGaAsP. The cushion layer formed with a small thickness is also advantageous in view of suppression of the light absorption. More specifically, the thickness of the cushion layer is preferably adjusted to 0.1 μm to 5 μm. The thickness of smaller than 0.1 μm will tend to decrease the total thickness of the bonding-side semiconductor layer, and will make the influence of the electrode wire bonding more likely to exert on the light emitting layer portion. The thickness exceeding 5 μm will undesirably increase the resistivity in the thickness-wise direction due to its low dopant concentration, and will result in lowered emission efficiency due to increased series resistance of the device. The thick cushion layer is also disadvantageous in that the growth thereof needs a longer time and a larger consumption of the source materials, and this tends to lower the production efficiency and to increase the cost. The thickness of the cushion layer is more preferably adjusted to 0.5 μm to 3 μm.

On the other hand, the bonding-side semiconductor layer can be configured as the second-conductivity-type cladding layer having a thickness of 0.6 μm or above and less than 10 μm. That is, the second-conductivity-type cladding layer formed with a necessary and sufficient thickness can successfully prevent the damaged region from extending and reaching the active layer. In this case, the fabrication is very simple because there is only a need of forming the cladding layer using a single species of material with an increased thickness. It is preferable, in view of reducing the production cost, that the first-conductivity-type cladding layer is formed thinner than the second-conductivity-cladding layer, because there is no need of considering the influence of the wire bonding as for the first-conductivity-type cladding layer.

The oxide transparent electrode layer can be composed of the materials absolutely same as those described in the first invention, and typically of ITO.

The electrode contact layer is preferably configured as a layer composed of a compound semiconductor containing no Al, and having a relatively small band gap energy (e.g., less than 1.42 eV). Use of this sort of electrode contact layer is successful in obtaining a desirable ohmic contact, and is less causative of increase in the resistivity due to oxidation of the Al component.

The electrode contact layer can absorb the light from the light emitting layer portion when it is designed to have a band gap energy smaller than the energy corresponded to the emission wavelength, so that it is preferable, in view of raising the light extraction efficiency, to adjust the thickness thereof to as small as possible, typically to as small as 3 to 30 nm or around. The thickness exceeding 30 nm may undesirably result in increased effect of the light absorption, and the thickness less than 3 nm may make it difficult to keep a bulk crystal structure and to obtain a sufficient effect of reducing the contact resistance.

When the oxide transparent electrode layer is configured as the ITO electrode layer, the electrode contact layer can be configured as an InGaAs layer or GaAs layer. The electrode contact layer is particularly successful in enhancing the effect of reducing the contact resistance when it has a composition of $In_xGa_{1-x}As$ ($0<x\leq 1$) (at least) at the junction interface with the ITO layer. For the case where the light emitting layer is composed of $(Al_xGa_{1-x})_y(In_{1-y}P$ (where, $0\leq x\leq 1$ and $0\leq y\leq 1$), a possible process is such as forming the GaAs layer so as to contact with the ITO layer, and then annealing the layers so as to allow In to diffuse from the ITO layer towards the GaAs layer, to thereby form the electrode contact layer composed of In-containing GaAs. In this case, the resultant electrode contact layer has an In concentration profile continuously decreasing as receding from the ITO layer in the thickness-wise direction, and always has a composition of $In_xGa_{1-x}As$ at the junction interface with the ITO layer.

Although it is also allowable to adopt a method of directly growing the InGaAs by the epitaxial process for the growth of the electrode contact layer, the above-described method has the advantages as described below. That is, for the case where the portion of the bonding-side semiconductor layer in contact with the electrode contact layer is composed of AlGaAs, GaP or AlGaInP, the GaAs layer can readily establish lattice matching with these compound semiconductors, and can form a film having an excellent uniformity and continuity as compared with the case where InGaAs is directly grown by the epitaxial process.

The ITO layer is then formed on the GaAs layer, and annealed so as to allow In to diffuse from the ITO layer towards the GaAs layer, thereby form the electrode contact layer. The electrode contact layer composed of In-containing GaAs and thus obtained by the annealing is effectively prevented from becoming excessive in the In content, and from causing quality degradation such as lowered emission intensity, ascribable to lattice mismatch with the bonding-side semiconductor layer.

It is preferable that the In concentration profile of the electrode contact layer in the thickness-wise direction thereof is defined so as to show a continuously decreasing pattern as receding from the ITO electrode layer in the thickness-wise direction (that is, to grade the In concentration profile so that the In concentration becomes smaller on the light emitting layer portion side), as indicated by curve ① in FIG. 15. This structure can be formed by annealing in which In is allowed to diffuse from the ITO side towards the electrode contact layer side. For the case where the light emitting layer portion is composed of AlGaInP, the In concentration profile of the electrode contact layer reduced on the light emitting layer portion side is advantageous in minimizing difference in the lattice constants with that of the light emitting layer portion, and to thereby further improve the lattice matching property between the light emitting layer portion and the electrode contact layer. Any excessively elevated annealing temperature or excessively prolonged annealing time, however, undesirably promotes the In diffusion from the ITO layer, and this makes the In concentration profile in the electrode contact layer kept constant at a relatively high level as shown by curve ③ in FIG. 15, where the above-described effects become not attainable. It is to be noted that any excessively lower annealing temperature or excessively shorter annealing time results in shortage of the In concentration in the electrode contact layer as shown by curve ② in FIG. 15.

Referring now to FIG. 15, assuming that In concentration of the electrode contact layer in the vicinity of the interface with the ITO layer as $C_A$, and In concentration in the vicinity of the opposite interface as $C_B$, it is preferable to adjust a value $C_B/C_A$ to 0.8 or below, and so that it is preferable to carry out the aforementioned annealing so as to attain the In concentration profile as described in the above. Any value $C_B/C_A$ exceeding 0.8 may result in only a limited effect of improving the lattice matching property with the light emitting layer potion by virtue of gradient in the In concentration profile. Compositional distribution (In or Ga concentration profile) of the electrode contact layer in the thickness-wise direction can be measured by publicly-known techniques for surface analysis such as secondary ion mass spectroscopy (SIMS), Auger electron spectroscopy (AES) and X-ray photoelectron spectroscopy (XPS), while gradually etching the electrode contact layer in the thickness-wise direction.

The In concentration of the electrode contact layer in the vicinity of the interface with the ITO layer is preferably adjusted to 0.1 to 0.6 when expressed by an atomic ratio of In to a total concentration of In and Ga, so that the above-described annealing is preferably carried out so as to attain such In concentration. The In concentration based on the above definition less than 0.1 may result in only an insufficient effect of reducing the contact resistance of the electrode contact layer, and exceeding 0.6 may considerably worsen the quality degradation such as lowered emission intensity due to lattice mismatch between the electrode contact layer and the light emitting layer portion. So far as the In concentration of the electrode contact layer in the vicinity of the interface with the ITO electrode layer is kept within the above desirable range (0.1 to 0.6) expressed by an atomic ratio of In to a total concentration of In and Ga, it is of no problem if the In concentration $C_B$ of the electrode contact layer falls to zero in the vicinity of the interface opposite to that facing to the ITO electrode layer, that is, as shown in FIG. 16, it is of no problem if the InGaAs layer is formed on the ITO electrode layer side of the electrode contact layer, and the GaAs layer is formed on the opposite side.

ITO film is an indium oxide film doped with tin oxide as described in the above, and can produce the electrode contact layer having the aforementioned desirable In concentration when it is formed on the GaAs layer and then annealed under an appropriate temperature range. The annealing is successful in further reducing the electric resistivity of the ITO layer. The annealing is preferably carried out under lower temperatures within a shorter period as possible so as to avoid an excessive In concentration of the electrode contact layer.

The annealing is preferably carried out at 600° C. to 750° C. The annealing temperature exceeding 750° C. may result in an excessive diffusion velocity of In into the GaAs layer, and this is highly causative of an excessive In concentration in the electrode contact layer. This also results in saturation of the In concentration and makes it difficult to obtain the In concentration profile graded in the thickness-wise direction of the electrode contact layer. All of these are causative of degraded lattice matching between the electrode contact layer and the bonding-side semiconductor layer. The excessive In diffusion into the GaAs layer also drains In in the ITO electrode layer in the vicinity of the contact portion with the electrode contact layer, and inevitably raises electric resistance of the electrode. In addition, too high annealing temperature exceeding 750° C. allows oxygen in ITO to diffuse towards the GaAs layer and oxidize it, and this tends to raise the series resistance of the device. All of these are causative of nonconformities such that the light emitting device is not operable at an appropriate voltage. An extremely high annealing temperature may also impair the conductivity of the ITO electrode layer. On the contrary, the annealing temperature less than 600° C. may result in too small In diffusion velocity into the GaAs layer and considerably lower the production efficiency, because a longer time will be necessary to obtain the electrode contact layer with sufficiently lowered contact resistance.

The annealing time is preferably set within a range from 5 seconds to 120 seconds. The annealing time exceeding 120 seconds tends to make the amount of In diffusion into the GaAs layer excessive in particular for the case where the annealing temperature is set close to the upper limit value (a longer annealing time (typically as long as 300 seconds or around) is, however, allowable if the annealing temperature is set to a relatively lower level). On the other hand, the annealing time shorter than 5 seconds may result in only an insufficient amount of In diffusion into the GaAs layer, and this makes it difficult to obtain the electrode contact layer with sufficiently lowered contact resistance.

It is essential to keep the contact resistance between the electrode contact layer and the bonding-side semiconductor layer (the portion to be brought into contact is either the cushion layer or the second-conductivity-type cladding layer) stably at a small value even after the current supply to the light emitting device is continued for a long duration of time, in other words, that time-dependent increase in the contact resistance is made less likely to occur. One effective method of reducing the contact resistance is to add a dopant of the same conductivity type with that of the bonding-side semiconductor layer to the electrode contact layer. In this case, the larger the amount of addition of the dopant to the electrode contact layer increases, the lower the contact resistance becomes. Under a relatively large tendency of the dopant diffusion from the electrode contact layer to the bonding-side semiconductor layer, an excessively larger amount of addition of the dopant in the electrode contact layer over the bonding-side semiconductor layer may result in electrical acceleration of the dopant diffusion from the electrode contact layer to the bonding-side semiconductor layer during emission current supply, and this may gradually deplete the amount of dopant in the electrode contact layer. This undesirably increases the contact resistance of the electrode contact layer with the elapse of time of the current supply, and results in degradation of the device lifetime.

To suppress this nonconformity, it is preferable to set the dopant concentration of the electrode contact layer larger than that of the bonding-side semiconductor layer, and at the same time, to use a semiconductor for composing the electrode contact layer, which has a band energy smaller than that of the bonding-side semiconductor layer in contact therewith. By setting the band gap energy on the electrode contact layer side smaller than that of the bonding-side semiconductor layer, the diffusion of the dopant atom to the bonding-side semiconductor layer becomes less likely to occur even if the dopant concentration of the electrode contact layer is raised to a certain degree, and the time-dependent increase in the contact resistance of the electrode contact layer is effectively prevented from increasing.

When the oxide transparent electrode layer is configured as an ITO electrode layer, the electrode contact layer preferably has a composition of $In_xGa_{1-x}As$ ($0<x\leq1$) at least at the junction interface with the ITO electrode layer. In this case, the electrode contact layer may have a composition of $In_xGa_{1-x}As$ ($0\leq x\leq1$) on the junction side with the bonding-side semiconductor layer, and the bonding-side semiconductor layer may typically be composed of $Al_yGa_{1-y}As$ ($0\leq y\leq1$), which is a semiconductor having a still larger band gap energy. It is also allowable to compose the bonding-side semiconductor layer using other layers having the alloy composition thereof adjusted so as to attain a larger band gap energy than that of the electrode contact layer, where examples of which include GaInP layer, AlGaInP layer, GaP layer, GaAsP layer and AlGaAsP layer.

It is still also allowable to lower the dopant concentration per se of the electrode contact layer to thereby suppress the diffusion towards the bonding-side semiconductor layer. In this case, the dopant concentration of the electrode contact layer is preferably equivalent to, or smaller than that of the bonding-side semiconductor layer. It is also necessary for the electrode contact layer to show a sufficiently small contact resistance with the oxide transparent electrode layer even under a low-doped condition, and to show a small contact resistance also with the bonding-side semiconductor layer. More specifically, it is preferable to use a material which does not form an extremely high hetero junction barrier at the interface with the bonding-side semiconductor layer. For the case where the electrode contact layer is composed of GaAs containing In which has diffused from the ITO layer side, a preferable combination is such as using $In_yGa_{1-y}As$ ($0 \leq y \leq 0.2$, for example) having a relatively small InAs alloy composition y for composing the bonding-side semiconductor layer.

It is also allowable that a portion of the bonding-side semiconductor layer including the interface with the electrode contact layer is configured as an intermediate layer having a band gap energy smaller than that of the bonding-side semiconductor layer portion in contact with the portion from the side opposite to the electrode contact layer, but larger than that of the electrode contact layer. When there is a large band-end discontinuity value between the bonding-side semiconductor layer and the electrode contact layer, the resultant hetero barrier height ΔE increases due to bend in the band structure caused by the bonding, as shown in FIG. 17, and this results in increase in the contact resistance. Interposition of the aforementioned intermediated layer, as shown in FIG. 18, is now successful in reducing the band-end discontinuity values both between the electrode contact layer and the intermediate layer, and between the intermediate layer and the bonding-side semiconductor layer in contact therewith, and in lowering the barrier heights ΔE formed respectively therebetween. This successfully reduces the series resistance, and achieves a large emission intensity even under a low drive voltage. It is to be defined in the context of this patent specification that the electrode contact layer does not belong to the bonding-side semiconductor layer, but the intermediate layer belongs thereto.

For the case where the bonding-side semiconductor layer is configured as the second-conductivity-type cladding layer composed of AlGaInP to as far as the region in contact with the intermediate layer, the intermediate layer having a band gap energy intermediate between those of the electrode contact layer and the second-conductivity-type cladding layer can preferably be configured so as to include at least any one of AlGaAs layer, GaInP layer and AlGaInP layer (composition of which being adjusted so as to be smaller than that of the cladding layer), and can typically be configured so as to include AlGaAs layer. On the other hand, for the case where the cushion layer having the same composition with that of the intermediate layer is disposed, it is practical enough to adopt a configuration in which the intermediate layer is not specially used, and instead functions of the intermediate layer are committed to the cushion layer.

The electrode contact layer formed so as to cover the entire portion of the contact surface on the device side of the oxide transparent electrode layer lowers contact resistance of the oxide transparent electrode layer also in the region right under the boding pad for wire bonding, but this makes the drive current or light emission more likely to concentrate within that region, so that a large portion of the emitted light is intercepted by the bonding pad, and thereby the light extraction efficiency is degraded. It is therefore preferable that the electrode contact layer is formed with an ratio of formation area smaller in the primary region which locates right under the bonding pad, than in the secondary region surrounding the primary region. It is to be noted that the ratio of formation area of the electrode contact layer in the individual regions is a ratio obtained by dividing a total area of the electrode contact layer in the region with the total area of the region. In this configuration, contact resistance of the oxide transparent electrode layer in the primary region increases. This allows a larger portion of the drive current of the light emitting device to bypass the primary region to reach the secondary region, and thus raises the light extraction efficiency to a large degree. It is preferable in view of improving the light extraction efficiency that the primary region, capable of yielding only a less amount of light extraction, is not supplied as possible with the emission drive current. It is therefore preferable that the primary region has possibly no electrode contact layer formed therein.

In the conventional light emitting device having a thick current-spreading layer formed therein in order to raise the current spreading effect, there has been adopted a blocking layer having a conductivity type opposite to that of the current-spreading layer formed so as to be buried in the current-spreading layer, in order to bypass the current outside the region right under the bonding pad, but this was disadvantageous in that the device configuration becomes more complicated, and the number of process steps for the fabrication increases. In contrast to this, the aforementioned configuration, in which formation of the electrode contact layer is suppressed in the primary region right under the bonding pad, is successful in readily obtaining an effect of bypassing the current towards the outward region, that is the secondary region. Another advantage resides in that the underlying layer formed under the oxide transparent layer is the cushion layer having only a small sheet resistance, so that this is successful in suppressing a nonconformity such that the bypassed current once came into the secondary region flows within the cushion layer back to the primary region side.

In the first aspect of the light emitting device of the second invention, the following configuration can be adopted when the oxide transparent electrode layer is an ITO layer. That is, the bonding-side semiconductor layer comprises a first layer including at least an interface with the electrode contact layer and a second layer located between the first layer and the active layer. A portion of the second layer including at least the interface with the first layer is configured as a phosphorus-containing compound semiconductor layer containing phosphorus; and the first layer is configured as a phosphorus-blocking layer having a band gap energy larger than that of the electrode contact layer, and a phosphorus content lower than that of the phosphorus-containing compound semiconductor layer.

A second aspect of the light emitting device of the second invention is such as comprising:

a light emitting layer portion composed of a compound semiconductor, and has a double heterostructure in which a first-conductivity-type cladding layer, an active layer and a second-conductivity-type cladding layer are stacked in this order; and an ITO electrode layer covering the main surface of the second-conductivity-type cladding layer, and being provided for applying therethrough emission drive voltage to the light emitting layer portion;

further comprising:

a bonding pad composed of a metal and is disposed on the ITO electrode layer, and having an electrode wire for current supply bonded thereto;

an electrode contact layer composed of a compound semiconductor, provided for reducing junction resistance of the ITO electrode layer, and disposed so as to contact with the ITO electrode layer;

wherein a bonding-side semiconductor layer, which is defined as a compound semiconductor layer including the second-conductivity-type cladding layer disposed between the active layer and the electrode contact layer, has a thickness of 0.6 μm or above and less than 10 μm; comprises a first layer including at least an interface with the electrode contact layer and a second layer located between the first layer and the active layer; a portion of the second layer including at least the interface with the first layer being configured as a phosphorus-containing compound semiconductor layer containing phosphorus; and the first layer being configured as a phosphorus-blocking layer having a band gap energy larger than that of the electrode contact layer, and a phosphorus content lower than that of the phosphorus-containing compound semiconductor layer.

Our investigations revealed that the adhesion strength between the obtained ITO electrode layer and the bonding-side semiconductor layer tends to degrade when the oxide transparent electrode layer is configured as the ITO electrode layer, and when a portion of the bonding-side semiconductor layer, disposed under the ITO electrode layer, in contact with the electrode contact layer is composed of a phosphorus-containing compound semiconductor, in particular of a Group III–V compound semiconductor having phosphorus as a major component of the Group III element.

Because the electrode contact layer is designed so as to have a band gap energy smaller than the energy corresponded to the emission wavelength as described in the above, it is formed to a thickness of as small as 3 to 30 nm or around so as to avoid absorption of the light from the light emitting layer portion. It is anticipated herein, for the case where a portion of the bonding-side semiconductor layer in contact with the electrode contact layer is composed of a phosphorus-containing compound semiconductor such as GaP, that the phosphorus component may diffuse from the phosphorus-containing compound semiconductor through the thin electrode contact layer to reach the ITO layer side while being affected by heat history during the growth of the ITO layer or annealing after the ITO electrode layer is formed (that is, annealing for diffusing In from the ITO layer to the GaAs layer so as to form an In-containing GaAs electrode contact layer), and this may be causative of degraded adhesion strength of the ITO layer.

Therefore in the aforementioned configuration, the bonding-side semiconductor layer is configured so as to have the first layer including at least an interface with the electrode contact layer, and a second layer located between the first layer and the active layer; and so that a portion of the second layer including at least the interface with the first layer being configured as a phosphorus-containing compound semiconductor layer containing phosphorus; and so that the first layer is configured as a phosphorus-blocking layer having a band gap energy larger than that of the electrode contact layer, and a phosphorus content lower than that of the phosphorus-containing compound semiconductor layer. The phosphorus-blocking layer having a band gap energy larger than that of the electrode contact layer shows a smaller absorption of light flux from the light emitting layer portion than the electrode contact layer shows. Its phosphorus content adjusted lower than that of the phosphorus-containing compound semiconductor layer located opposite to the electrode contact layer makes phosphorus diffusion towards the ITO electrode layer side less likely to occur. Therefore by interposing the phosphorus-blocking layer, the phosphorus component derived from the phosphorus-containing compound semiconductor layer can reach the ITO electrode layer only after passing through both of the phosphorus-blocking layer and the electrode contact layer. This is most successful in suppressing the phosphorus diffusion towards the ITO electrode layer to a large extent, and in raising the adhesion strength of the ITO electrode layer, thereby the solve the second aspect of the subject of the second invention. Because the total thickness of the bonding-side semiconductor layer is adjusted to 0.6 $\mu$m or more and less than 10 $\mu$m, influences of the damaged region, even it should accidentally occur during the electrode wire bonding on the bonding pad, are less likely to extends towards the active layer.

In view of raising the suppressive effect over the phosphorus diffusion towards the ITO electrode layer, the phosphorus-blocking layer is more preferably composed of a phosphorus-free compound semiconductor. More specifically, the phosphorus-blocking layer is preferably composed of AlGaAs. It is preferable herein that the band gap energy of the phosphorus-blocking layer composed of AlGaAs is larger by at least 0.1 eV or more. In addition, the AlAs alloy composition b of the phosphorus-blocking layer composed of AlGaAs is preferably adjusted to 0.85 or below.

It is also preferable to adjust the total thickness of the phosphorus-blocking layer and the electrode contact layer to as thick as 20 nm or above.

The phosphorus-blocking layer can be formed in a variety of forms depending on the configuration of the bonding-side semiconductor layer. For example, the bonding-side semiconductor layer can be configured so as to have the second-conductivity-type cladding layer; an auxiliary compound semiconductor layer configured as the phosphorus-containing compound semiconductor layer using a compound semiconductor having a composition different from that of the second-conductivity-type cladding layer, and disposed so as to contact with the oxide transparent electrode layer side of the second-conductivity-type cladding layer; and the phosphorus-blocking layer disposed between the auxiliary compound semiconductor layer and the electrode contact layer. The disposition of the auxiliary compound semiconductor layer makes the influence of the electrode wire bonding less likely to be exerted on the active layer. Despite the auxiliary compound semiconductor layer is configured as the phosphorus-containing compound semiconductor layer, phosphorus diffusion towards the ITO electrode layer can considerably be suppressed by the disposition of the phosphorus-blocking layer, and this successfully raises the adhesion strength of the ITO electrode layer. In this case, the light extraction efficiency can be improved by composing the auxiliary compound semiconductor layer with GaP, a highly transparent material with respect to the visible light.

In this case, a portion of the bonding-side semiconductor layer including the interface with the electrode contact layer is configured as an intermediate layer having a band gap energy smaller than that of the bonding-side semiconductor layer portion in contact with the portion from the side opposite to the electrode contact layer, but larger than that of the electrode contact layer. As has already been described in the above referring to FIGS. 17 and 18, the series resistance of the device can be reduced by interposing the intermediate layer. If the intermediate layer is configured so as to also function as the phosphorus-blocking layer, the effect of suppressing the phosphorus diffusion from the bonding-side semiconductor layer which composes the phosphorus-containing compound semiconductor layer towards the ITO electrode layer can be achieved at the same time. Of the materials already listed in the above for composing the intermediate layer, AlGaAs is also preferable for use in the phosphorus-blocking layer, when the light emitting layer portion is composed of AlGaInP.

It is also allowable to configure the bonding-side semiconductor layer so as to have the second-conductivity-type cladding layer; and an auxiliary compound semiconductor layer configured as the phosphorus-blocking layer using a compound semiconductor having a composition different from that of the second-conductivity-type cladding layer, and disposed so as to contact with the oxide transparent electrode layer side of the second-conductivity-type cladding layer. In this case, the electrode contact layer is disposed in contact with the auxiliary compound semiconductor layer. Also in this case, the disposition of the auxiliary compound semiconductor layer makes the influence of the electrode wire bonding less likely to be exerted on the active layer. This configuration is also successful in achieving the suppressive effect over the phosphorus diffusion towards the ITO electrode layer by configuring the auxiliary compound semiconductor layer per se as the phosphorus-blocking layer. The auxiliary compound semiconductor layer can specifically be composed of AlGaAs.

The above-described auxiliary compound semiconductor layer can be configured as the cushion layer composed of a compound semiconductor having a dopant concentration lower than that of the second-conductivity-type cladding layer. This successfully suppresses undesirable flow of the dopant atom towards the second-conductivity-type cladding layer, and at the same time improves the device lifetime. It is also allowable to configure the auxiliary compound semiconductor layer as a compound semiconductor layer having a dopant concentration higher than that of the second-conductivity-type cladding layer, which is exemplified by the current-spreading layer (where it applies only to the second aspect of the second invention). In this case, the suppressive effect over the phosphorus diffusion towards the ITO electrode layer can be achieved without problems, while the improving effect of the device lifetime remains not expectable.

It is still also allowable to configure the boding-side semiconductor layer so as to include the second-conductivity-type cladding layer having a thickness of 0.6 μm or above and less than 10 μm, as described in the above. When the second-conductivity-type cladding layer is configured as the phosphorus-containing compound semiconductor layer, the phosphorus-blocking layer can be disposed so as to contact therewith. The second-conductivity-type cladding layer formed with such sufficient thickness is successful in making the influences of the damaged region possibly caused during the electrode wire bonding less affective to the active layer. The suppressive effect over the phosphorus diffusion towards the ITO electrode layer is also achieved at the same time by interposing the phosphorus-blocking layer between the second-conductivity-type cladding layer and the electrode contact layer.

Also in this case, the series resistance of the device can be reduced if the phosphorus-blocking layer is configured as the intermediate layer having a band gap energy smaller than that of the second-conductivity-type cladding layer, but larger than that of the electrode contact layer. One specific example refers to a configuration in which the second-conductivity cladding layer is composed of AlGaInP, and the intermediate layer of AlGaAs.

(Third Invention)

To solve the aforementioned subject, the light emitting device of the third invention is such as comprising:

a light emitting layer portion composed of compound semiconductor layers, and an oxide transparent electrode layer for supplying emission drive voltage to the light emitting layer portion, and is configured so as to extract the light from the light emitting layer portion through the oxide transparent electrode layer, and further comprises:

an electrode contact layer for reducing junction resistance of the oxide transparent electrode layer disposed between the light emitting layer portion and the oxide transparent electrode layer so as to contact with the oxide transparent electrode layer, allowing a formation region and a non-formation region of the electrode contact layer to be interlaced at the junction interface with the oxide transparent electrode layer; and an Al-containing interposed layer containing Al disposed between the electrode contact layer and the light emitting layer portion so as to extend over the formation region and the non-formation region of the electrode contact layer, the Al-containing interposed layer comprising an Al-containing compound semiconductor layer in contact with the electrode contact layer in the formation region of the electrode contact layer, and an Al-base insulating layer formed selectively in the non-formation region of the electrode contact layer, and composing at least the outermost portion on the oxide transparent electrode layer side.

As has been described in the above, the oxide transparent electrode layer such as the ITO layer cannot always be successful in forming a desirable ohmic contact when brought into direct contact with the semiconductor layer on the device side, and may cause degradation in the emission efficiency due to increase in the series resistance ascribable to the contact resistance. In contrast to this, the light emitting device of the third invention is successful in reducing the contact resistance of the oxide transparent electrode layer by disposing the electrode contact layer for reducing the contact resistance of the oxide transparent electrode layer on the device side of the oxide transparent electrode layer. In addition, since the formation region and non-formation region of the electrode contact layer are interlaced at the junction interface with the oxide transparent electrode layer, the light generated in the region right under the formation region of the electrode-boding layer can leak through the adjacent non-formation region even if the electrode contact layer is characterized by its large tendency of absorption of the light from the light emitting layer portion, and thereby the light absorption by the electrode contact layer can be suppressed. The electrode contact layer thus formed is advantageous in raising the light extraction efficiency of the device as a whole.

In the third invention, the Al-containing interposed layer containing Al is disposed between the electrode contact layer and the light emitting layer portion so as to extend over the formation region and the non-formation region of the electrode contact layer, and in the non-formation region of the electrode contact layer, the Al-base insulating layer is selectively formed on the outermost portion on the oxide transparent electrode layer side of the Al-containing interposed layer. In the non-formation region of the electrode contact layer in this configuration, current leakage through the oxide transparent electrode layer can be blocked by the Al-base insulating layer, and instead the emission drive current can be concentrated within the formation region of the electrode contact layer. This makes it possible to effectively distribute the current to desired in-plane region of the light emitting layer portion depending on the formation pattern of the electrode contact layer, and contributes to enhancement of the emission efficiency and light extraction efficiency. The Al-base insulating layer is also advantageous in that it can readily be formed by surface oxidation of the Al-containing interposed layer. In particular for the case where the electrode contact layer stacked on the Al-containing interposed layer is patterned by selective chemical etching without etching the underlying Al-containing interposed layer, at least the surficial portion of the exposed Al-containing interposed layer can be oxidized under contact with the etching solution. This process is efficient since the Al-insulating layer can concomitantly be formed in the patterning process of the electrode contact layer.

In the Al-containing interposed layer, the Al-containing semiconductor layer in contact with the electrode contact layer in the formation region of the electrode contact layer may be formed so as to extend over the non-formation region of the electrode contact layer. In this case, in the non-formation region of the electrode contact layer, only the outermost surficial portion of the Al-containing interposed layer is configured as the Al-base insulating layer, and the residual portion as the Al-containing compound semiconductor layer. This configuration is obtained when only the surficial portion of the Al-containing compound semiconductor layer is oxidized in the non-formation region of the electrode contact layer. On the other hand, it is also allowable that the entire portion of the Al-containing interposed layer is configured as the Al-base insulating layer in the non-formation region of the electrode contact layer. This configuration is obtained when the entire portion of the Al-containing compound semiconductor layer is oxidized in the non-formation region of the electrode contact layer, and is particularly obtainable when the Al-containing compound semiconductor layer is thin.

The electrode contact layer may be composed of a compound semiconductor or a metal, where the compound semiconductor is more preferable in view of suppressing the light absorption. It is however also allowable to use the metal so far as it is extremely thin. In a configuration in which the electrode contact layer does not cover the entire surface of the light extraction region as described later, the light extraction is also permissible through the non-formation region of the electrode contact layer. In this case, it is also allowable to use a metal having a large light intercepting property to compose the electrode contact layer. The electrode contact layer composed of a metal is advantageous in view of reducing the series resistance of the light emitting device by virtue of its large conductivity.

The light emitting layer portion can be composed of AlGaInP, and be configured as having a double heterostructure in which the first-conductivity cladding layer, the active layer, and the second-conductivity cladding layer are stacked in this order. This realizes a light emitting device having a large emission luminance.

The junction interface with the oxide transparent electrode layer comprises the primary region which falls right under the bonding pad and the residual secondary region, where the primary region may have a larger ratio of area of the non-formation region of the electrode contact layer than the secondary region may have. Because the ratio of area of the non-formation region of the electrode contact layer is set larger in the area right under the bonding pad (primary region) capable of yielding only a less amount of light extraction than in the residual region (secondary region) capable of yielding a larger amount of light extraction, and because the Al-base insulating layer is formed in the non-formation region, the contact resistance of the oxide transparent electrode layer becomes considerably higher in the primary region than in the secondary region. This allows a larger portion of the drive current of the light emitting device to bypass the primary region and to reach the secondary region, and this distinctively raises the light emission efficiency.

It is more preferable in view of raising the light extraction efficiency that only a minimum as possible amount of the emission drive current flows in the primary region. It is therefore preferable that the primary region has possibly no electrode contact layer formed therein, and more specifically, it is preferable that the entire portion of the primary region is configured as the non-formation region of the electrode contact layer, and that the Al-base insulting layer is formed over the entire portion of such non-formation region. To raise the light extraction efficiency while suppressing the light absorption by the electrode contact layer, it is preferable to interlace the formation region and the non-formation region of the electrode contact layer at least in the secondary region (i.e., light extraction region) capable of yielding a larger amount of light extraction to the external, out of the junction interface with the oxide transparent electrode layer. Also in this case, it is preferable that the Al-base insulating layer is formed over the entire portion of the non-formation region of the electrode contact layer, in view of uniformly distributing the emission drive current over the secondary region and of raising the emission efficiency. As described in the above, for the case where the formation region and the non-formation region of the electrode-bonding layer are interlaced in the secondary region which serves as the light extraction region, the electrode contact layer may be formed in the secondary region using either of compound semiconductor and metal.

The oxide transparent electrode layer can be composed of the materials similar to those described in the first and second inventions, and can typically composed of ITO.

When the oxide transparent electrode layer is the ITO electrode layer, it is preferable to compose the electrode contact layer using a phosphorous-free compound semiconductor, to dispose the phosphorus-containing compound semiconductor layer in contact with the Al-containing interposed layer on the side opposite to that the oxide transparent electrode layer is located, and to configure the Al-containing interposed layer as the phosphorus-blocking layer having a band gap energy larger than that of the electrode contact layer, and having a phosphorus content lower than that of the phosphorus-containing compound semiconductor layer.

Our investigations revealed that the adhesion strength between the obtained ITO electrode layer and the semiconductor layer tends to degrade when the oxide transparent electrode layer is configured as the ITO electrode layer, and the compound semiconductor layer disposed in the vicinity of the ITO electrode layer, out of the semiconductor layers disposed under the ITO electrode layer, is composed of a phosphorus-containing compound semiconductor, in particular of a Group III–V compound semiconductor having phosphorus as a major component of the Group III element.

For the case where the electrode contact layer is composed of a phosphorus-free compound semiconductor, the electrode contact layer necessarily has a band gap energy smaller than the energy corresponded to the emission wavelength, and is consequently formed with a thickness of as small as 3 to 30 nm or around so as to avoid absorption of the light from the light emitting layer portion. It is anticipated herein, for the case where a portion of the semiconductor layer in contact with the electrode contact layer is composed of a phosphorus-containing compound semiconductor such as GaP, that the phosphorus component may diffuse from the phosphorus-containing compound semiconductor through the thin electrode contact layer to reach the ITO layer side while being affected by heat history during the growth of the ITO electrode layer or annealing thereafter carried out as the occasion demands.

Configuring now the Al-containing interposed layer formed between the electrode contact layer and the light emitting layer portion as the aforementioned phosphorus-blocking layer is successful in achieving the following effects. The phosphorus-blocking layer having a band gap energy larger than that of the electrode contact layer shows a smaller absorption of light flux from the light emitting layer portion than the electrode contact layer shows. Its phosphorus content adjusted lower than that of the phosphorus-containing compound semiconductor layer located opposite to the electrode contact layer makes phosphorus diffusion towards the ITO electrode layer side less likely to occur. Therefore by interposing the phosphorus-blocking layer, the phosphorus component derived from the phosphorus-containing compound semiconductor layer can reach the ITO electrode layer only after passing through both of the phosphorus-blocking layer and the electrode contact layer. This is most successful in suppressing the phosphorus diffusion towards the ITO electrode layer to a large extent, and in raising the adhesion strength of the ITO electrode layer.

The phosphorus-blocking layer is preferably composed of a phosphorus-free compound semiconductor, similarly to the first and second inventions, in view of enhancing the suppressive effect over the phosphorus diffusion towards the ITO electrode layer. The phosphorus-blocking layer is more specifically composed of AlGaAs. It is preferable herein that the band gap energy of the phosphorus-blocking layer composed of AlGaAs is larger by at least 0.1 eV or more. In addition, the AlAs alloy composition b of the phosphorus-blocking layer composed of AlGaAs is preferably adjusted to 0.85 or below.

The electrode contact layer is preferably configured as a layer composed of a compound semiconductor containing no Al, and having a relatively small band gap energy (e.g., less than 1.42 eV). Use of this sort of electrode contact layer is successful in obtaining a desirable ohmic contact, and is less causative of increase in the resistivity due to oxidation of the Al component.

The electrode contact layer can absorb the light from the light emitting layer portion when it is designed to have a band gap energy smaller than the energy corresponded to the emission wavelength, so that it is preferable, in view of raising the light extraction efficiency, to adjust the thickness thereof to as small as possible, typically to as small as 3 to 30 nm or around. The thickness exceeding 30 nm may undesirably result in increased effect of the light absorption, and the thickness less than 3 nm may make it difficult to keep a bulk crystal structure and to obtain a sufficient effect of reducing the contact resistance. To ensure a distinct suppressive effect over the phosphorus diffusion towards the ITO layer, it is preferable to adjust the total thickness of the phosphorus-blocking layer (Al-base interposed layer) and the electrode contact layer to 20 nm or above. The total thickness of less than 20 nm undesirably reduces the suppressive effect over the phosphorus diffusion.

When the oxide transparent electrode layer is configured as the ITO electrode layer, the electrode contact layer can be configured as an InGaAs layer or GaAs layer. The electrode contact layer is particularly successful in enhancing the effect of reducing the contact resistance when it has a composition of $In_xGa_{1-x}As$ ($0<x\leq 1$) (at least) at the junction interface with the ITO layer. For the case where the light emitting layer is composed of $(Al_xGa_{1-x})_yIn_{1-y}P$ (where, $0\leq x\leq 1$ and $0\leq y\leq 1$), a possible process is such as forming the GaAs layer so as to contact with the ITO layer, and then annealing the layers so as to allow In to diffuse from the ITO layer towards the GaAs layer, to thereby form the electrode contact layer composed of In-containing GaAs.

For the case where the electrode wire for current supply is bonded to the bonding pad in the configuration in which the light emitting layer portion is composed of a double-heterostructured compound semiconductor having the first-conductivity-type cladding layer, the active layer and the second-conductivity-type cladding layer stacked in this order, where it is defined that a compound semiconductor layer including the second-conductivity-type cladding layer disposed between the active layer and the electrode contact layer as a bonding-side compound semiconductor layer, it is preferable to adjust the thickness of the bonding-side compound semiconductor layer to 0.6 µm or above and less than 10 µm. In an exemplary case where the wire bonding is carried out by ultrasonic bonding, or thermosonic bonding further combined with heat, impact stress of ultrasonic wave or heat (or pressure) is concentrated into the compound semiconductor layer right under the bonding pad, and introduces therein crystal defects such as dislocation to thereby form the damaged region. The damaged region undesirably extends to reach the light emitting layer portion can result in the following nonconformities, which are specifically represented by:

(1) direct lowering of the emission luminance, which is supposed to be mainly ascribable to an increased contribution of the non-radiative transition processes caused by the crystal defect; and (2) shortened lifetime of the device. If the light emitting layer portion having dislocation formed therein is kept under a consecutive current supply, the current concentrates to the dislocation and tends to proliferate it, and this results in a time-dependent degradation of the emission luminance.

However by securing the thickness of the bonding-side compound semiconductor layer as described above, influences of the damaged region, even it should accidentally occur during the electrode wire bonding to the bonding pad, can extend only to as far as the bonding-side semiconductor layer, and become less influential to a light emitting layer portion. It is to be noted that the upper limit of the thickness is set to 10 µm, because the bonding-side semiconductor layer formed with an excessively large thickness results in only a degraded production efficiency of the light emitting device.

The bonding-side semiconductor layer as described above can be configured as having a first layer including at least an interface with the electrode contact layer and a second layer located between the first layer and the active layer; and a portion of the second layer including at least the interface with the first layer is configured as a phosphorus-containing compound semiconductor layer containing phosphorus; and the first layer is configured as a phosphorus-blocking layer. This is successful in suppressing the phosphorus diffusion from the phosphorus-containing compound semiconductor layer towards the ITO electrode layer to a large extent, and in raising the adhesion strength of the ITO electrode layer to the bonding-side semiconductor layer.

The phosphorus-blocking layer may be formed into various patterns depending on configuration of the bonding-side semiconductor layer. In one exemplary case, the bonding-side semiconductor layer may be configured such as having the second-conductivity-type cladding layer; an cushion layer configured as the phosphorus-containing compound semiconductor layer using a compound semiconductor having a composition different from that of the second-conductivity-type cladding layer, and disposed so as to contact with the oxide transparent electrode layer side of the second-conductivity-type cladding layer; and the phosphorus-blocking layer disposed between the cushion layer and the electrode contact layer. By the interposition of the cushion layer, the influence of the damaged region ascribable to the electrode wire bonding becomes less likely to adversely affect the active layer. Another advantage comes from that the phosphorus diffusion towards the ITO electrode layer can be suppressed to a considerable degree by the interposition of the phosphorus-blocking layer, despite the above-described cushion layer is configured as the phosphorus-containing compound semiconductor layer, and this contributes to an improved adhesion strength of the ITO electrode layer. The cushion layer in this case can successfully improve the light extraction efficiency if it is composed of GaP characterized by its excellent transparency with respect to the visible light.

In this case, it is allowable that a portion of the bonding-side semiconductor layer including the interface with the electrode contact layer is configured as an intermediate layer having a band gap energy smaller than that of the bonding-side semiconductor layer portion in contact with the portion from the side opposite to the electrode contact layer, but larger than that of the electrode contact layer. When there is a large band-end discontinuity value between the bonding-side semiconductor layer and the electrode contact layer, the resultant hetero barrier height ΔE increases due to bend in the band structure caused by the bonding, as shown in FIG. 17, and this results in increase in the contact resistance. Interposition of the aforementioned intermediated layer, as shown in FIG. 18, is now successful in reducing the band-end discontinuity values both between the electrode contact layer and the intermediate layer, and between the intermediate layer and the bonding-side semiconductor layer in contact therewith, and in lowering the barrier heights ΔE formed respectively therebetween. This successfully reduces the series resistance, and achieves a large emission intensity even under a low drive voltage. It is to be defined in the context of this patent specification that the electrode contact layer does not belong to the bonding-side semiconductor layer, but the intermediate layer belongs thereto.

The intermediate layer configured while being expected to function also as the phosphorus-blocking layer is successful, at the same time, in achieving the suppressive effect over the phosphorus diffusion from the bonding-side semiconductor layer portion configured as the phosphorus-containing compound semiconductor layer towards the ITO electrode layer. Of the materials for composing the intermediate layer already listed in the above, AlGaAs is preferable as being expected for its phosphorus-blocking function, in particular for the case where the light emitting layer portion is composed of AlGaInP.

The bonding-side semiconductor layer may also be configured such as having the second-conductivity-type cladding layer; and the cushion layer configured as the phosphorus-blocking layer using a compound semiconductor having a composition different from that of the second-conductivity-type cladding layer, and disposed so as to contact with the oxide transparent electrode layer side of the second-conductivity-type cladding layer. In this case, the electrode contact layer is disposed so as to contact with the cushion layer. Also in this configuration, the influence of the damaged region ascribable to the electrode wire bonding becomes less likely to adversely affect the active layer, by virtue of the disposition of the cushion layer. Another advantage comes from that the phosphorus diffusion towards the ITO electrode layer can be suppressed at the same time by configuring the cushion layer per se as the phosphorus-blocking layer. Such blocking layer can specifically be formed using AlGaAs.

The cushion layer is preferably composed of a compound semiconductor having a dopant concentration smaller than that of the second-conductivity-type cladding layer. The cushion layer, having a dopant concentration lower than that of the second-conductivity-type cladding layer adjacent thereto, can successfully suppress undesirable flow of the dopant atom from the cushion layer to the second-conductivity-type cladding layer, and contributes to a large improvement in the device lifetime. It is also advantageous in that back diffusion of the dopant towards the second-conductivity-type cladding layer during the layer growth is less likely to occur.

The cushion layer is more preferably composed of a material causative of only a minimum absorption of light from the light emitting layer portion. As the compound semiconductor for composing the cushion layer, it is therefore effective to use a material having a band gap energy larger than that of the active layer in the light emitting layer portion. For the case where the light emitting layer portion is composed of AlGaInP, specific examples of the materials for composing the cushion layer include AlGaAs, GaP, GaAsP and AlGaAsP. The cushion layer formed to as thin as described in the above is also advantageous in view of suppression of the light absorption. The thickness of the cushion layer is preferably adjusted to 0.1 μm to 5 μm. The thickness of less than 0.1 μm tends to result in only an insufficient total thickness of the bonding-side semiconductor layer, so that the influence of the electrode wire bonding becomes more likely to exert on the light emitting layer portion. Whereas the thickness exceeding 5 μm will undesirably increase the resistivity in the thickness-wise direction due to its low dopant concentration, and will result in lowered emission efficiency due to increased series resistance of the device. The thick cushion layer is also disadvantageous in that the growth thereof needs a longer time and a larger consumption of the source materials, and this tends to lower the production efficiency and to increase the cost. The thickness of the cushion layer is more preferably adjusted to 0.5 μm to 3 μm.

It is also allowable to configure the cushion layer as a compound semiconductor layer having a dopant concentration higher than that of the second-conductivity-type cladding layer, which is exemplified by the current-spreading layer (where it applies only to the second aspect of the third invention). In this case, the suppressive effect over the phosphorus diffusion towards the ITO electrode layer can be achieved without problems, while the improving effect of the device lifetime remains not expectable.

The bonding-side semiconductor layer may also be configured as having the second-conductivity-type cladding layer having a thickness of 0.6 μm or more and less than 10 μm. For the case where the second-conductivity-type cladding layer is configured as the phosphorus-containing compound semiconductor layer, the phosphorus-blocking layer is preferably disposed so as to contact with the second-conductivity-type cladding layer. The second-conductivity-type cladding layer formed to a sufficient thickness as described in the above is successful in making the damaged region ascribable to the electrode wire bonding less affective to the active layer. Interposition of the phosphorus-blocking layer between the second-conductivity-type cladding layer and the electrode contact layer is also successful in concomitantly achieving the suppressive effect over the phosphorus diffusion towards the ITO electrode layer.

Also in this case, it is advantageous to configure the phosphorus-blocking layer as the intermediate layer having a band gap energy smaller than that of the second-conductivity-type cladding layer but larger than that of the electrode contact layer. One specific example refers to a configuration in which the second-conductivity cladding layer is composed of AlGaInP, and the intermediate layer of AlGaAs.

For the case where the Al-containing interposed layer is thin as described in the above, the entire portion of the Al-containing interposed layer in the non-formation region of the electrode contact layer may be configured as the Al-base insulating layer (e.g., Al oxide layer). The Al oxide layer can function enough as the phosphorus-blocking layer so far as the thickness thereof is secured as thick as 0.1 $\mu$m or more.

A method of fabricating a light emitting device of the third invention is such as fabricating a light emitting device which comprises a compound semiconductor layer having a light emitting layer portion, and an Al-base insulating layer formed on at least either one of the main surface of the compound semiconductor layer so as to selectively cover a partial region of the main surface, and comprises:

a compound semiconductor layer growing step for growing the compound semiconductor layer in which an Al-containing compound semiconductor layer and an Al-free compound semiconductor layer are grown on the surficial portion of the compound semiconductor layer so as to dispose the Al-free compound semiconductor layer on the outermost side; and a selective etching step in which a partial region of the Al-free compound semiconductor layer is patterned by chemical etching while using the Al-containing compound semiconductor layer as an etching stop layer, and at the same time at least the surficial portion of the Al-containing compound semiconductor layer exposed in the removal portion of the Al-free compound semiconductor layer is allowed to react with an etching solution used for the chemical etching to thereby form the Al-base insulating layer.

In the above-described method, the Al-base insulating layer can be formed by forming the Al-containing compound semiconductor layer and the Al-free compound semiconductor layer so as to be stacked on the surficial portion of the compound semiconductor layer, and by selectively etching the Al-free compound semiconductor layer while using the Al-containing compound semiconductor layer as an etching stop layer, so that at least the outermost surficial portion of the Al-containing interposed layer is oxidized under contact with the etching solution. In other words, the process is efficient because the Al-base insulating layer can be formed at the same time in the patterning step of the Al-containing compound semiconductor layer. In an exemplary case where the Al-containing compound semiconductor layer is composed of AlGaAs and the Al-free compound semiconductor of GaAs, the etching solution is preferably an ammonium/hydrogen peroxide mixed solution in the third invention, because the solution is excellent in the selectivity of GaAs over AlGaAs, and can surely and firmly form the Al-base insulating layer composed of Al oxide.

DESCRIPTION OF THE PREFERRED EMBODIMENTS (First Invention)

Figure 1:
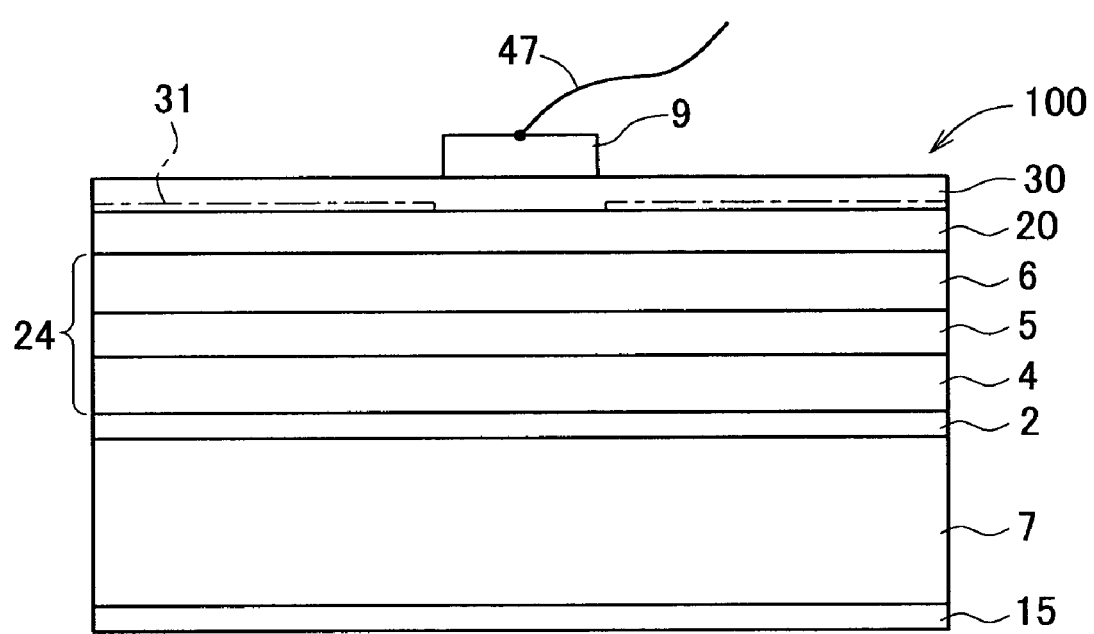
FIG. 1 is a schematic drawing showing a stacked structure of one embodiment of the light emitting device according to this invention.

FIG. 1 is a conceptual drawing of a light emitting device 100 of one embodiment according to the first invention. The light emitting device 100 comprises an n-type GaAs single crystal substrate (also simply referred to as "substrate", hereinafter) 7, a light emitting layer portion 24 composed of AlGaInP and disposed on one main surface of the substrate 7 while placing an n-type GaAs buffer layer 2 in between, and a p-type cushion layer 20 and an oxide transparent electrode layer 30 composed of ITO stacked in this order so as to cover the light emitting layer portion 24. At around the center of the main surface of the oxide transparent electrode layer 30, a bonding pad 9 composed of Au or the like is disposed, and further thereto an electrode wire 47 composed of Au or the like is bonded. On the other main surface of the substrate 7, a back surface electrode layer 15 typically composed of Au—Ge—Ni alloy is formed over the entire surface thereof.

The light emitting layer portion 24 has a double heterostructure which comprises a first-conductivity-type cladding layer 4, a second-conductivity-type cladding layer 6, and an active layer 5 disposed between the first-conductivity-type cladding layer 4 and the second-conductivity-type cladding layer 6, all of these layers being composed of $(Al_xGa_{1-x})_yIn_{1-y}P$ alloy. More specifically, it is configured so that the active layer 5 composed of a non-doped $(Al_xGa_{1-x})_yIn_{1-y}P$ (where, $0 \leq x \leq 0.55$, $0.45 \leq y \leq 0.55$) alloy is sandwiched between the p-type $(Al_xGa_{1-x})_yIn_{1-y}P$ cladding layer 6 and the n-type $(Al_xGa_{1-x})_yIn_{1-y}P$ cladding layer 4. In the light emitting device 100 shown in FIG. 1, the p-type AlGaInP cladding layer 6 (containing Zn as a p-type dopant, where C derived from an organometallic molecule also contributable as the p-type dopant) is disposed on the cushion layer 20 side, and the n-type AlGaInP cladding layer 4 (containing Si as an n-type dopant) is disposed on the back surface electrode layer 15 side. While it is obvious to those in skilled in the art, it is to be noted now that "non-doped" in this context means that "the dopant is not intentionally added", and is not precluded from being inevitably added with the dopant component during normal fabrication processes (where the upper limit set at $10^{13}$ to $10^{16}$/cm$^3$ or around).

The p-type AlGaInP cladding layer 6 has a p-type carrier concentration (majority carrier concentration) of $5 \times 10^{16}$/cm$^3$ or above and less than $1 \times 10^{18}$/cm$^3$, and more preferably $1 \times 10^{17}$/cm$^3$ to $7 \times 10^{17}$/cm$^3$. The cushion layer 20 is composed of an AlGaAs layer doped with Zn as a dopant, and has a p-type carrier concentration of $4 \times 10^{16}$/cm$^3$ to $9 \times 10^{17}$/cm$^3$, and more preferably $1 \times 10^{17}$/cm$^3$ to $6 \times 10^{17}$/cm$^3$, which is set smaller than that of the p-type AlGaInP cladding layer 6. The thickness of the cushion layer 20 is adjusted to 0.1 μm to 5 μm, and more preferably to 0.5 μm to 3 μm. The total thickness of the p-type AlGaInP cladding layer 6 and the cushion layer 20 is adjusted to 0.6 μm or above (e.g., cushion layer: 0.1 μm, cladding layer: 0.5 μm) and less than 10 μm.

The following paragraphs will describe a method of fabricating the light emitting device 100 shown in FIG. 1.

Figure 2A:
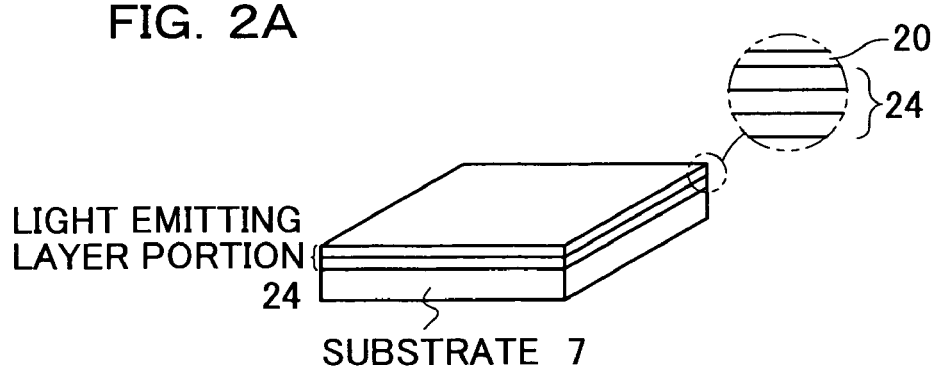
FIG. 2A is an explanatory drawing showing an exemplary fabrication process of the light emitting device shown in FIG. 1.

First on the GaAs single crystal substrate 7, the n-type GaAs buffer layer 2 is formed, thereon the light emitting layer portion 24 which comprises the n-type AlGaInP cladding layer 4, the AlGaInP active layer 5 and the p-type AlGaInP cladding layer 6 (see FIG. 1) is formed, and further thereon the cushion layer 20 composed of AlGaAs is formed in this order by the epitaxial growth process, to thereby obtain the configuration shown in FIG. 2A. The epitaxial growth of the individual layers can be proceeded by the publicly-known metal organic vapor phase epitaxy (MOVPE) process. Source gases available herein as the +individual sources for Al, Ga, In, P and As are listed below.

Al source gases: trimethyl aluminum (TMAI), triethyl aluminum (TEAI), etc.;

Ga source gases: trimethyl gallium (TMGa), triethyl gallium (TEGa), etc.;

In source gases: trimethyl indium (TMIn), triethyl indium (TEIn), etc.;

P source gases: tert-butylphosphine (TBP), triethyl phosphorus (TEP), phosphine (PH$_3$), etc.; and As source gases: tert-butylarsine (TBA), arsine (AsH$_3$), etc.

Dopant gases available herein are listed below. (p-Type Dopant)

Mg source gases: bis-cyclopentadienyl magnesium (Cp$_3$Mg), etc.;

Zn source gases: dimethyl zinc (DMZn), diethyl zinc (DEZn), etc.; and (n-Type Dopant)

Si source gases: silicon hydrides such as monosilane, etc.

The growth of the individual layers can successively be carried out within a single vapor phase apparatus simply by changing the source gases. The dopant concentration of each layer can be adjusted to a desired values by controlling ratio of amount of supply of a dopant gas to the source gases.

Figure 2B:
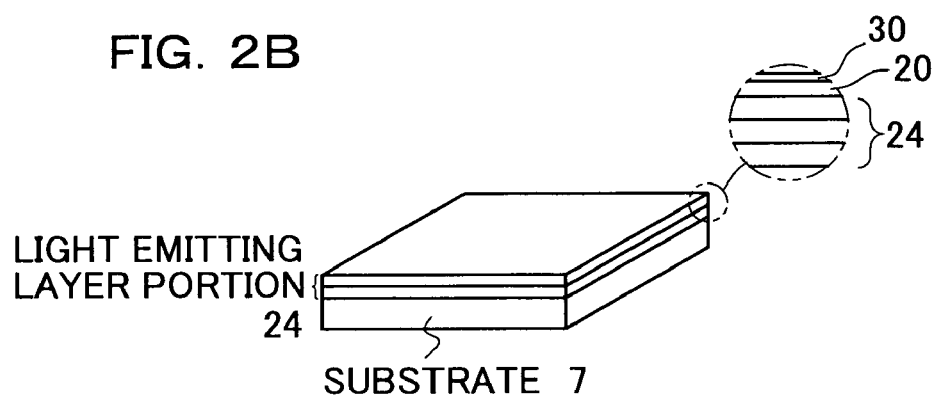
FIG. 2B is an explanatory drawing as continued from FIG. 2A.
Figure 2C:
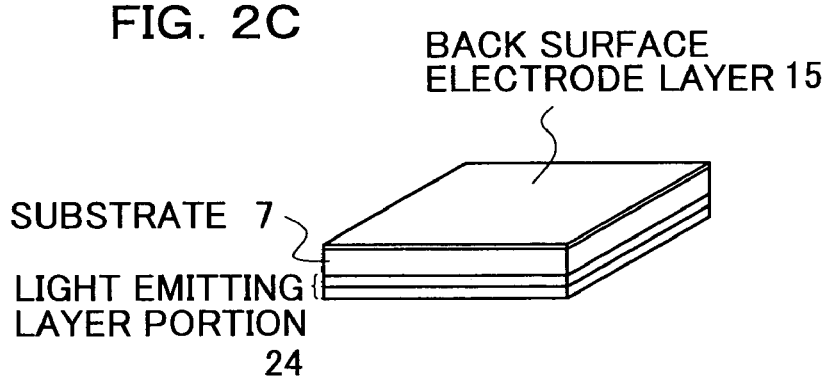
FIG. 2C is an explanatory drawing as continued from FIG. 2B.
Figure 2D:
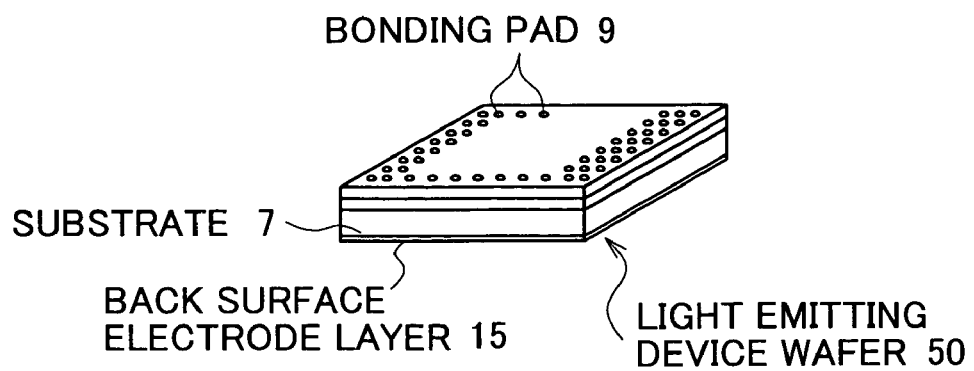
FIG. 2D is an explanatory drawing as continued from FIG. 2C.
Figure 3A:
FIG. 3A is an explanatory drawing as continued from FIG. 2D.
Figure 3B:
FIG. 3B is an explanatory drawing as continued from FIG. 3A.
Figure 3C:
FIG. 3C is an explanatory drawing as continued from FIG. 3B.
Figure 3D:
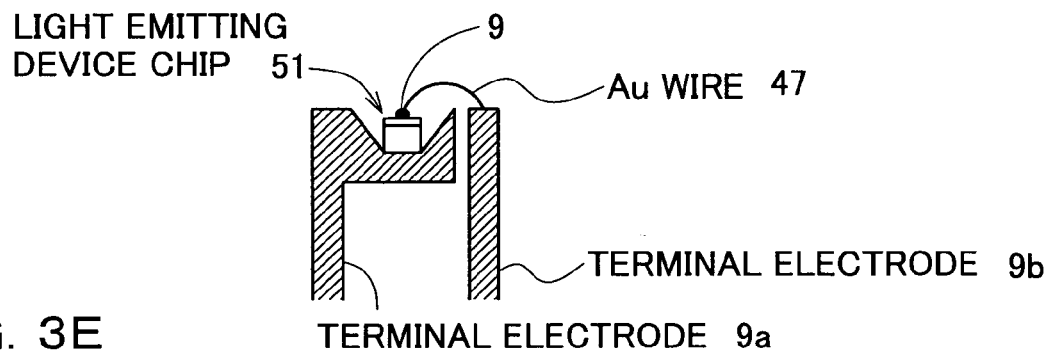
FIG. 3D is an explanatory drawing as continued from FIG. 3C.
Figure 3E:
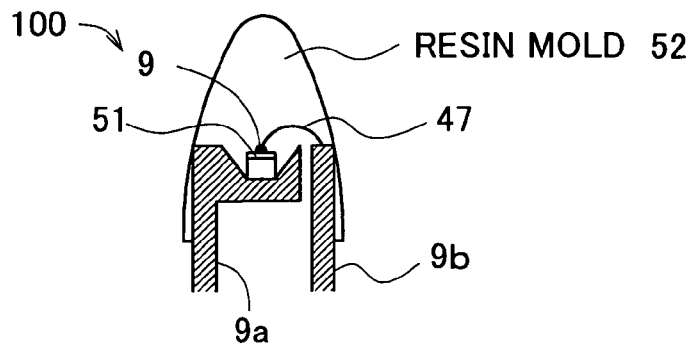
FIG. 3E is an explanatory drawing as continued from FIG. 3D.

Next, as shown in FIG. 2B, the oxide transparent electrode layer 30 is formed so as to cover the cushion layer 20 by the publicly-known RF sputtering process. Then as shown in FIG. 2C, the back surface electrode layer 15 is formed on the second main surface of the substrate 7 by the vacuum evaporation process. Next as shown in FIG. 2D, the bonding pads 9 are disposed on the oxide transparent electrode layer 30 in every region corresponding to each light emitting device chip, and baked at an appropriate temperature in order to fix the electrode, to thereby obtain a light emitting device wafer 50. The light emitting device wafer 50 is then half-diced for the preparation of separation of the individual light emitting device chip regions as shown in FIG. 3A, further etched to form a mesa profile as shown in FIG. 3B in order to remove process-induced strain from the dicing surface, and scribed as shown in FIG. 3C to thereby produce the light emitting device chips 51. Then as shown in FIG. 3D, each light emitting device chip 51 is mounted so as to fix the back surface electrode layer 15 (see FIG. 1) on a terminal electrode 9a, which also serves as a support, using a conductive paste such as an Ag paste, an electrode wire 47 is bonded to the bonding pad 9, and a resin mold 52 is formed as shown in FIG. 3E, to thereby obtain the light emitting device 100.

Figure 4:
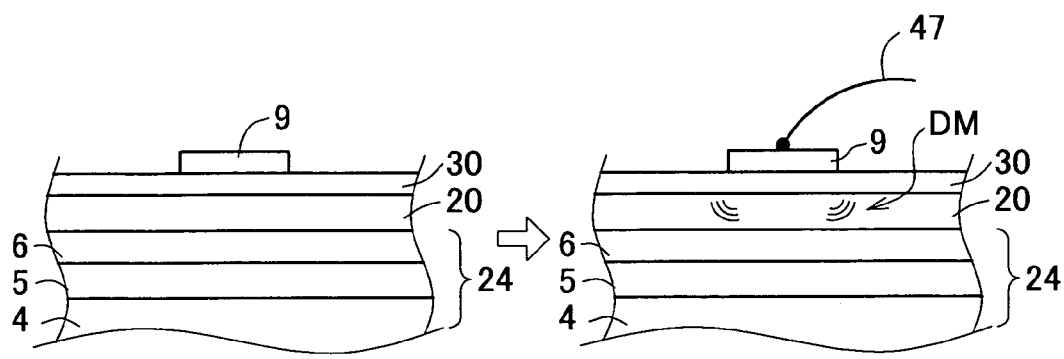
FIG. 4 is an explanatory drawing of a first operation of the cushion layer.
Figure 5:
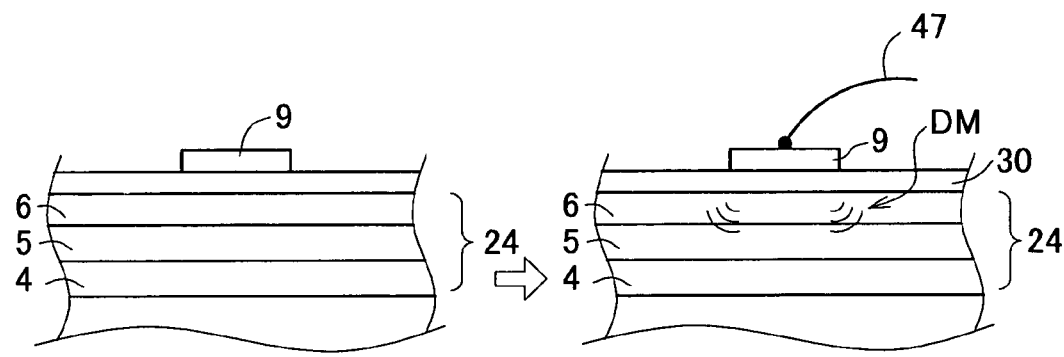
FIG. 5 is an explanatory drawing showing problem possibly occurs in a light emitting device having no cushion layer.

Bonding of the electrode wire 47 to the bonding pad 9, each of which being composed of Au, is typically carried out by ultrasonic welding (or thermosonic bonding). Impact stress of the ultrasonic welding may extend through the oxide transparent electrode layer 30 to reach the compound semiconductor layer right under the bonding pad 9, and may form damaged region DM such as crystal defect. In an exemplary case where the light emitting layer portion 24 is formed right under the oxide transparent electrode layer 30 as shown in FIG. 5, the damaged region DM may extend to reach the light emitting layer portion 24, and this may result in failures in the characteristics such as degraded emission luminance or device lifetime. In contrast to this, the light emitting device of the first invention has the cushion layer 20 interposed therebetween as shown in FIG. 4, and this successfully confines the damaged region DM within the cushion layer 20 and makes the influences thereof less likely to extend towards the light emitting layer portion 24, so that there is no apprehension on the degraded emission luminance.

The cushion layer 20 is designed to have a p-type carrier concentration within a range from $4\times10^{16}/cm^3$ to $9\times10^{17}/cm^3$, which is set smaller than that of the p-type AlGaInP cladding layer 6. This successfully makes the electrical acceleration of the p-type dopant diffusion from the cushion layer 20 to the p-type AlGaInP cladding layer 6 less likely to proceed even under a consecutive emission current supply, and improves the device lifetime.

Figure 6:
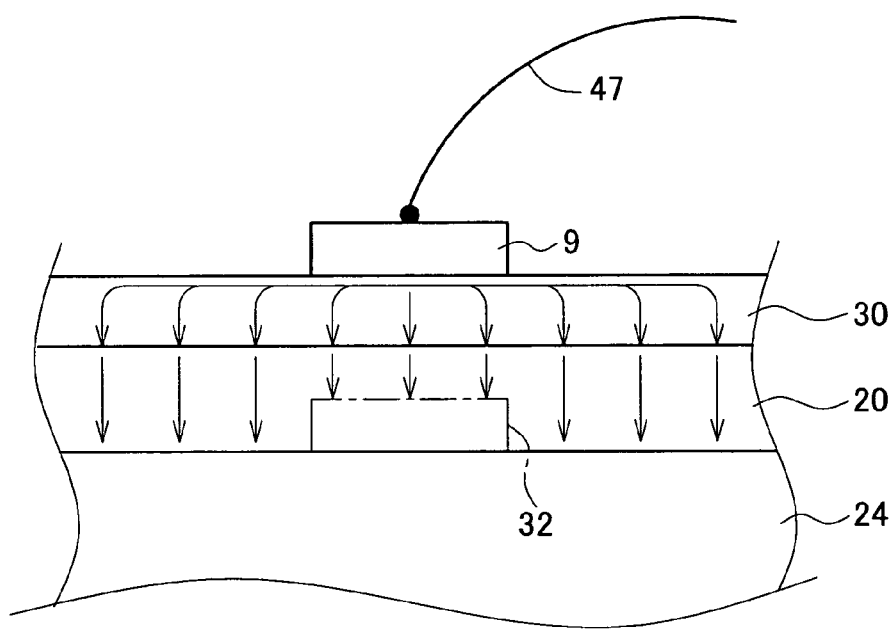
FIG. 6 is an explanatory drawing of a second operation of the cushion layer.

Although the cushion layer 20 has a slightly larger sheet resistance due to its low dopant concentration, it can fully spread the current, as shown in FIG. 6, because the oxide transparent electrode layer 30 which has an extremely large conductivity is formed thereon. Since also the cushion layer 20 is ensured with a sufficient level of conductivity in the thickness-wise direction with its p-type carrier concentration properly adjusted within the above-described range, it eventually makes it possible to uniformly supply the current to the light emitting layer portion, and can raise the emission efficiency.

It is preferable herein to form the electrode contact layer 31 which is composed of InGaAs, GaAs or the like between the oxide transparent electrode layer 30 and the cushion layer 20 so as to contact with the oxide transparent electrode layer 30, as indicated by a dashed line in FIG. 1, in view of reducing the contact resistance of the oxide transparent electrode layer 30. The electrode contact layer 31 is designed to have a p-type dopant concentration adjusted to a higher level (e.g., $1\times10^{19}/cm^3$ or around) in order to reduce the contact resistance, considering that the cushion layer 20 formed in contact therewith is composed of AlGaAs.

Because the bonding pad 9 intercepts most portion of the light emitted from the light emitting layer portion 24, it is preferable in view of raising the light extraction efficiency that the supplied current is not concentrated in the primary region capable of yielding only a less amount of light extraction, or rather distributed with a larger ratio as possible in the secondary region around the bonding pad 9, capable of yielding a larger amount of light extraction. In the embodiment shown in FIG. 1, electrode contact layer 31 is not formed in the primary region located right under the bonding pad 9 and capable of yielding only a less amount of light extraction, and instead formed selectively in the surrounding secondary region capable of yielding a larger amount of light extraction. By intentionally exclude the electrode contact layer 31 from the region right under the bonding pad 9, the contact resistance of the oxide transparent electrode layer 30 increases in this region, and this makes the current less likely to flow. The current supplied through the oxide transparent electrode layer 30 to the light emitting layer portion 24 is preferentially distributed to the secondary region capable of yielding a larger amount of light extraction while bypassing the primary region capable of yielding only a less amount of light extraction, and this results in an improved light extraction efficiency.

Figure 7A:
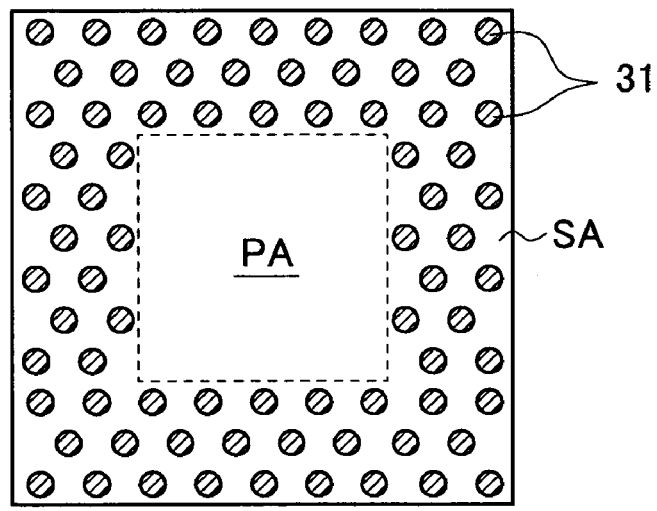
FIG. 7A is a plan view of a first example of formation pattern of the electrode contact layer.
Figure 7B:
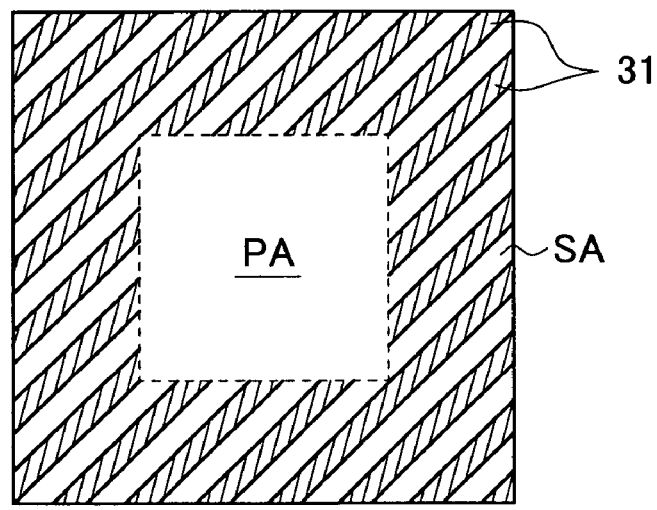
FIG. 7B is a plan view of a second example of formation pattern of the electrode contact layer.
Figure 7C:
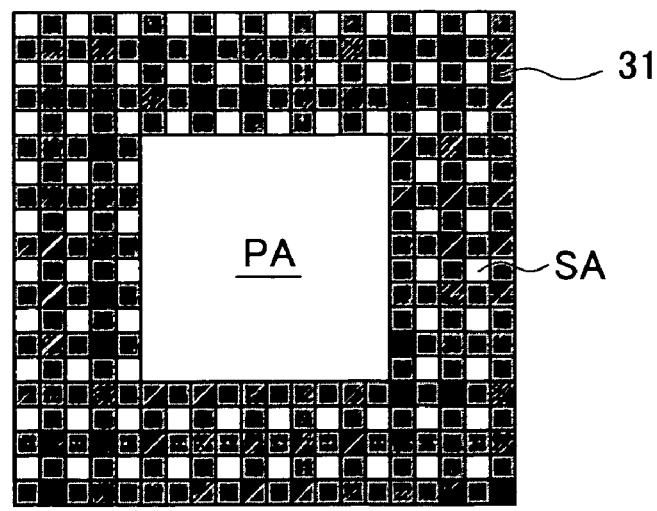
FIG. 7C is a plan view of a third example of formation pattern of the electrode contact layer.
Figure 8:
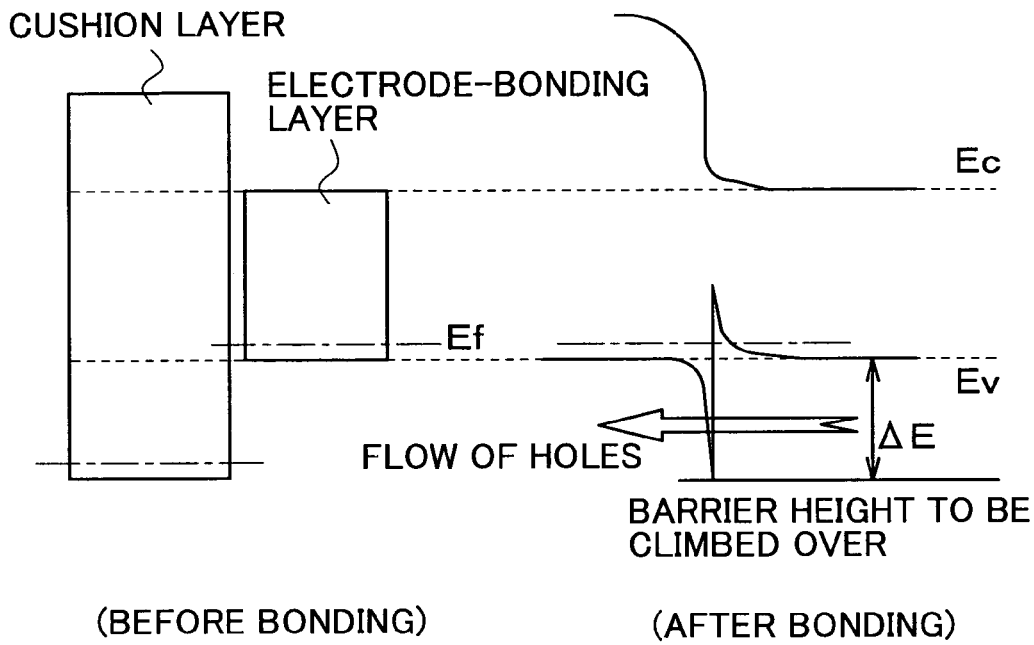
FIG. 8 is a schematic drawing showing a band structure of the electrode contact layer in the absence of the intermediate layer.

As shown FIGS. 7A to 7C, the electrode contact layer 31 can be formed in the secondary region so as to interlace the formation region and non-formation region thereof. Under the configuration in which the formation region and non-formation region of the electrode contact layer 31 are thus interlaced in the secondary region, the light generated in the light emitting layer portion 24 can be extracted by two routes, one route is such as allowing transmission through the electrode contact layer 31, and the other route is such as allowing bypassing the electrode contact layer 31 in the non-formation region. The latter route is advantageous in raising the light extraction efficiency because the light will not be absorbed by the electrode contact layer 31 when it transmits therethrough.

The discrete formation of the electrode contact layer 31 at the junction interface of the oxide transparent electrode layer 30 as shown in FIGS. 7A to 7C is successful in equalizing the light emission by the light emitting layer portion 24, and in extracting more uniform light through the non-formation region of the electrode contact layer 31. FIG. 7A shows the electrode contact layer 31 formed in a scattered-dot pattern, and FIG. 7B shows thin-stripe-patterned formation regions of the electrode contact layer 31 disposed alternatively with same-patterned, non-formation regions. FIG. 7C shows an inverted pattern of FIG. 7A, in which the non-formation regions having a scattered-dot pattern are arranged on the background of the formation region of the electrode contact layer 31. The formation region of the electrode contact layer 31 herein has a lattice pattern.

Although the cushion layer 20 in the light emitting device shown in FIG. 1 is composed of AlGaAs, it is also allowable to use GaP instead (where, the range of dopant concentration is adjusted as same as that in the cushion layer 20 composed of AlGaAs, and other layers are composed similarly to those in the light emitting device shown in FIG. 1). It is anticipated, however, in this case that phosphorus may diffuse from the cushion layer 20 composed of GaP through the electrode contact layer 31 towards the ITO electrode layer during growth of the ITO electrode layer 30 or during the annealing for forming the electrode contact layer 31, and this may degrade the adhesion strength between the ITO electrode layer 30 and the electrode contact layer 31. The ITO electrode layer 30 becomes more likely to exfoliate in particular during the patterning of the bonding pad 9 by photolithography in the process step shown in FIG. 2D, during the half-dicing in the process step shown in FIG. 3A, and during the mesa-etching in the process step shown in FIG. 3B, and this tends to result in failure or degradation in the production yield.

Figure 9:
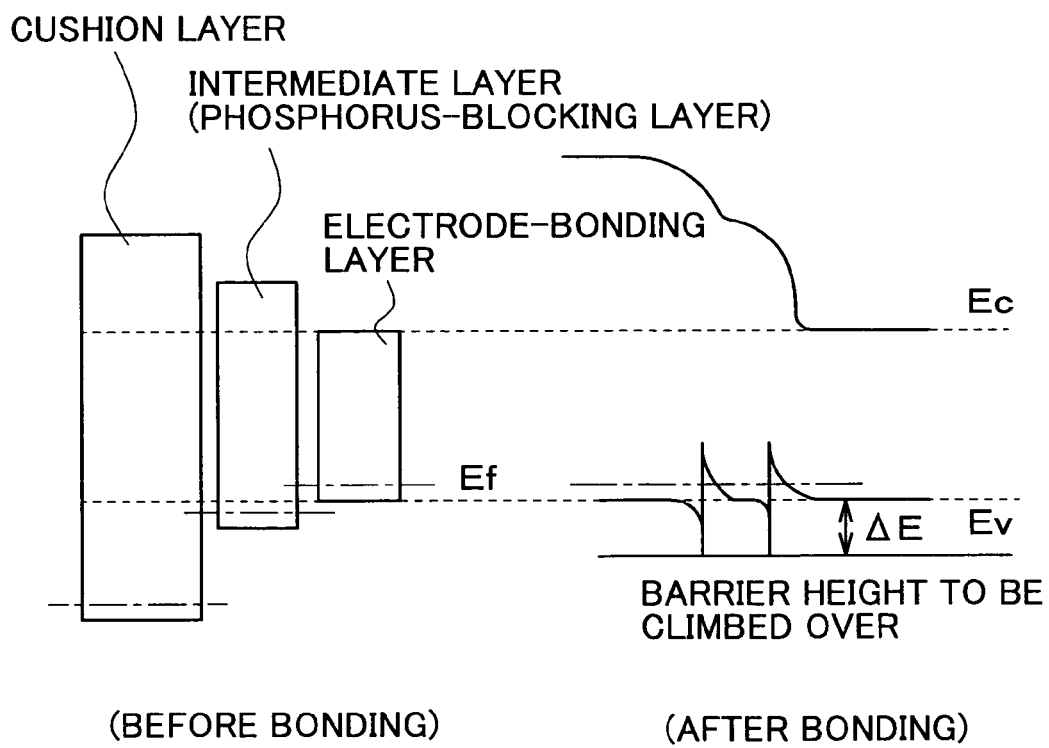
FIG. 9 is a schematic drawing showing a band structure of the electrode contact layer in the presence of the intermediate layer.
Figure 10:
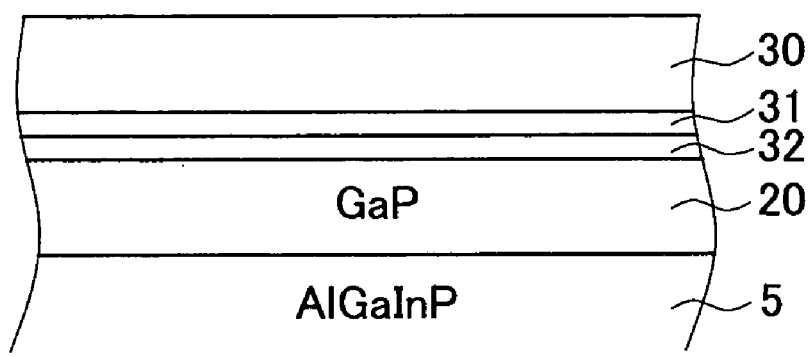
FIG. 10 is a schematic drawing showing a first exemplary configuration of the phosphorus-blocking layer.
Figure 11:
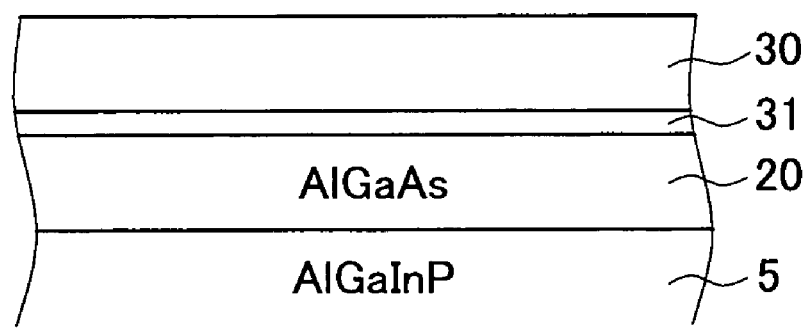
FIG. 11 is a schematic drawing showing a second exemplary configuration of the phosphorus-blocking layer.

It is now successful, as shown in FIG. 10, to interpose the phosphorus-blocking layer 32 composed of AlGaAs between the cushion layer 20 composed of GaP and the electrode contact layer 31, because the phosphorus diffusion from the cushion layer 20 towards the ITO electrode layer 30 can effectively be suppressed, and the absorption of the light emitted from the light emitting layer portion 24 is less likely to occur. In this case, the phosphorus-blocking layer 32 composed of AlGaAs can function also as the intermediate layer (see FIG. 9). The total thickness of the phosphorus-blocking layer 32 and the electrode contact layer 31 is preferably 20 nm or above.

For the case where the cushion layer 20 is composed of AlGaAs (i.e., configured similarly to as shown in FIG. 1), the fabrication process can largely be simplified, because the cushion layer 20 composed of AlGaAs per se can function as the phosphorus-blocking layer, the cushion layer 20 is intrinsically not causative of the phosphorus diffusion therefrom towards the ITO electrode layer 30 (and since the cushion layer 20 is relatively thick, the phosphorus diffusion from the cladding layer 6 composed of AlGaInP is, of course, not likely to take place), and there is no need of separately providing the phosphorus-blocking layer besides the cushion layer 20.

Although the individual layers in the light emitting layer portion 24 in the above-described embodiment is composed of AlGaInP alloy, it is also allowable to form the individual layers (p-type cladding layer 6, active layer 5, and n-type cladding layer 4) using AlGaInN alloy. The light emitting-layer growth substrate available in this case, on which the light emitting layer portion 24 to be grown, is an SiC substrate for example, in place of the GaAs single crystal substrate.

EXAMPLE

The following paragraphs will describe results of experiments carried out in order to confirm the effect of the first invention.

First, the light emitting device wafer 50 on which the individual layers were formed to the following thicknesses by the MOVPE process was obtained.

ITO electrode layer 30:
  thickness=0.8 µm (tin oxide content=7 wt %, indium oxide for the resdual portion), formed by RF sputtering;

InGaAs electrode contact layer 31:
  thickness=5 nm (formed exclusive of the region right under the bonding pad), doped with Zn as a p-type dopant so as to attain a dopant concentration of ca. $1\times10^{19}/cm^3$;

AlGaAs cushion layer 20:
  Zn (p-type dopant) concentration=$1\times10^{17}/cm^3$ to $1\times10^{18}/cm^3$, thickness=0 µm, 0.1 µm, 0.5 µm, 1.5 µm, 3 µm, 5 µm and 10 µm, p-type AlGaInP cladding layer 6:
  Zn (p-type dopant) concentration=$3\times10^{17}/cm^3$ to $7\times10^{17}/cm^3$, thickness=0.5 µm;

AlGaInP active layer 5:
  non-doped, thickness=0.6 µm (emission wavelength=650 nm); and n-type AlGaInP cladding layer 4:
  Si (n-type dopant) concentration=$5\times10^{17}/cm^3$, thickness=1 µm.

The light emitting device wafer 50 was fabricated into the device according the process steps as described in the above referring to FIGS. 2A to 3E. The device chip measures 300-µm square. The bonding pad 9 comprises Au, and has a form of 100-µm diameter circle. To the bonding pad 9, an electrode wire which comprises Au was bonded using a publicly-known thermosonic bonding apparatus.

The obtained individual devices were measured for the following characteristics based on known methods:

emission luminance ($I_V$: supply current value set to 20 mA); and forward voltage ($V_F$: supply current value set to 20 mA).

The initial emission luminance and emission luminance after 100 successive hours of current supply fixed constantly at 30 mA were measured, and ratio (%) of both luminance values was determined as device lifetime.

Table 1 shows results of the measurement of the device lifetime obtained under various combinations of Zn (p-type dopant) concentrations of the p-type cladding layer 6 and the cushion layer 5, where the thickness of the former was 0.5 µm, and the latter was 1 µm.

TABLE 1

| Dopant concentration of cushion layer (/cm³) | Device lifetime (%) |
|---|---|
| Dopant concentration of the cladding layer: $3 \times 10^{17}/cm^3$ | |
| $1 \times 10^{17}$ | 100 |
| $2 \times 10^{17}$ | 100 |
| *$7 \times 10^{18}$ | 90 |
| Dopant concentration of the cladding layer: $5 \times 10^{17}/cm^3$ | |
| $1 \times 10^{17}$ | 100 |
| $3 \times 10^{17}$ | 100 |
| *$1 \times 10^{18}$ | 80 |
| Dopant concentration of the cladding layer: $7 \times 10^{17}/cm^3$ | |
| $3 \times 10^{17}$ | 90 |
| $5 \times 10^{17}$ | 90 |
| *$1 \times 10^{18}$ | 70 |

*out of the scope of the first invention

It was found from the results that setting of the Zn (p-type dopant) concentration of the cushion layer 20 smaller than that of the p-type cladding layer 6 resulted in device lifetimes relatively improved from those based on the inverse setting.

Table 2 shows results of the measurement of the emission luminance $I_V$, forward voltage $V_F$ and device lifetime obtained under various thicknesses of the cushion layer 20, ranging from 0 to 10 µm, while fixing the Zn (p-type dopant) concentration and thickness of the p-type cladding layer 6 to $5\times10^{17}/cm^3$ and 0.5 µm, respectively, and the Zn (p-type dopant) concentration of the cushion layer 20 to $3\times10^{17}/cm^3$.

TABLE 2

| | Thickness of cushion layer (µm) | | | | | | |
|---|---|---|---|---|---|---|---|
| | 0 | 0.1 | 0.5 | 1.5 | 3 | 5 | 10 |
| $I_V$ (mCd) | 62 | 73 | 83 | 74 | 77 | 80 | 81 |
| $V_F$ (V) | 1.89 | 1.88 | 1.91 | 1.90 | 1.95 | 1.98 | 2.1 |
| Device lifetime (%) | 30 | 80 | 100 | 100 | 100 | 100 | 100 |

It was found that the devices having the cushion layer 20 adjusted within a range from 0.1 to 5 µm thick showed higher emission luminance $I_V$ and smaller forward voltage $V_F$. It was, however, found that the thickness of the cushion layer 20 less than 0.1 µm allowed the damage ascribable to the bonding of the electrode wire 47 on the bonding pad 9 to reach the light emitting layer portion 24, and resulted in degraded emission luminance $I_V$ and the device lifetime. It was also found that the thickness of the cushion layer 20 exceeding 5 µm resulted in elevation of the forward voltage $V_F$ due to increased series resistance.

(Second Invention)

Figure 12:
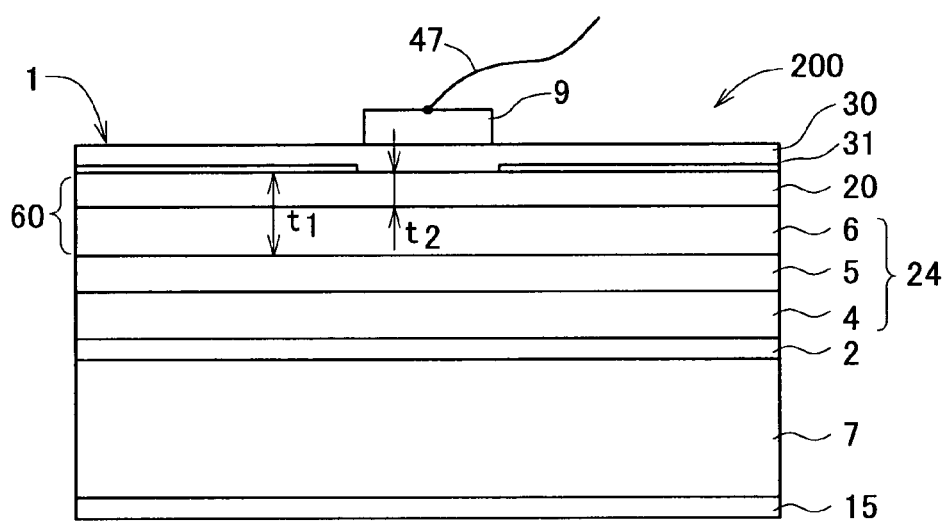
FIG. 12 is a schematic drawing showing a stacked structure of another embodiment of the light emitting device according to this invention.

FIG. 12 is a conceptual drawing of a light emitting device 200 of one embodiment according to the second invention. The light emitting device 200 comprises the n-type GaAs single crystal substrate (also simply referred to as "substrate", hereinafter) 7, the light emitting layer portion 24 composed of AlGaInP and disposed on one main surface thereof while placing the n-type GaAs buffer layer 2 in between, and the p-type cushion layer 20 and the ITO electrode layer 30 as the oxide transparent electrode layer stacked in this order so as to cover the light emitting layer portion 24. At around the center of the main surface of the ITO electrode layer 30, the bonding pad 9 composed of Au or the like is disposed, and further thereto the electrode wire 47 composed of Au or the like is bonded. On the other main surface of the substrate 7, the back surface electrode layer 15 typically composed of Au—Ge—Ni alloy is formed over the entire surface thereof.

Configurations of the light emitting layer portion 24 and the cushion layer 20 are similar to those shown in FIG. 1.

The following paragraphs will describe a method of fabricating the light emitting device 200 shown in FIG. 12.

The light emitting layer portion 24, the cushion layer 20 and the ITO electrode layer 30 can be formed by the process absolutely similar to those described in the above referring to FIGS. 2A to 3E. The p-type dopant concentration of the p-type AlGaInP cladding layer 6 is adjusted to $5 \times 10^{16}/cm^3$ or above and less than $1 \times 10^{18}/cm^3$, which falls within a range from $4 \times 10^{16}/cm^3$ or above and less than $1 \times 10^{18}/cm^3$ in terms of the whole portion of a bonding-side semiconductor layer 60.

Figure 15:
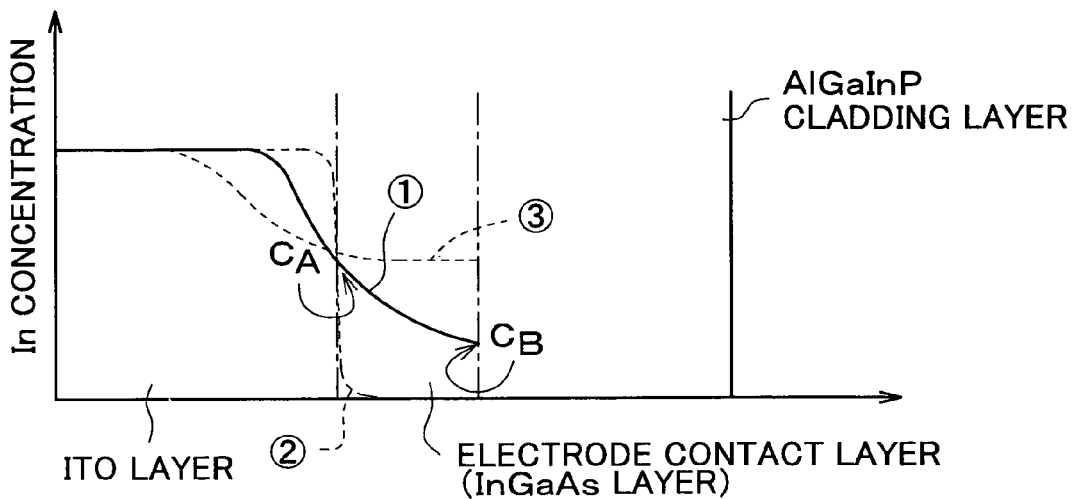
FIG. 15 is a graph showing an exemplary In concentration profile in the electrode contact layer.
Figure 16:
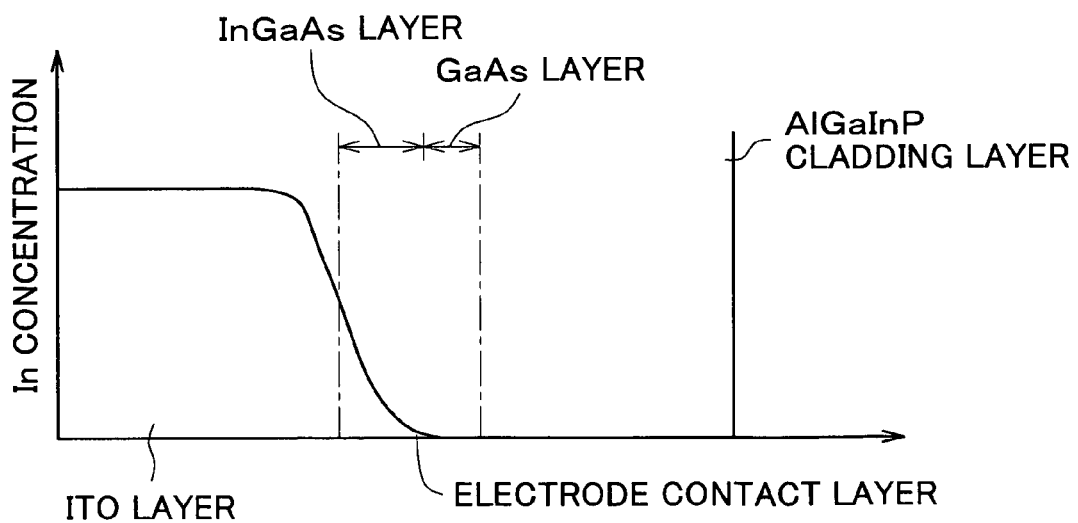
FIG. 16 is a graph showing an another exemplary In concentration profile in the electrode contact layer.
Figure 17:
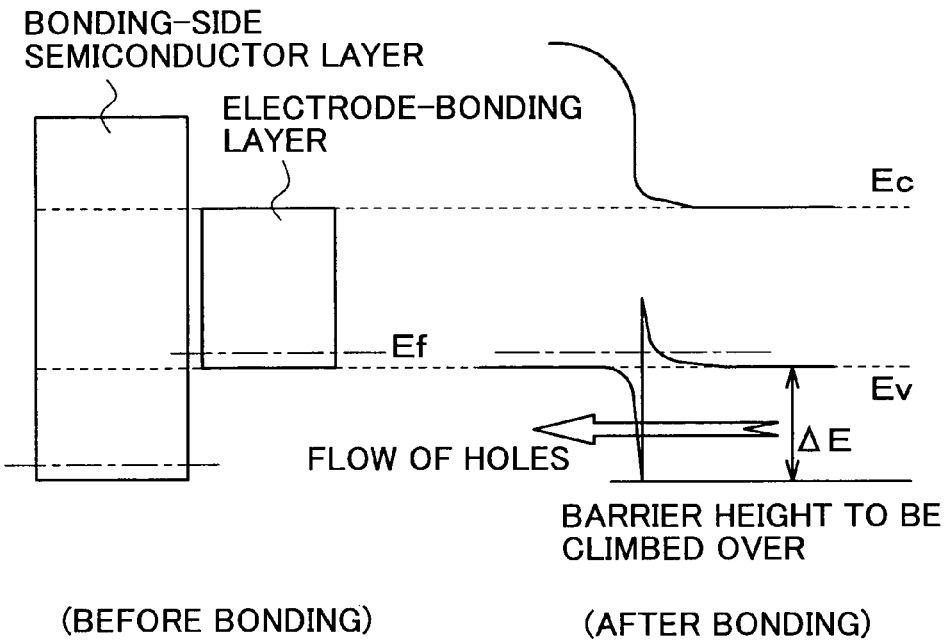
FIG. 17 is a schematic drawing showing a band structure of the electrode contact layer in the absence of the intermediate layer.
Figure 18:
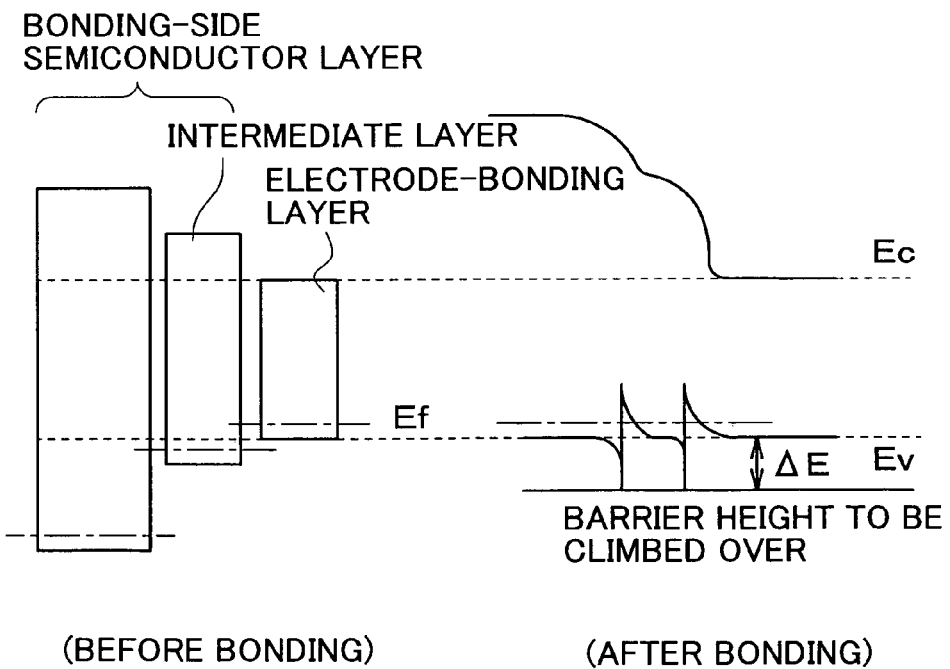
FIG. 18 is a schematic drawing showing a band structure of the electrode contact layer in the presence of the intermediate layer.

Between the ITO electrode layer 30 and the cushion layer 20, the electrode contact layer 31 for reducing the contact resistance with the ITO layer 30 is formed so as to contact with the ITO electrode layer 30 as shown in FIG. 12. The electrode contact layer 31 is a compound semiconductor layer having a composition of InGaAs at least at a portion including the interface with the ITO electrode layer 30, and is typically formed by the following processes. That is, the GaAs layer is formed on the cushion layer 20 shown in FIG. 12, the GaAs layer is then covered with the ITO electrode layer 30, the stack is then placed in a furnace, and annealed under an inert gas atmosphere such as containing nitrogen or Ar, at a temperature as low as 600° C. to 750° C. (typically at 700° C.) for a duration of time as short as 5 seconds to 120 seconds (typically for 30 seconds). This allows In to diffuse from the ITO layer 30 towards the GaAs layer to thereby form the electrode contact layer 31 (FIG. 12). After the annealing, the electrode contact layer 31 has an In concentration profile, as indicated by curve ① in FIG. 15, in which In concentration $C_A$, expressed by an atomic ratio of In to a total concentration of In and Ga, falls in a range from 0.1 to 0.6 in the vicinity of the interface with the ITO electrode layer. The In concentration continuously decreases as receding from the ITO layer 30 in the thickness-wise direction, and is adjusted as having a ratio $C_B/C_A$ of 0.8 or below, where $C_A$ is In concentration in the vicinity of the interface with the ITO electrode layer 30, and $C_B$ is In concentration in the vicinity of the opposite interface. Considering that the adjacent portion of the bonding-side semiconductor layer, that is the cushion layer 20, is composed of AlGaAs, the electrode contact layer 31 is designed to have a high p-type dopant concentration (e.g., $1 \times 10^{19}/cm^3$ or around) in order to reduce the contact resistance.

Figure 13:
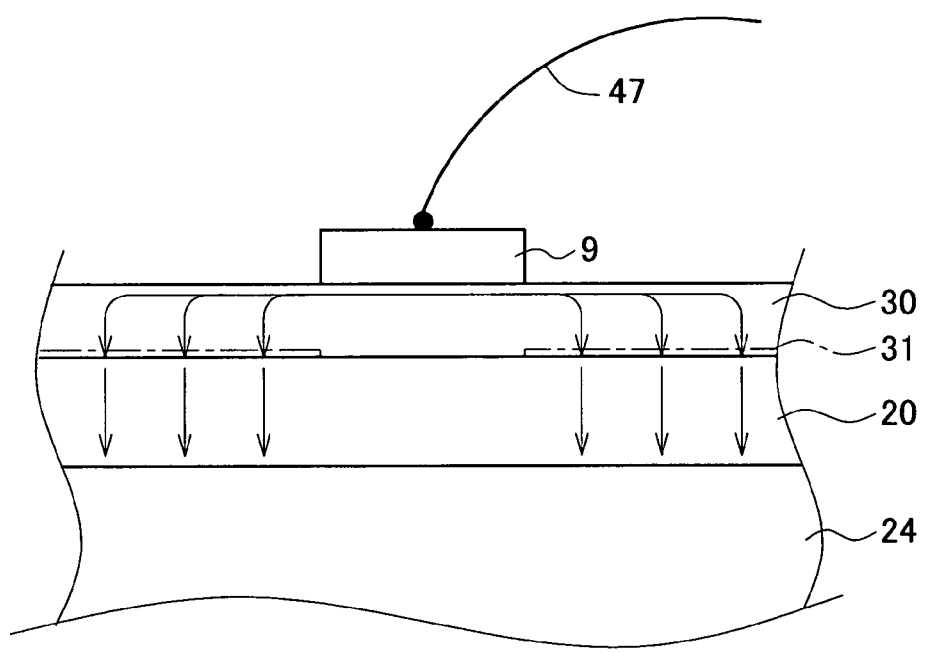
FIG. 13 is an explanatory drawing of a second operation of the cushion layer.

Also in the embodiment shown in FIG. 12, similarly to as the embodiment shown in FIG. 1, the electrode contact layer 31 is not formed in the primary region located right under the bonding pad 9 and is capable of yielding only a less amount of light extraction, and instead, formed only the surrounding secondary region capable of yielding a larger amount of light extraction. As shown in FIG. 13, the current supplied through the ITO electrode layer 30 to the light emitting layer portion 24 is distributed preferentially to the secondary region capable of yielding a larger amount of light extraction, and this contributes to increase in the light extraction efficiency.

Also in this case, the electrode contact layer 31 can be formed in the secondary region so as to interlace the formation regions and non-formation regions thereof, as shown in FIGS. 7A to 7C.

In a special case where the light emitting device is as large as 400-$\mu$m square or larger on the basis of square conversion, it is preferable to secure the ratio of formation area of the electrode contact layer 31 of 10% or more (inclusive of 100%) to the total area of the region other than the bonding pad 9 in view of ensuring a uniform surface emission. It is also preferable that the ratio of formation area of the bonding pad 9 is adjusted to 1% to 10% in view of raising the light extraction efficiency.

Figure 14:
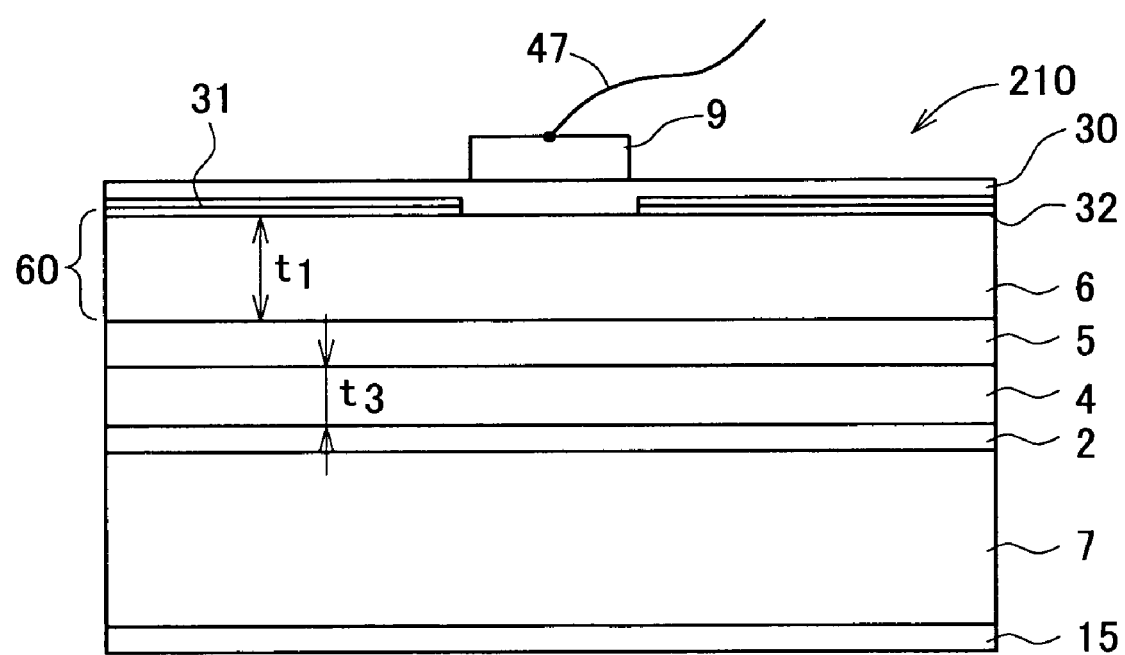
FIG. 14 is a schematic drawing showing a stacked structure of still another embodiment of the light emitting device according to the invention.

It is also allowable that the entire portion of the bonding-side semiconductor layer 60, exclusive of the intermediate layer 32, is configured as the p-type AlGaInP cladding layer (second-conductivity-type cladding layer) 6, as shown in FIG. 14. In this configuration, the thickness t1 of the p-type AlGaInP cladding layer 6 is adjusted to 0.6 $\mu$m or more and less than 10 $\mu$m, and the p-type dopant concentration is adjusted to $4 \times 10^{16}/cm^3$ or more and less than $1 \times 10^{18}/cm^3$.

The n-type AlGaInP cladding layer 4 in this configuration is hardly affected by the damage ascribable to the bonding of the electrode wire 47, so that the thickness t3 thereof may be smaller than the thickness t1 of the p-type AlGaInP cladding layer 6. Also in this embodiment, similarly to as shown in FIG. 12, the electrode contact layer 31 is disposed so as to contact with the ITO electrode layer 30. A trial of making a direct contact of the electrode contact layer 31 composed of In-containing GaAs with the p-type AlGaInP cladding layer 6 may, however, result in an increased contact resistance due to a slightly increased hetero barrier formed therebetween. It is thus more preferable to form the intermediate layer 32 between the electrode contact layer 31 and the p-type AlGaInP cladding layer 6, typically using an AlGaAs layer, GaInP layer, AlGaInP layer or the like (having a composition adjusted so that the band gap energy will be smaller than that of the cladding layer).

Also in the light emitting device shown in FIG. 12, the cushion layer 20 can be composed of GaP, in place of AlGaAs.

Figure 19:
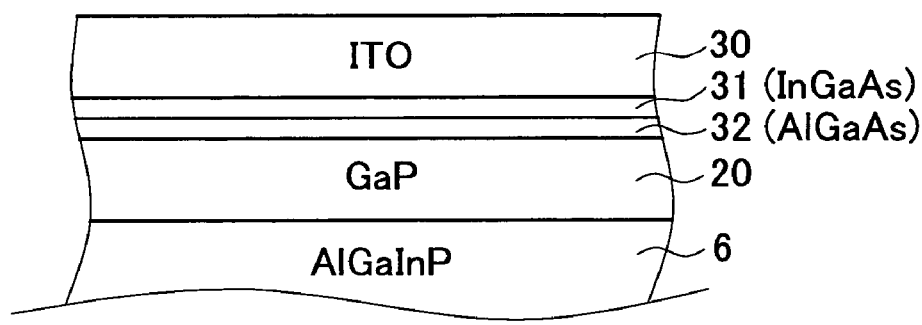
FIG. 19 is a schematic drawing showing a first exemplary configuration of the phosphorus-blocking layer.

It is also allowable to dispose the phosphorus blocking layer 32 typically composed of AlGaAs between the cushion layer 20 composed of GaP and the electrode contact layer 31, as shown in FIG. 19.

For the case where the cushion layer 20 is composed of AlGaAs (i.e., configured similarly to as shown in FIG. 12), the fabrication process can largely be simplified, because the cushion layer 20 composed of AlGaAs per se can function as the phosphorus-blocking layer, the cushion layer 20 is intrinsically not causative of the phosphorus diffusion therefrom towards the ITO electrode layer 30 (and since the cushion layer 20 is relatively thick, the phosphorus diffusion from the cladding layer 6 composed of AlGaInP is, of course, not likely to take place), and there is no need of separately providing the phosphorus-blocking layer besides the cushion layer 20.

Figure 20:
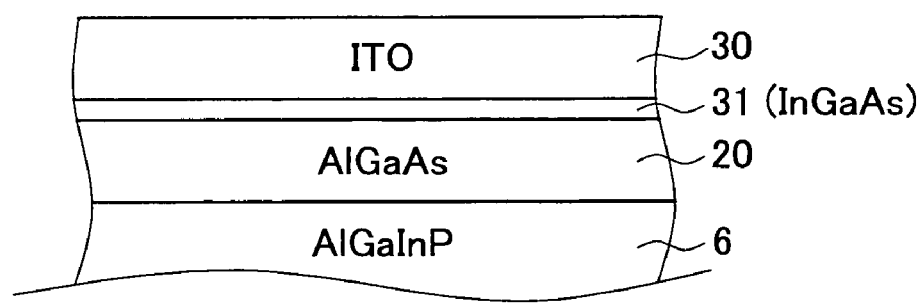
FIG. 20 is a schematic drawing showing a second exemplary configuration of the phosphorus-blocking layer.
Figure 21:
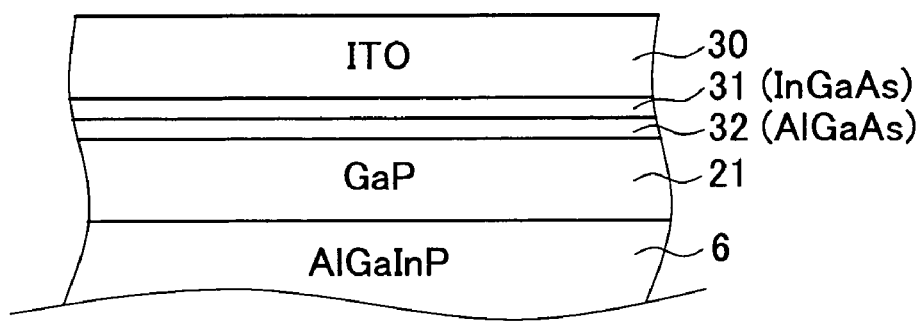
FIG. 21 is a schematic drawing showing a third exemplary configuration of the phosphorus-blocking layer.
Figure 22:
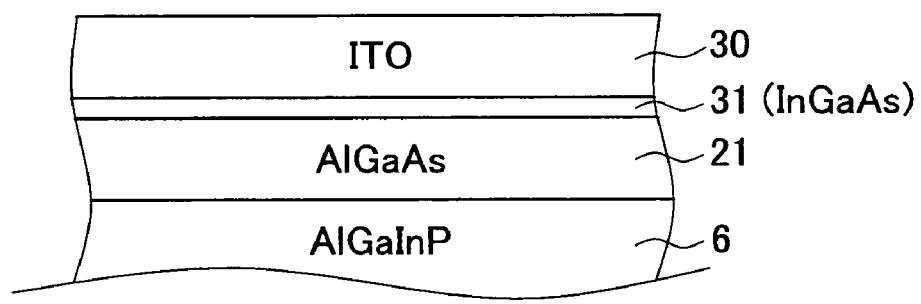
FIG. 22 is a schematic drawing showing a fourth exemplary configuration of the phosphorus-blocking layer.
Figure 23:
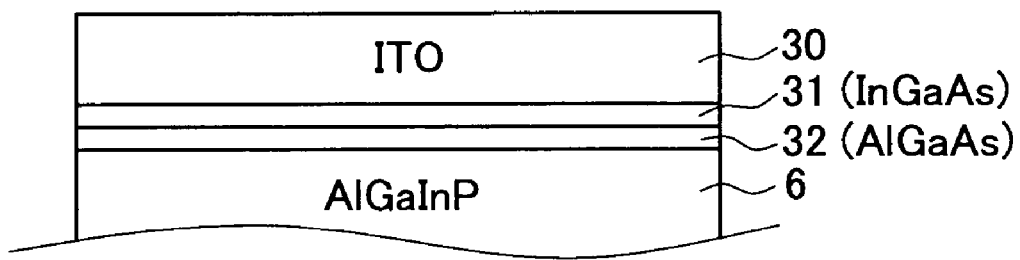
FIG. 23 is a schematic drawing showing a fifth exemplary configuration of the phosphorus-blocking layer.

Although the dopant concentrations of the cushion layers 20 shown in FIGS. 19 and 20 composed of GaP and AlGaAs, respectively, are set smaller than that of the cladding layer 6, it is also allowable, as shown in FIGS. 21 and 22, to dispose in place of these cushion layers 20 the current-spreading layers 21 composed of GaP and AlGaAs, respectively, having a thickness equivalent to that of the cushion layer 20 (where, the current-spreading layer 21 has a dopant concentration larger than that of the cladding layer 6).

For the case where the entire portion of the bonding-side semiconductor layer, exclusive of the intermediate layer 32, is configured as the cladding layer 6 (configured similarly to as shown in FIG. 14), the intermediate layer 32 can be configured as the phosphorus-blocking layer composed of AlGaAs.

Although the individual layers in the light emitting layer portion 24 in the above-described embodiment is composed of AlGaInP alloy, it is also allowable to form the individual layers (p-type cladding layer 6, active layer 5, and n-type cladding layer 4) using AlGaInN alloy. The light emitting-layer growth substrate 7 available in this case, on which the light emitting layer portion 24 to be grown, is an SiC substrate for example, in place of the GaAs single crystal substrate.

EXAMPLE

The following paragraphs will describe results of experiments carried out in order to confirm the effect of the second invention.

First, the light emitting device wafer 50 on which the individual layers were formed to the following thicknesses by the MOVPE process was obtained.

ITO electrode layer 30:
 thickness=0.8 μm (tin oxide content=7 wt %, indium oxide for the residual portion), formed by RF sputtering;

electrode contact layer 31:
 thickness=5 nm (formed exclusive of the region right under the bonding pad), formed as a GaAs layer first, then diffused with Zn as a p-type dopant so as to attain a dopant concentration of ca. $1 \times 10^{19}/cm^3$, covered with the ITO electrode layer 30, and annealed at 700° C. for 30 seconds.

AlGaAs cushion layer 20 (composition: $Al_{0.7}Ga_{0.3}As$):
 Zn (p-type dopant) concentration=$1 \times 10^{17}/cm^3$ to $1 \times 10^{18}/cm^3$, thickness=0 μm, 0.1 μm, 0.5 μm, 1.5 μm, 3 μm, 5 μm and 10 μm, p-type AlGaInP cladding layer 6 (composition: $(Al_{0.85}Ga_{0.15})_{0.5}In_{0.5}P$):
 Zn (p-type dopant) concentration=$3 \times 10^{17}/cm^3$ to $7 \times 10^{17}/cm^3$, thickness=0.5 μm;

AlGaInP active layer 5 (composition: $(Al_{0.25}Ga_{0.75})_{0.5}In_{0.5}P$):
 non-doped, thickness=0.6 μm (emission wavelength=600 nm); and n-type AlGaInP cladding layer 4 (composition: $(Al_{0.85}Ga_{0.15})_{0.5}In_{0.5}P$):
 Si (n-type dopant) concentration=$5 \times 10^{17}/cm^3$, thickness=1 μm.

The light emitting device wafer 50 was fabricated into the device according the process steps as described in the above referring to FIGS. 2A to 3E. The device chip measures 300-μm square. The bonding pad 9 comprises Au, and has a form of 100-μm diameter circle. To the bonding pad 9, an electrode wire which comprises Au was bonded using a publicly-known thermosonic bonding apparatus.

The obtained individual devices were measured for the following characteristics based on known methods:
 emission luminance ($I_V$: supply current value set to 20 mA); and
 forward voltage ($V_F$: supply current value set to 20 mA).

The initial emission luminance and emission luminance after 100 successive hours of current supply fixed constantly at 30 mA were measured, and ratio (%) of both luminance values was determined as device lifetime.

Table 3 shows results of the measurement of the emission luminance $I_V$, forward voltage $V_F$ and device lifetime obtained under various thicknesses of the bonding-side semiconductor layer, ranging from 0.5 to 11 μm, while fixing the Zn (p-type dopant) concentration and thickness of the p-type cladding layer 6 to $5 \times 10^{17}/cm^3$ and 0.5 μm, respectively, and the Zn (p-type dopant) concentration of the cushion layer 20 to $3 \times 10^{17}/cm^3$.

TABLE 3

| | Thickness of bonding-side semiconductor layer (μm) (cushion layer + p-type cladding layer) | | | | | | |
|---|---|---|---|---|---|---|---|
| | *0.5 | 0.6 | 1.0 | 2.0 | 3.5 | 3.5 | *10.5 |
| Thickness of cushion layer (μm) | 0 | 0.1 | 0.5 | 1.5 | 3 | 5 | 10 |
| $I_V$ (mCd) | 62 | 73 | 83 | 74 | 77 | 80 | 81 |
| $V_F$ (V) | 1.89 | 1.88 | 1.91 | 1.90 | 1.95 | 1.98 | 2.1 |
| Device lifetime (%) | 30 | 80 | 100 | 100 | 100 | 100 | 100 |

*out of the scope of the second invention

It was found that the devices having the bonding-side semiconductor layer adjusted to 0.6 μm or more and less than 10 μm thick showed higher emission luminance $I_V$ and smaller forward voltage $V_F$. It was, however, found that the thickness of the bonding-side semiconductor layer less than 0.6 μm allowed the damage ascribable to the bonding of the electrode wire 47 on the bonding pad 9 to reach the light emitting layer portion 24, and resulted in degraded emission luminance $I_V$ and the device lifetime. It was also found that the thickness of the bonding-side semiconductor layer being 10 μm or more resulted in elevation of the forward voltage $V_F$ due to increased series resistance.

Table 4 shows results of the measurement of the device lifetime obtained under various combinations of Zn (p-type dopant) concentrations of the p-type cladding layer 6 and the cushion layer 20, where the thickness of the former was 0.5 μm, and the latter was 1 μm (i.e., the bonding-side semiconductor layer has a thickness of 1.5 μm).

TABLE 4

| Dopant concentration of cushion layer (/cm³) | Device lifetime (%) |
|---|---|
| Dopant concentration of the cladding layer: $3 \times 10^{17}/cm^3$ | |
| $1 \times 10^{17}$ | 100 |
| $2 \times 10^{17}$ | 100 |
| $3 \times 10^{17}$ | 100 |
| $7 \times 10^{18}$ | 90 |
| Dopant concentration of the cladding layer: $5 \times 10^{17}/cm^3$ | |
| $1 \times 10^{17}$ | 100 |
| $3 \times 10^{17}$ | 100 |
| $5 \times 10^{17}$ | 95 |
| $1 \times 10^{18}$ | 80 |

TABLE 4-continued

| Dopant concentration of cushion layer (/cm$^3$) | Device lifetime (%) |
|---|---|
| Dopant concentration of the cladding layer: $7 \times 10^{17}$/cm$^3$ | |
| $3 \times 10^{17}$ | 90 |
| $5 \times 10^{17}$ | 90 |
| $7 \times 10^{17}$ | 85 |
| $1 \times 10^{18}$ | 70 |
| *$2 \times 10^{18}$ | 40 |

*out of the scope of the second invention

It was found from the results that setting of the Zn (p-type dopant) concentration of the cushion layer 20 equivalent to or smaller than that of the p-type cladding layer 6 resulted in device lifetimes relatively improved from those based on the inverse setting. It was also found that the Zn (p-type dopant) concentration of the cushion layer 20 of $1 \times 10^{18}$/cm$^3$ or above (that is, the Zn (p-type dopant) concentration of the bonding-side semiconductor layer of $1 \times 10^{18}$/cm$^3$ or above) resulted in a considerable degradation of the device lifetime.

(Third Invention)

Figure 24:
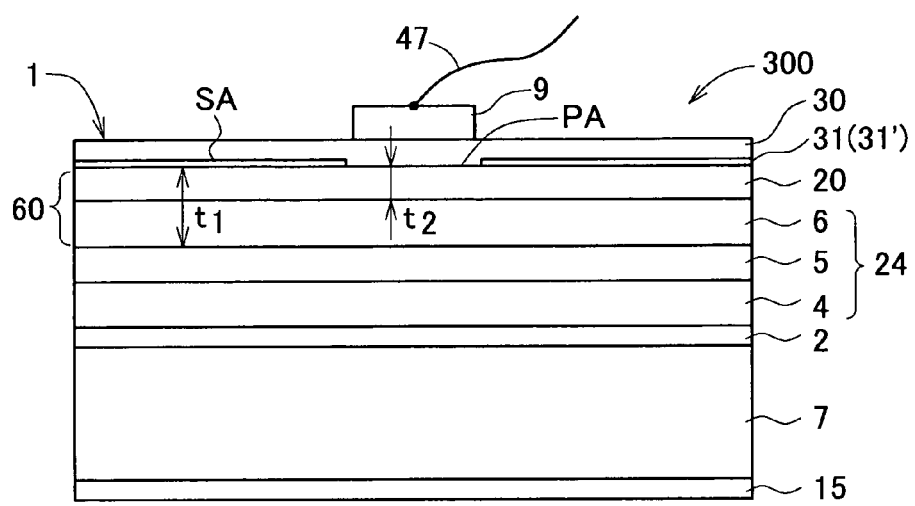
FIG. 24 is a schematic drawing showing a stacked structure of still another embodiment of the light emitting device according to this invention.

FIG. 24 is a conceptual drawing of a light emitting device 300 of one embodiment according to the third invention. The light emitting device 300 comprises the n-type GaAs single crystal substrate (also simply referred to as "substrate", hereinafter) 7, the light emitting layer portion 24 composed of AlGaInP and disposed on one main surface thereof while placing the n-type GaAs buffer layer 2 in between, and the p-type cushion layer 20 and the ITO electrode layer 30 as the oxide transparent electrode layer stacked in this order so as to cover the light emitting layer portion 24. At around the center of the main surface of the ITO electrode layer 30, the bonding pad 9 composed of Au or the like is disposed, and further thereto the electrode wire 47 composed of Au or the like is bonded. On the other main surface of the substrate 7, the back surface electrode layer 15 typically composed of Au—Ge—Ni alloy is formed over the entire surface thereof.

Configuration of the light emitting layer portion 24 is similar to that shown in FIG. 1.

The cushion layer 20 is composed of an AlGaAs layer (Al-containing interposed layer: typically expressed as $Al_xGa_{1-x}As$, where x=0.7 or around) doped with Zn as a p-type dopant, and has a p-type dopant concentration of $4 \times 10^{16}$/cm$^3$ to $9 \times 10^{17}$/cm$^3$, and more preferably $9 \times 10^{16}$/cm$^3$ to $6 \times 10^{17}$/cm$^3$, which is set smaller than that of the p-type AlGaInP cladding layer 6. The thickness t2 of the cushion layer 20 is adjusted to 0.1 μm to 5 μm, and more preferably to 0.5 μm to 3 μm. The p-type AlGaInP cladding layer 6 and the cushion layer 20 configure the bonding-side semiconductor layer 60, and the thickness t1 thereof (i.e., the total thickness of the p-type AlGaInP cladding layer 6 and the cushion layer 20) is adjusted to 0.6 μm or above and less than 10 μm.

Between the ITO electrode layer 30 and the cushion layer 20, the electrode contact layer 31 for reducing the contact resistance with the ITO layer 30 is formed so as to contact with the ITO electrode layer 30. The electrode contact layer 31 is a compound semiconductor layer having a composition of InGaAs at least at a portion including the interface with the ITO electrode layer 30, and is formed so as to interlace the formation region and non-formation region thereof at the junction interface with the ITO electrode layer 30. More specifically, the primary region PA which falls right under the bonding pad 9 is the non-formation region of the electrode contact layer 31, and the residual secondary region SA which serves as the light extraction region is the formation region of the electrode contact layer 31.

Figure 25:
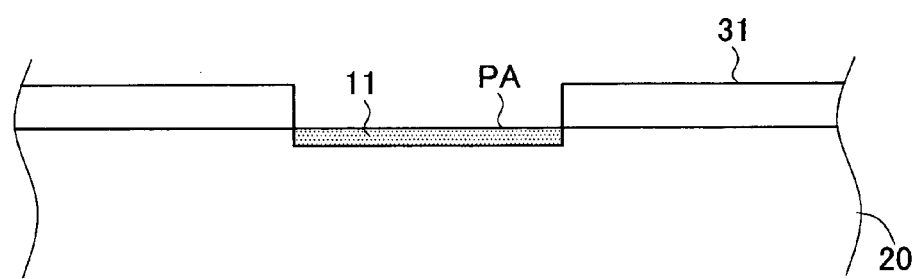
FIG. 25 is a conceptual drawing of the Al-base insulating layer in the light emitting device shown in FIG. 24.

The cushion layer 20 composed of AlGaAs, disposed between the electrode contact layer 31 and the light emitting layer portion 24, configures the Al-containing interposed layer composed of an Al-containing compound semiconductor. The cushion layer 20 is disposed so as to extend over the formation region (secondary region) SA and the non-formation region (primary region) PA of the electrode contact layer. Further on the outermost surficial portion of the cushion layer 20 (Al-containing interposed layer) on the ITO electrode layer 30 side, as shown in FIG. 25, an Al-base insulating layer 11 composed of an Al oxide is selectively formed so as to correspond to the entire portion of the non-formation region PA of the electrode contact layer 31.

In the conventional light emitting device having a thick current-spreading layer formed therein in order to raise the current spreading effect, there has been adopted a blocking layer having a conductivity type opposite to that of the current-spreading layer formed so as to be buried in the current-spreading layer, in order to bypass the current outside the region right under the bonding pad, but this was disadvantageous in that the device configuration becomes more complicated, and the number of process steps for the fabrication increases. In contrast to this, in the aforementioned configuration of the light emitting device 300, the electrode contact layer 31 is omitted in the primary region PA right under the bonding pad 9, and the Al-base insulating layer 11 is formed so as to cover the entire portion thereof, and this makes it possible to readily achieve the effect of bypassing the current towards the secondary region SA responsible for light extraction. Another advantage resides in that the underlying layer formed under the ITO electrode layer 30 is the cushion layer 20 having a relatively large sheet resistance, so that this is successful in suppressing a nonconformity such that the bypassed current once came into the secondary region SA flows within the cushion layer 20 back to the primary region PA side.

The following paragraphs will describe a method of fabricating the light emitting device 300 shown in FIG. 24.

Figure 26A:
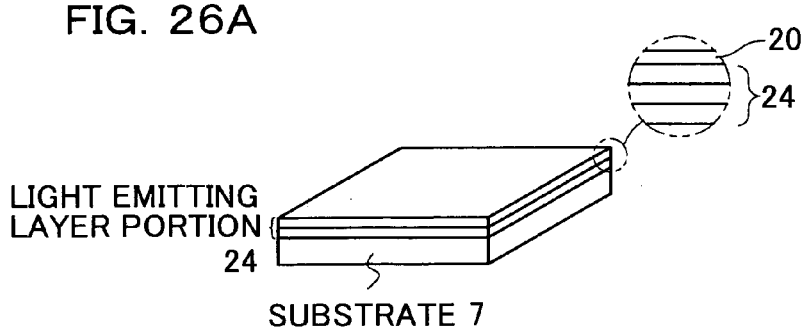
FIG. 26A is an explanatory drawing showing an exemplary fabrication process of the light emitting device shown in FIG. 24.

First as shown in FIG. 24, on a first main surface of the GaAs single crystal substrate 7, the n-type GaAs buffer layer 2 is formed, thereon the light emitting layer portion 24 which comprises the n-type AlGaInP cladding layer 4, the AlGaInP active layer 5 and the p-type AlGaInP cladding layer 6 (see FIG. 24) is formed, and further thereon the cushion layer 20 composed of AlGaAs (see the process step in FIG. 26A) and a GaAs layer 31' later converted into the electrode contact layer 31 are formed in this order by the epitaxial growth process, to thereby obtain the configuration shown in FIG. 26B. It is to be noted that in this stage, the GaAs layer 31' covers the region including the primary region which later falls right under the bonding pad.

The individual layers are formed by epitaxial growth similarly to as described in the embodiments of the first and second inventions.

The GaAs layer 31' is then patterned by the publicly-known photolithographic process so as to remove the portion thereof falls in the primary region PA. The patterning of the GaAs layer 31' can be carried out by chemical etching using, for example, an ammonia/hydrogen peroxide mixed solution as an etching solution. In this process, the underlying cushion layer 20 composed of AlGaAs can serve as an etching stop layer, so that only the GaAs layer 31' can selectively be etched. By the etching, the Al-base insulating layer 11 mainly composed of an Al oxide is formed in the outermost surficial portion of the cushion layer 20 based on selective oxidation of Al contained in AlGaAs, by the ammonia/hydrogen peroxide mixed solution. In other words, the etching solution can act as a medium for forming the Al oxide. The thickness of the Al-base insulating layer 11 is typically adjusted to 100 nm to 200 nm. The thickness of the Al-base insulating layer 11 less than 100 nm tends to result in only an insufficient insulating effect, whereas the thickness exceeding 200 nm may result in a longer time for the growth and a lowered efficiency of the fabrication.

Figure 26B:
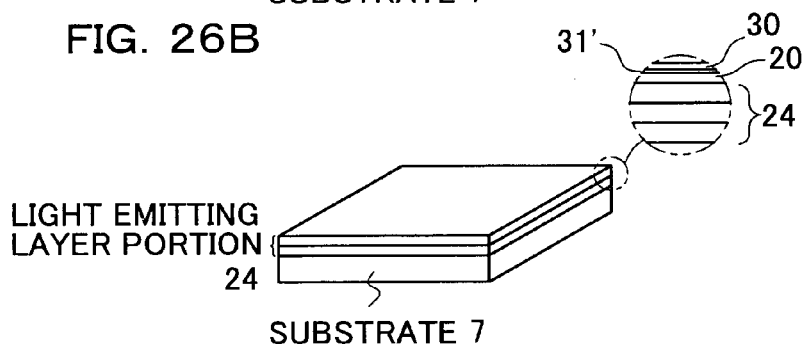
FIG. 26B is an explanatory drawing as continued from FIG. 26A.

Next, as shown in the process step shown in FIG. 26B, the ITO electrode layer 30 composed of ITO is formed by the publicly-known RF sputtering process so as to cover the GaAs layer 31' patterned on the cushion layer 20. Referring now to FIG. 24 for the convenience sake, the ITO electrode layer 30 is formed so as to contact with the GaAs layer 31' in the secondary region SA, and so as to contact with the Al-base insulating layer 11 (FIG. 25) on the cushion layer 20 in the primary region PA. Next, the product is placed into a furnace, and annealed under an inert gas atmosphere such as containing nitrogen or Ar, at a temperature as low as 600° C. to 750° C. (typically at 700° C.) for a duration of time as short as 5 seconds to 120 seconds (typically for 30 seconds). This allows In to diffuse from the ITO layer 30 towards the GaAs layer to thereby form the electrode contact layer 31 (FIG. 24). After the annealing, the electrode contact layer 31 has In concentration $C_A$, expressed by an atomic ratio of In to a total concentration of In and Ga, falls in a range from 0.1 to 0.6, in the vicinity of the interface with the ITO electrode layer. The In concentration continuously decreases as receding from the ITO layer 30 in the thickness-wise direction, and is adjusted as having a ratio $C_B/C_A$ of 0.8 or below, where $C_A$ is In concentration in the vicinity of the interface with the ITO electrode layer 30, and $C_B$ is In concentration in the vicinity of the opposite interface. Considering that the adjacent portion of the bonding-side semiconductor layer, that is the cushion layer 20, is composed of AlGaAs, the electrode contact layer 31 is designed to have a high p-type dopant concentration (e.g., $1\times10^{19}/cm^3$ or around) in order to reduce the contact resistance.

Figure 26C:
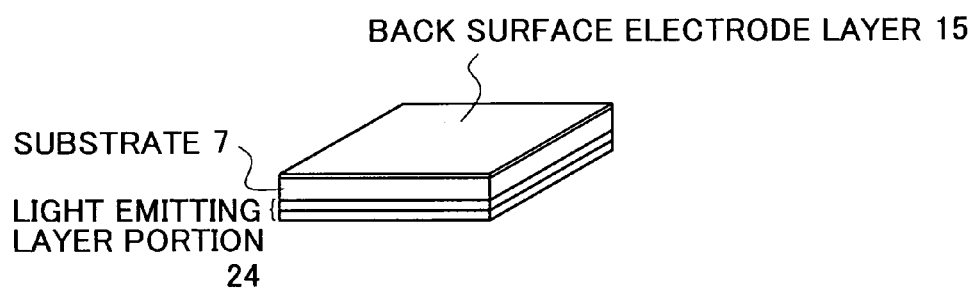
FIG. 26C is an explanatory drawing as continued from FIG. 26B.
Figure 26D:
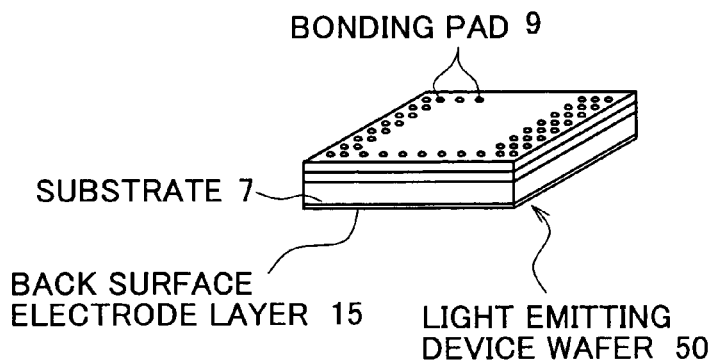
FIG. 26D is an explanatory drawing as continued from FIG. 26C.

Then as shown in the process in FIG. 26C, the back surface electrode 15 is formed on a second main surface of the substrate 7 by the vacuum evaporation process. Next as shown in FIG. 26D, the bonding pads 9 are disposed on the ITO electrode layer 30 in every region corresponding to each light emitting device chip, and baked at an appropriate temperature in order to fix the electrode, to thereby obtain the light emitting device wafer 50. The light emitting device wafer 50 is then half-diced for the preparation of separation of the individual light emitting device chip regions as shown in FIG. 3A, further etched to form a mesa profile as shown in FIG. 3B in order to remove process-induced strain from the dicing surface, and scribed as shown in FIG. 3C to thereby produce the light emitting device chips 51. Then as shown in FIG. 3D, each light emitting device chip 51 is mounted so as to fix the back surface electrode layer 15 (see FIG. 26C) on a terminal electrode 9a, which also serves as a support, using a conductive paste such as an Ag paste, the electrode wire 47 is bonded to the bonding pad 9, and the resin mold 52 is formed as shown in FIG. 3E, to thereby obtain the light emitting device 300.

Bonding of the electrode wire 47 to the bonding pad 9, each of which being composed of Au, is typically carried out by ultrasonic welding (or thermosonic bonding). Impact stress of the ultrasonic welding may extend through the ITO electrode layer 30 to reach the bonding-side semiconductor layer 60 right under the bonding pad 9, and may form damaged region such as crystal defect. In an exemplary case where the light emitting layer portion 24 is formed right under the ITO electrode layer 30, the damaged region may extend deep inside the light emitting layer portion 24 to reach the active layer 5, for example, and this may result in failures in the characteristics such as degraded emission luminance or device lifetime. Whereas, the light emitting device of the third invention has the cushion layer 20 interposed therebetween as shown in FIG. 24, and this successfully confines the damaged region within the cushion layer 20 and makes the influences thereof less likely to extend deep into the light emitting layer portion 24, so that there is no apprehension on the degraded emission luminance.

The cushion layer 20 is designed to have a p-type dopant concentration within a range from $4\times10^{16}/cm^3$ to $9\times10^{17}/cm^3$, which is set smaller than that of the p-type AlGaInP cladding layer 6. This successfully makes the electrical acceleration of the p-type dopant diffusion from the cushion layer 20 to the p-type AlGaInP cladding layer 6 less likely to proceed even under a consecutive emission current supply, and improves the device lifetime. The dopant concentration of the p-type AlGaInP cladding layer 6 is adjusted to $5\times10^{16}/cm^3$ or above and less than $1\times10^{18}/cm^3$, and falls within a range of $4\times10^{16}/cm^3$ or above and less than $1\times10^{18}/cm^3$ when expressed for the entire portion of the bonding-side semiconductor layer 60.

Although the cushion layer 20 has a slightly larger sheet resistance due to its low dopant concentration, it can fully spread the current within the ITO electrode layer 30 formed thereon and had an extremely large conductivity. Since also the cushion layer 20 is ensured with a sufficient level of conductivity in the thickness-wise direction with its p-type dopant concentration properly adjusted within the above-described range, it eventually makes it possible to uniformly supply the current to the light emitting layer portion 24, and can raise the emission efficiency.

Figure 27:
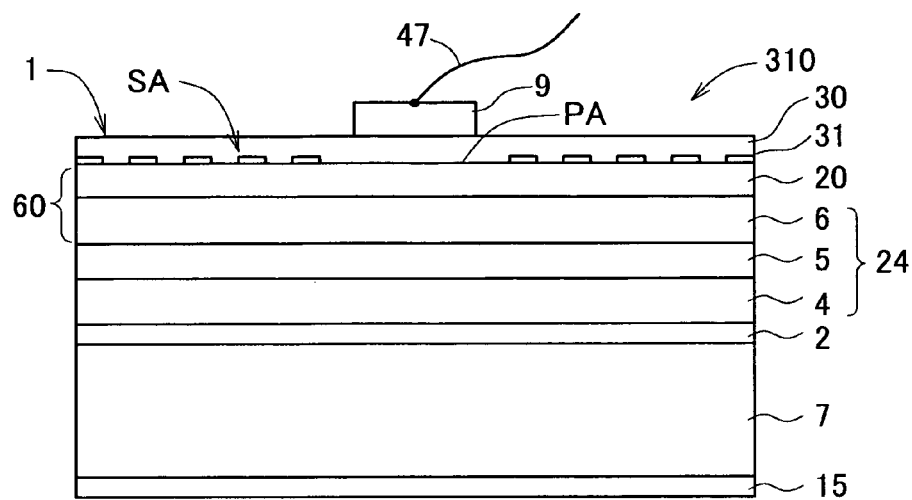
FIG. 27 is a schematic drawing showing a stacked structure of a first modified example of the light emitting device according to this invention.
Figure 28:
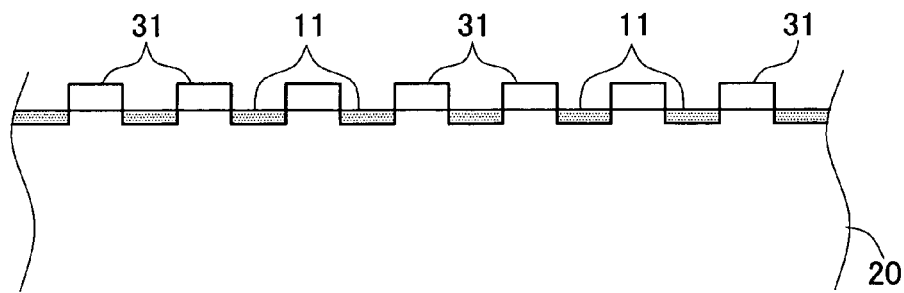
FIG. 28 is a conceptual drawing of the Al-base insulating layer in the light emitting device shown in FIG. 27.

The following paragraphs will describe several modified examples of the light emitting device of the third invention (any components common with those in the light emitting device 300 in FIG. 24 will have the same reference numerals, and detailed explanation therefor will be omitted instead). It is allowable to compose a light emitting device 310 as shown in FIG. 27, in which the electrode contact layer 31 is formed in the secondary area SA so as to interlace the formation region and non-formation region thereof. The interlaced pattern is obtainable by the aforementioned lithographic process for patterning the GaAs layer 31'. By interlacing the formation region and non-formation region of the electrode contact layer 31 in the secondary region capable of yielding a larger amount of light extraction, the light generated in the light emitting layer portion 24 can be extracted by two routes, one route is such as allowing transmission through the electrode contact layer 31, and the other route is such as allowing bypassing the electrode contact layer 31 in the non-formation region. The latter route is advantageous in raising the light extraction efficiency because the light will not be absorbed by the electrode contact layer 31 when it transmits therethrough. Because the outermost surficial portion of the cushion layer 20 exposed in the non-formation region of the electrode contact layer 31 is covered with the Al-base insulating layer 11 as shown in FIG. 28, the emission drive current can efficiently be concentrated only to the electrode contact layer 31. The current can be supplied through the electrode contact layer 31 formed in a discrete manner in the secondary region SA and can uniformly be distributed into the light emitting layer portion right under the light extraction region, and this contributes to a further improvement in the emission efficiency.

Figure 29:
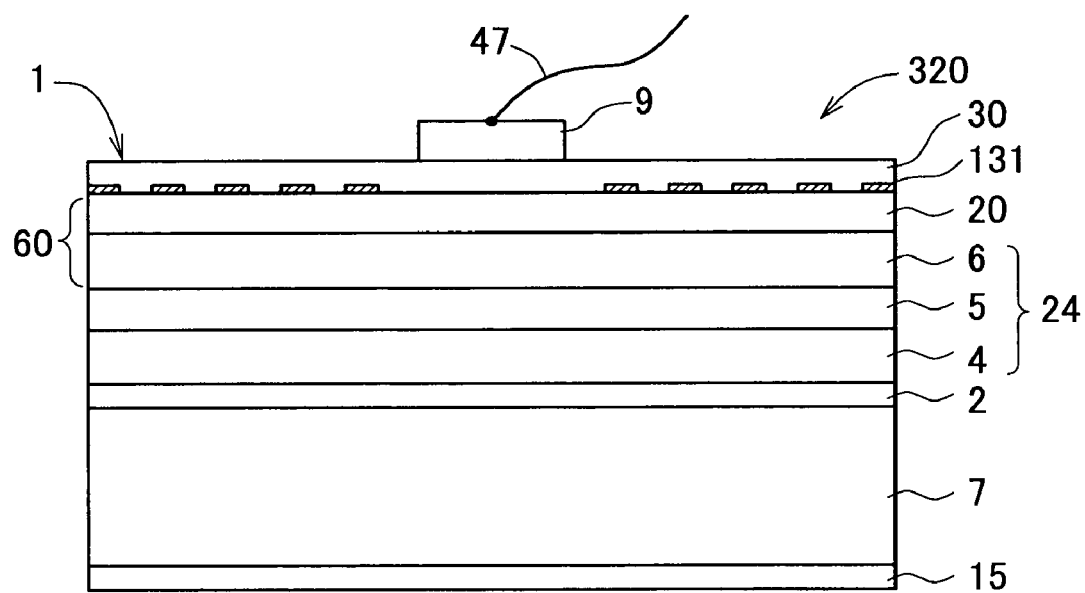
FIG. 29 is a schematic drawing showing a stacked structure of a second modified example of the light emitting device according to this invention.

For the case where the formation region and non-formation region of the electrode contact layer 31 are interlaced in the secondary region SA, it is allowable to form an electrode contact layer 131 composed of a metal (e.g., AuGe alloy) in a discrete manner, as in a light emitting device 320 shown in FIG. 29.

Figure 30:
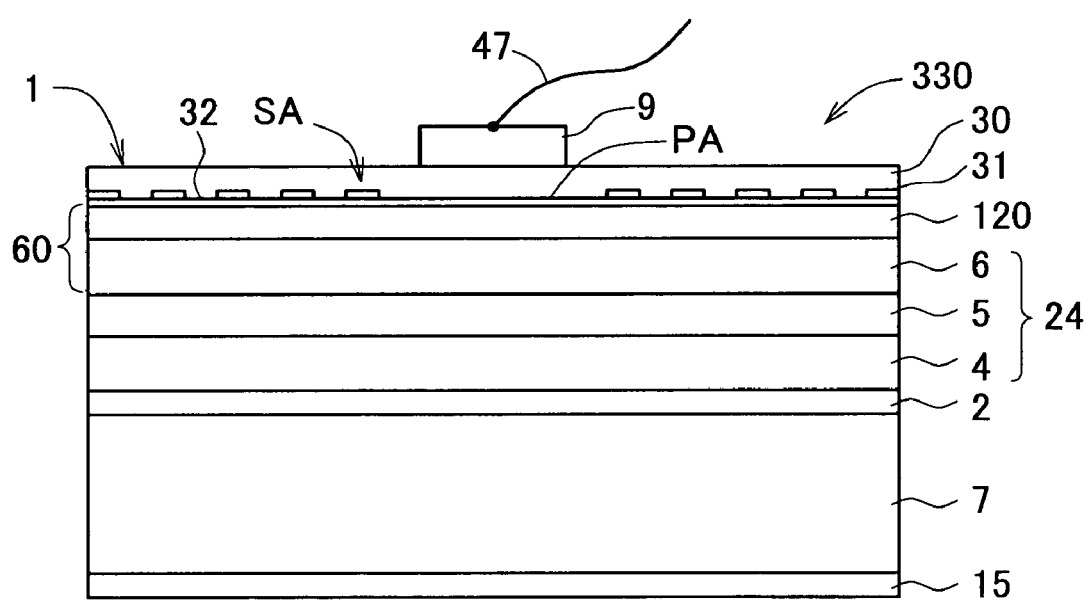
FIG. 30 is a schematic drawing showing a stacked structure of a third modified example of the light emitting device according to this invention.

A light emitting device 330 shown in FIG. 30 has a cushion layer 120 composed of GaP (range of the dopant concentration is the same as that for the cushion layer 20 composed of AlGaAs; other layers can be configured similarly to as those of the light emitting device shown in FIG. 24). In this configuration, the cushion layer 120 composed of GaP may be causative of the phosphorus diffusion through the electrode contact layer 31 towards the ITO electrode layer 30 during annealing for growing the ITO electrode layer 30, or for forming the electrode contact layer 31, to thereby weaken the adhesion strength of the ITO electrode layer 30 with the electrode contact layer 31. In particular in this case, the ITO electrode layer 30 becomes more likely to exfoliate during the photolithographic patterning of the bonding pad 9 as shown in the process step of FIG. 26D, the half-dicing as shown in the process step of FIG. 3A, or in the mesa-etching as shown in the process step of FIG. 3B, and this tends to cause failures and lowering of the yield ratio.

It is now successful to interpose the phosphorus-blocking layer (Al-containing interposed layer) 32 between the cushion layer 120 composed of GaP and the electrode contact layer 31, in view of effectively suppressing the phosphorus diffusion from the cushion layer 120 towards the ITO electrode layer 30. The phosphorus-blocking layer 32 is less causative of absorption of the light flux from the light emitting layer portion composed of AlGaInP. The phosphorus-blocking layer 32 composed of AlGaAs herein also functions as the intermediate layer (see FIG. 20) as described in the above. Total thickness of the phosphorus-blocking layer 32 and the electrode contact layer 31 is preferably adjusted to 20 nm or more. In this embodiment, the phosphorus-blocking layer 32 is formed so as to cover the cushion layer 120, the electrode contact layer 31 is patterned similarly to as illustrated in FIG. 29, and the Al-base insulating layer 11 as shown in FIG. 25 or FIG. 28 is formed on the outermost surficial portion of the phosphorus-blocking layer 32 in the non-formation region of the electrode contact layer 31.

Although the dopant concentrations of the cushion layer 20, 120 composed of GaP or AlGaAs shown in FIGS. 24, 27 29 and 30 are set lower than that of the cladding layer 6, it is also allowable to dispose the current-spreading layer composed of GaP or AlGaAs, having a thickness equivalent to that of the cushion layer 20, 120 (where, the current-spreading layer has a dopant concentration larger than that of the cladding layer 6).

Figure 31:
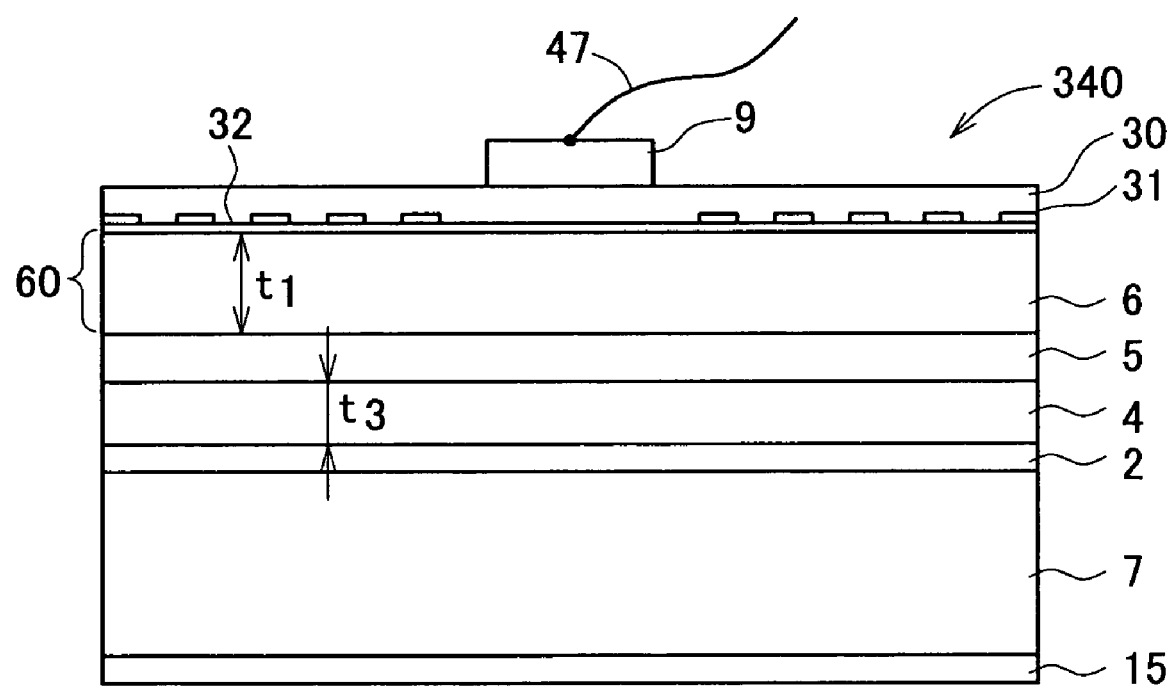
FIG. 31 is a schematic drawing showing a stacked structure of a fourth modified example of the light emitting device according to this invention.

In an light emitting device 340 shown in FIG. 31, the entire portion of the bonding-side compound semiconductor layer 60 (portion excluding the intermediate layer 32) is composed of the p-type AlGaInP cladding layer (second-conductivity-type cladding layer) 6. In this case, the thickness t1 of the p-type AlGaInP cladding layer 6 is adjusted to 0.6 µm or more and less than 10 µm, and the p-type dopant concentration is adjusted to $4\times10^{16}/cm^3$ or more and less than $1\times10^{18}/cm^3$. The n-type AlGaInP cladding layer 4 in this configuration is hardly affected by the damage ascribable to the bonding of the electrode wire 47, so that the thickness t3 thereof may be smaller than the thickness t1 of the p-type AlGaInP cladding layer 6.

As has been explained referring to the FIGS. 19 and 20 in the above, a trial of making a direct contact of the electrode contact layer 31 composed of In-containing GaAs with the p-type AlGaInP cladding layer 6 may, however, result in an increased contact resistance due to a slightly increased hetero barrier formed therebetween. The configuration herein adopts the intermediate layer 32 composed of AlGaAs, disposed between the electrode contact layer 31 and the p-type AlGaInP cladding layer 6. The intermediate layer 32 is also expected to function as the phosphorus-blocking layer (Al-containing interposed layer). The electrode contact layer 31 is patterned similarly to as illustrated in FIG. 29, and the Al-base insulating layer 11 as shown in FIG. 25 or FIG. 28 is formed on the outermost surficial portion of the intermediate layer (phosphorus-blocking layer) 32 in the non-formation region of the electrode contact layer 31.

What is claimed is:

1. A light emitting device comprising:
    a light emitting layer portion composed of a compound semiconductor, and has a double heterostructure in which a first-conductivity-type cladding layer, an active layer and a second-conductivity-type cladding layer are stacked in this order; and
    an oxide transparent electrode layer covering the main surface of the second-conductivity-type cladding layer, and being provided for applying therethrough emission drive voltage to the light emitting layer portion;
further comprising:
    a bonding pad composed of a metal and disposed on the oxide transparent electrode layer, and having an electrode wire for current supply bonded thereto; and
    a cushion layer disposed between the second-conductivity-type cladding layer and the oxide transparent electrode layer, and comprising a compound semiconductor layer having a dopant concentration lower than that of the second-conductivity-type cladding layers;
    wherein the second-conductivity-type cladding layer is composed of $(Al_xGa_{1-x})_yIn_{1-y}P$ (where $0 \leq x \leq 1$, $0 \leq y \leq 1$) and the cushion layer is composed of one of selected from AlGaAs, GaP, GaAsP and AlGaAsP.

2. The light emitting device as claimed in claim 1, wherein the thickness of the cushion layer is 0.1 µm to 5 µm, both ends inclusive.

3. The light emitting device as claimed in claim 1, wherein a total thickness of the cushion layer and the second-conductivity-type cladding layer is 0.6 µm or above.

4. The light emitting device as claimed in claim 1, further comprising an electrode contact layer for reducing junction resistance of the oxide transparent electrode layer, disposed between the cushion layer and the oxide transparent electrode layer so as to contact with the oxide transparent electrode layer;
    the electrode contact layer being formed with a ratio of formation area smaller in a primary region which locates right under the bonding pad, than in a secondary region surrounding the primary region.

5. The light emitting device as claimed in claim 4, wherein the primary region has no electrode contact layer formed therein.

6. The light emitting device as claimed in claim 1, wherein the oxide transparent electrode layer is an ITO electrode layer, and between the cushion layer and the ITO electrode layer, an electrode contact layer for reducing junction resistance of the ITO electrode layer is disposed so as to contact with the ITO electrode layer; and the cushion layer comprises a phosphorus-containing compound semiconductor layer containing phosphorus, and between the cushion layer and the electrode contact layer, a phosphorus-blocking layer having a band gap energy larger than that of the electrode contact layer, and having a phosphorus content lower than that of the phosphorus-containing compound semiconductor layer is disposed.

7. The light emitting device as claimed in claim 6, wherein the phosphorus-blocking layer is composed of a phosphorus-free compound semiconductor.

8. The light emitting device as claimed in claim 7, wherein the phosphorus-blocking layer is composed of AlGaAs.

9. The light emitting device as claimed in claim 6, wherein the phosphorus-blocking layer comprises an intermediate layer having a band gap energy smaller than that of the phosphorus-containing compound semiconductor composing the cushion layer, and larger than that of the electrode contact layer.

10. The light emitting device as claimed in claim 9, wherein the cushion layer is composed of GaP, the phosphorus-blocking layer is composed of AlGaAs, and the electrode contact layer is composed of In-containing GaAs.

11. The light emitting device as claimed in claim 1, wherein the oxide transparent electrode layer is an ITO electrode layer, and between the cushion layer and the ITO electrode layer, an electrode contact layer for reducing junction resistance of the ITO electrode layer is disposed so as to contact with the ITO electrode layer; and the second-conductivity-type cladding layer is configured as a phosphorus-containing compound semiconductor layer containing phosphorus; and the cushion layer is configured as a phosphorus-blocking layer having a band gap energy larger than that of the electrode contact layer, and having a phosphorus content lower than that of the phosphorus-containing compound semiconductor layer.

12. The light emitting device as claimed in claim 11, wherein the cushion layer configured as the phosphorus-blocking layer is composed of a phosphorus-free compound semiconductor.

13. The light emitting device as claimed in claim 12, wherein the cushion layer configured as the phosphorus-blocking layer is composed of AlGaAs.

14. A light emitting device comprising:

a light emitting layer portion composed of a compound semiconductor, and has a double heterostructure in which a first-conductivity-type cladding layer, an active layer and a second-conductivity-type cladding layer are stacked in this order; and an oxide transparent electrode layer covering the main surface of the second-conductivity-type cladding layer, and being provided for applying therethrough emission drive voltage to the light emitting layer portion;

further comprising:

a bonding pad composed of a metal and is disposed on the oxide transparent electrode layer, and having an electrode wire for current supply bonded thereto; and an electrode contact layer composed of a compound semiconductor, provided for reducing junction resistance of the oxide transparent electrode layer, and disposed so as to contact with the oxide transparent electrode layer;

wherein a bonding-side semiconductor layer, which is defined as a compound semiconductor layer including the second-conductivity-type cladding layer disposed between the active layer and the electrode contact layer, has a dopant concentration of $4 \times 10^{16}/cm^3$ or above and less than $1 \times 10^{18}/cm^3$, and has a thickness of 0.6 $\mu$m or above and less than 10 $\mu$m;

wherein the oxide transparent electrode layer is an ITO electrode layer, and the electrode contact layer has a composition of $In_xGa_{1-x}As$ ($0<X\leq1$) at the junction interface with the ITO electrode layer.

15. The light emitting device as claimed in claim 14, wherein the bonding-side semiconductor layer comprises the second-conductivity-type cladding layer, and a cushion layer disposed so as to contact with the oxide transparent electrode layer side of the second-conductivity-type cladding layer, and being composed of a compound semiconductor having a dopant concentration lower than that of the second-conductivity-type cladding layer.

16. The light emitting device as claimed in claim 14, wherein the cushion layer has a thickness of 0.1 $\mu$m to 5 $\mu$m, both ends inclusive.

17. The light emitting device as claimed in claim 14, wherein the bonding-side semiconductor layer comprises the second-conductivity-type cladding layer having a thickness of 0.6 $\mu$m or above and less than 10 $\mu$m.

18. The light emitting device as claimed in claim 17, wherein the first-conductivity-type cladding layer is formed thinner than the second-conductivity-type cladding layer.

19. The light emitting device as claimed in claim 14, wherein the electrode contact layer has an In concentration profile in the thickness-wise direction thereof continuously decreasing as receding from the ITO electrode layer.

20. The light emitting device as claimed in claim 14, wherein the electrode contact layer is composed of a semiconductor having a band gap energy smaller than that of the portion of the bonding-side semiconductor layer in contact therewith, and has a dopant concentration set higher than that of the portion of the bonding-side semiconductor layer.

21. The light emitting device as claimed in claim 14, wherein the electrode contact layer has a dopant concentration equal to or lower than that of the bonding-side semiconductor layer.

22. The light emitting device as claimed in claim 14, wherein the electrode contact layer is formed with a ratio of formation area smaller in a primary region which locates right under the bonding pad, than in a secondary region surrounding the primary region.

23. The light emitting device as claimed in claim 22, wherein the primary region has no electrode contact layer formed therein.

24. The light emitting device as claimed in claim 14, wherein the oxide transparent electrode layer is an ITO layer; and the bonding-side semiconductor layer comprises a first layer including at least an interface with the electrode contact layer and a second layer located between the first layer and the active layer; a portion of the second layer including at least the interface with the first layer being configured as a phosphorus-containing compound semiconductor layer containing phosphorus; and the first layer being configured as a phosphorus-blocking layer having a band gap energy larger than that of the electrode contact layer, and a phosphorus content lower than that of the phosphorus-containing compound semiconductor layer.

25. A light emitting device comprising:
- a light emitting layer portion composed of a compound semiconductor, and has a double heterostructure in which a first-conductivity-type cladding layer, an active layer and a second-conductivity-type cladding layer are stacked in this order; and
- an ITO electrode layer covering the main surface of the second-conductivity-type cladding layer, and being provided for applying therethrough emission drive voltage to the light emitting layer portion;

further comprising:
- a bonding pad composed of a metal and is disposed on the ITO electrode layer, and having an electrode wire for current supply bonded thereto;
- an electrode contact layer composed of a compound semiconductor, provided for reducing junction resistance of the ITO electrode layer, and disposed so as to contact with the ITO electrode layer;
- wherein a bonding-side semiconductor layer, which is defined as a compound semiconductor layer including the second-conductivity-type cladding layer disposed between the active layer and the electrode contact layer, has a thickness of 0.6 $\mu$m or above and less than 10 $\mu$m; comprises a first layer including at least an interface with the electrode contact layer and a second layer located between the first layer and the active layer; a portion of the second layer including at least the interface with the first layer being configured as a phosphorus-containing compound semiconductor layer containing phosphorus; and the first layer being configured as a phosphorus-blocking layer having a band gap energy larger than that of the electrode contact layer, and a phosphorus content lower than that of the phosphorus-containing compound semiconductor layer.

26. The light emitting device as claimed in claim 25, wherein the phosphorus-blocking layer is composed of a phosphorus-free compound semiconductor.

27. The light emitting device as claimed in claim 26, wherein the phosphorus-blocking layer is composed of AlGaAs.

28. The light emitting device as claimed in claim 25, wherein the bonding-side semiconductor layer comprises the second-conductivity-type cladding layer; an auxiliary compound semiconductor layer configured as the phosphorus-containing compound semiconductor layer using a compound semiconductor having a composition different from that of the second-conductivity-type cladding layer, and disposed so as to contact with the oxide transparent electrode layer side of the second-conductivity-type cladding layer; and the phosphorus-blocking layer disposed between the auxiliary compound semiconductor layer and the electrode contact layer.

29. The light emitting device as claimed in claim 26, wherein the auxiliary compound semiconductor layer is composed of GaP.

30. The light emitting device as claimed in claim 28, wherein a portion of the bonding-side semiconductor layer including the interface with the electrode contact layer is configured as an intermediate layer having a band gap energy smaller than that of the bonding-side semiconductor layer portion in contact with the portion from the side opposite to the electrode contact layer, but larger than that of the electrode contact layer, the intermediate layer being configured as the phosphorus-blocking layer.

31. The light emitting device as claimed in claim 30, wherein the intermediate layer is composed of AlGaAs.

32. The light emitting device as claimed in claim 25, wherein the bonding-side semiconductor layer comprises the second-conductivity-type cladding layer; and an auxiliary compound semiconductor layer configured as the phosphorus-blocking layer using a compound semiconductor having a composition different from that of the second-conductivity-type cladding layer, and disposed so as to contact with the oxide transparent electrode layer side of the second-conductivity-type cladding layer; and the electrode contact layer is disposed in contact with the auxiliary compound semiconductor layer.

33. The light emitting device as claimed in claim 32, wherein the auxiliary compound semiconductor layer is composed of AlGaAs.

34. The light emitting device as claimed in claim 28, wherein the auxiliary compound semiconductor layer is a cushion layer composed of a compound semiconductor having a dopant concentration lower than that of the second-conductivity-type cladding layer.

35. The light emitting device as claimed in claim 25, wherein the bonding-side semiconductor layer has the second-conductivity-type cladding layer having a thickness of 0.6 $\mu$m or above and less than 10 $\mu$m, the second-conductivity-type cladding layer being configured as the phosphorus-containing compound semiconductor layer; and the phosphorus-blocking layer is disposed so as to contact with the second-conductivity-type cladding layer.

36. The light emitting device as claimed in claim 35, wherein the phosphorus-blocking layer is configured as an intermediate layer having a band gap energy smaller than that of the second-conductivity-type cladding layer but larger than that of the electrode contact layer.

37. The light emitting device as claimed in claim 36, wherein the second-conductivity-type cladding layer is composed of AlGaInP, and the intermediate layer is composed of AlGaAs.

38. A light emitting device comprising a light emitting layer portion composed of compound semiconductor layers, and an oxide transparent electrode layer for supplying emission drive voltage to the light emitting layer portion, and is configured so as to extract the light from the light emitting layer portion through the oxide transparent electrode layer, further comprising:
- a bonding pad composed of a metal and disposed on the oxide transparent electrode layer, and having an electrode wire for current supply bonded thereto;
- an electrode contact layer for reducing junction resistance of the oxide transparent electrode layer disposed between the light emitting layer portion and the oxide transparent electrode layer so as to contact with the oxide transparent electrode layer, allowing a formation region and a non-formation region of the electrode contact layer to be interlaced at the junction interface with the oxide transparent electrode layer; and
- an Al-containing interposed layer containing Al disposed between the electrode contact layer and the light emitting layer portion so as to extend over the formation region and the non-formation region of the electrode contact layer, the Al-containing interposed layer comprising an Al-containing compound semiconductor layer in contact with the electrode contact layer in the formation region of the electrode contact layer, and an Al-base insulating layer formed selectively in the non-formation region of the electrode contact layer, and composing at least the outermost portion on the oxide transparent electrode layer side;

wherein the junction interface with the oxide transparent electrode layer has a primary region right under the bonding pad and the residual secondary region, and the primary region has a larger ratio of formation area of the non-formation region of the electrode contact layer than the secondary region has;

wherein the entire portion of the primary region is configured as the non-formation region of the electrode contact layer, and the Al-base insulating layer is formed over the entire portion of the non-formation region.

39. The light emitting device as claimed in claim 38, wherein the electrode contact layer is composed of a compound semiconductor or a metal.

40. The light emitting device as claimed in claim 38, wherein the light emitting layer portion is composed of AlGaInP, and is configured as having a double heterostructure in which a first-conductivity-type cladding layer, an active layer and a second-conductivity-type cladding layer are stacked in this order.

41. The light emitting device as claimed in claim 40, wherein the formation region and non-formation region of the electrode contact layer are interlaced in the secondary region, and the Al-base insulating layer is formed over the entire portion of the non-formation region.

42. The light emitting device as claimed in claim 41, wherein the electrode contact layer is composed of a compound semiconductor or a metal in the secondary region.

43. The light emitting device as claimed in claim 38, wherein the oxide transparent electrode layer is an ITO electrode layer, the electrode contact layer is composed of a phosphorous-free compound semiconductor, a phosphorus-containing compound semiconductor layer is disposed in contact with the Al-containing interposed layer on the side opposite to that the oxide transparent electrode layer is located, and the Al-containing interposed layer is configured as a phosphorus-blocking layer having a band gap energy larger than that of the electrode contact layer, and having a phosphorus content lower than that of the phosphorus-containing compound semiconductor layer.

44. The light emitting device as claimed in claim 43, wherein the phosphorus-blocking layer is composed of a phosphorus-free compound semiconductor.

45. The light emitting device as claimed in claim 44, wherein the phosphorus-blocking layer is composed of AlGaAs.

46. The light emitting device as claimed in claim 43, wherein the light emitting layer portion is composed of a compound semiconductor and has a double heterostructure in which a first-conductivity-type cladding layer, an active layer and a second-conductivity-type cladding layer are stacked in this order;

the bonding pad has the electrode wire for current supply bonded thereon;

a bonding-side semiconductor layer, which is defined as a compound semiconductor layer including the second-conductivity-type cladding layer disposed between the active layer and the electrode contact layer, has a thickness of 0.6 $\mu$m or above and less than 10 $\mu$m; comprises a first layer including at least an interface with the electrode contact layer and a second layer located between the first layer and the active layer; a portion of the second layer including at least the interface with the first layer being configured as a phosphorus-containing compound semiconductor layer containing phosphorus; and the first layer being configured as the phosphorus-blocking layer.

47. The light emitting device as claimed in claim 46, wherein the bonding-side semiconductor layer comprises the second-conductivity-type cladding layer; a cushion layer disposed so as to contact with the ITO electrode layer side of the second-conductivity-type cladding layer, and configured as the phosphorus-containing compound semiconductor layer composed of a compound semiconductor having a composition different from that of the second-conductivity-type cladding layer; and the phosphorus-blocking layer disposed between the cushion layer and the electrode contact layer.

48. The light emitting device as claimed in claim 47, wherein the cushion layer is composed of GaP.

49. The light emitting device as claimed in claim 47, wherein a portion of the bonding-side semiconductor layer including the interface with the electrode contact layer is configured as an intermediate layer having a band gap energy smaller than that of the bonding-side semiconductor layer portion in contact with the portion from the side opposite to the electrode contact layer, but larger than that of the electrode contact layer, the intermediate layer being configured as the phosphorus-blocking layer.

50. The light emitting device as claimed in claim 49, wherein the light emitting layer portion is composed of AlGaInP, and the intermediate layer is composed of AlGaAs.

51. The light emitting device as claimed in claim 46, wherein the bonding-side semiconductor layer comprises the second-conductivity-type cladding layer; and a cushion layer disposed so as to contact with the oxide transparent electrode layer side of the second-conductivity-type cladding layer, and configured as the phosphorus-blocking layer composed of a compound semiconductor having a composition different from that of the second-conductivity-type cladding layer; and the electrode contact layer is disposed so as to contact with the cushion layer.

52. The light emitting device as claimed in claim 51, wherein the cushion layer is composed of AlGaAs.

53. The light emitting device as claimed in claim 47, wherein the cushion layer is composed of a compound semiconductor having a dopant concentration lower than that of the second-conductivity-type cladding layer.

54. The light emitting device as claimed in claim 46, wherein the bonding-side semiconductor layer has the second-conductivity-type cladding layer having a thickness of 0.6 $\mu$m or above and less than 10 $\mu$m, the second-conductivity-type cladding layer being configured as the phosphorus-containing compound semiconductor layer, and the phosphorus-blocking layer is disposed so as to contact with the second-conductivity-type cladding layer.

55. The light emitting device as claimed in claim 54, wherein the phosphorus-blocking layer is configured as an intermediate layer having a band energy smaller than that of the second-conductivity-type cladding layer, but larger than that of the electrode contact layer.

56. The light emitting device as claimed in claim 55, wherein the second-conductivity-type cladding layer is composed of AlGaInP, and the intermediate layer is composed of AlGaAs.

57. A light emitting device comprising:

a light emitting layer portion composed of a compound semiconductor, and has a double heterostructure in which a first-conductivity-type cladding layer, an active layer and a second-conductivity-type cladding layer are stacked in this order; and an oxide transparent electrode layer covering the main surface of the second-conductivity-type cladding layer, and being provided for applying therethrough emission drive voltage to the light emitting layer portion;
further comprising:
a bonding pad composed of a metal and is disposed on the oxide transparent electrode layer, and having an electrode wire for current supply bonded thereto; and
an electrode contact layer composed of a compound semiconductor, provided for reducing junction resistance of the oxide transparent electrode layer, and disposed so as to contact with the oxide transparent electrode layer;
wherein a bonding-side semiconductor layer, which is defined as a compound semiconductor layer including the second-conductivity-type cladding layer disposed between the active layer and the electrode contact layer, has a dopant concentration of $4 \times 10^{16}/cm^3$ or above and less than $1 \times 10^{18}/cm^3$, and has a thickness of 0.6 $\mu$m or above and less than 10 $\mu$m;
wherein the electrode contact layer has an In concentration profile in the thickness-wise direction thereof continuously decreasing as receding from the ITO electrode layer.

58. A light emitting device comprising a light emitting layer portion composed of compound semiconductor layers, and an oxide transparent electrode layer for supplying emission drive voltage to the light emitting layer portion, and is configured so as to extract the light from the light emitting layer portion through the oxide transparent electrode layer, further comprising:
a bonding pad composed of a metal and disposed on the oxide transparent electrode layer, and having an electrode wire for current supply bonded thereto;
an electrode contact layer for reducing junction resistance of the oxide transparent electrode layer disposed between the light emitting layer portion and the oxide transparent electrode layer so as to contact with the oxide transparent electrode layer, allowing a formation region and a non-formation region of the electrode contact layer to be interlaced at the junction interface with the oxide transparent electrode layer; and
an Al-containing interposed layer containing Al disposed between the electrode contact layer and the light emitting layer portion so as to extend over the formation region and the non-formation region of the electrode contact layer, the Al-containing interposed layer comprising an Al-containing compound semiconductor layer in contact with the electrode contact layer in the formation region of the electrode contact layer, and an Al-base insulating layer formed selectively in the non-formation region of the electrode contact layer, and composing at least the outermost portion on the oxide transparent electrode layer side;
wherein the light emitting layer portion is composed of AlGaInP, and is configured as having a double heterostructure in which a first-conductivity-type cladding layer, an active layer and a second-conductivity-type cladding layer are stacked in this order;
wherein the formation region and non-formation region of the electrode contact layer are interlaced in the secondary region, and the Al-base insulating layer is formed over the entire portion of the non-formation region.

* * * * *